United States Patent
Chen et al.

(10) Patent No.: US 8,397,147 B2
(45) Date of Patent: Mar. 12, 2013

(54) OPTIMUM DISTANCE SPECTRUM FEEDFORWARD LOW RATE TAIL-BITING CONVOLUTIONAL CODES

(75) Inventors: (Jason) Tsao-Tsen Chen, Älvsjö (SE); Per Ernstrom, Stockholm (SE); Sten Ingemar Sjoberg, Landvetter (SE); Kai Yu, Vällingby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 611 days.

(21) Appl. No.: 12/621,604

(22) Filed: Nov. 19, 2009

(65) Prior Publication Data

US 2010/0169747 A1 Jul. 1, 2010

Related U.S. Application Data

(63) Continuation-in-part of application No. 12/260,340, filed on Oct. 29, 2008, now Pat. No. 8,375,280.

(60) Provisional application No. 61/118,522, filed on Nov. 28, 2008.

(51) Int. Cl.
*G06F 11/00* (2006.01)

(52) U.S. Cl. ........................ 714/795; 714/786

(58) Field of Classification Search ........... 714/786–796
See application file for complete search history.

(56) References Cited

U.S. PATENT DOCUMENTS

| | | | |
|---|---|---|---|
| 4,747,104 A | 5/1988 | Piret | |
| 6,085,349 A * | 7/2000 | Stein | 714/778 |
| 6,170,076 B1 * | 1/2001 | Kim | 714/786 |
| 6,347,122 B1 | 2/2002 | Chen et al. | |
| 7,170,946 B2 * | 1/2007 | Huang | 375/265 |
| 7,197,685 B2 | 3/2007 | Limberg | |
| 7,606,336 B2 * | 10/2009 | Lee et al. | 375/341 |
| 7,853,859 B2 | 12/2010 | Ojard | |
| 7,983,363 B2 * | 7/2011 | Jayaraman et al. | 375/341 |
| 8,155,247 B2 * | 4/2012 | Koorapaty et al. | 375/341 |
| 2003/0033565 A1 * | 2/2003 | Crozier et al. | 714/701 |
| 2007/0033509 A1 * | 2/2007 | Gupta | 714/795 |
| 2007/0089043 A1 * | 4/2007 | Chae et al. | 714/795 |
| 2007/0174757 A1 * | 7/2007 | Gho et al. | 714/795 |
| 2007/0245209 A1 | 10/2007 | Shi et al. | |

(Continued)

FOREIGN PATENT DOCUMENTS

WO 2009/058087 A1 5/2009

OTHER PUBLICATIONS

U.S. Office Action mailed Oct. 13, 2011 in U.S. Appl. No. 12/260,340.

(Continued)

*Primary Examiner* — Scott Baderman
*Assistant Examiner* — Elmira Mehrmanesh
(74) *Attorney, Agent, or Firm* — Nixon & Vanderhye, P.C.

(57) ABSTRACT

Method and apparatus for generating a set of generator polynomials for use as a tail biting convolutional code to operate on data transmitted over a channel comprises: (0) specifying a constraint and a low code rate for a tail biting convolutional code, where the low rate code is lower than 1/n (n being an integer greater than 4); (1) selecting valid combinations of generator polynomials to include in a pool of potential codes, each valid combination being a potential code of the low rate code; (2) determining first lines of a weight spectrum for each potential code in the pool and including potential codes of the pool having best first lines in a candidate set; (3) determining best codes of the candidate set based on the first L number of lines in the weight spectrum; (4) selecting an optimum code (s) from the best codes; and (5) configuring a circuit(s) of a data transceiver to implement the optimum code(s).

27 Claims, 13 Drawing Sheets

U.S. PATENT DOCUMENTS

| | | | |
|---|---|---|---|
| 2009/0070658 A1* | 3/2009 | Patapoutian et al. | 714/795 |
| 2009/0103659 A1 | 4/2009 | Chen et al. | |
| 2009/0150755 A1 | 6/2009 | Chen et al. | |
| 2011/0060972 A1* | 3/2011 | Shi et al. | 714/795 |

OTHER PUBLICATIONS

Danashgaran, "Linear Subcodes of Turbo Codes with Improved Distance Spectra", 2004, IEEE, vol. 50, pp. 3291-3294.

U.S. Office Action mailed Mar. 5, 2012 in U.S. Appl. No. 12/696,141.

Notice of Allowance mailed Mar. 23, 2012 in U.S. Appl. No. 12/140,956.

Ma et al., "On tail biting convolutional codes," IEEE Trans. Commun., vol. 34, pp. 104-111, Feb. 1986.

Mzyece et al, "Performance evaluation of suboptimal decoding schemes for tail biting convolutional codes in EDGE headers," IEE Electronics Letters, vol. 39, No. 17, pp. 1280-1281, Aug. 2003.

Cox et al, "An efficient adaptive circular viterbi algorithm for decoding generalized tailbiting convolutional codes," IEEE Trans. Veh. Technol., vol. 43, pp. 57-68, Feb. 1994.

Berrou et al, "Multiple parallel concatenation of circular recursive convolutional (CRSC) codes," Annals of Telecommunications, vol. 54, No. 3-4, pp. 166-172, Mar.-Apr. 1999.

Wang et al, "On MAP decoding for tail-biting convolutional codes," IEEE International Symposium on Information Theory (ISIT) 1997, pp. 225, Jun. 1997.

Ståhl et al, "Optimal and near-optimal encoders for short and moderate-length tail-biting trellises," IEEE Trans. Inform. Theory, vol. 45, pp. 2562-2571, Nov. 1999.

Shao et al, "Two decoding algorithms for tail-biting codes," IEEE Trans. Commun., vol. 51, No. 10, pp. 1658-1665, Oct. 2003.

Bahl et al, "Optimal decoding of linear codes for minimizing symbol error rate," IEEE Trans. Inform. Theory, vol. 20, pp. 284-287, Mar. 1974.

Anderson et al, "Tailbiting MAP decoders," IEEE J. Select. Areas Commun., vol. 16, pp. 297-302, Feb. 1998.

Chen et al, "Final report on 2005 WiMAX link simulation," 05/0363-6/FCP 101 3630 Uen, Ericsson Internal Technical Document, Mar. 2006.

Frenger et al, "Convolutional Codes with Optimum Distance Spectrum", IEEE Communications Letters, IEEE Service Center, Piscataway, NJ, vol. 3, No. 11, Nov. 1, 1999; pp. 317-319.

Lassign et al, "Packet Error Rates of Terminated and Tailbiting Convolutional Codes", Proc DSPCS '02, 2002, pp. 78-83.

Chen et al, "Improved Tail-Biting Convolutional Codes for 802.16e Frame Control Header", Wireless Conference, 2008, EW 2008, 14th European IEEE, Piscataway, NJ, Jun. 22, 2008, pp. 1-7.

3GPP TS 36.212, "3rd Generation Partnership Project; Technical Specification Group Radio Access Network; Evolved Universal Terrestrial Radio Access (E-UTRA); Multiplexing and channel Coding (Release 8)", V8.0.0, Sep. 2007.

3GPP TS 45.003, "3rd Generation Partnership Project; Technical Specification Group GSM/EDGE Radio Access Network; Channel Coding (Release 7)", V7.1.0, Feb. 2007.

International Preliminary Report on Patentability mailed Jun. 9, 2011 in PCT Application No. PCT/SE2009/051326.

International Search Report mailed Dec. 23, 2010 in PCT Application PCT/SE2009/051326.

U.S. Office Action mailed Sep. 15, 2011 in U.S. Appl. No. 12/140,956.

Larsen, "Short convolutional codes with maximal free distance for rate 1/2, 1/3, and 1/4," IEEE Trans. Inform. Theory, vol. 19, pp. 371-372, May 1973.

Chang et al, "Some extended results on the search for good convolutional codes," IEEE Trans. Inform. Theory, vol. 43, pp. 1682-1697, Sep. 1997.

Ståhl et al, "A note on tailbiting codes and their feedback encoders," IEEE Trans. Inform. Theory, vol. 48, pp. 529-534, Feb. 2002.

Ould-Cheikh-Mouhamedou et al, "Distance measurement method for double binary turbo codes and a new interleaver design for DVB-RCS," IEEE Globecom 04, pp. 172-178, 2004.

IEEE Std 802.16-2004, "IEEE Standard for Local and Metropolitan Area Networks—Part 16: Air Interface for Fixed Broadband Wireless Access Systems", Oct. 2004.

IEEE Std P802.16e-2005, "IEEE Standard for Local and Metropolitan Area Networks—Part 16: Air Interface for Fixed and Mobile Broadband Wireless Access Systems", Feb. 2006.

* cited by examiner

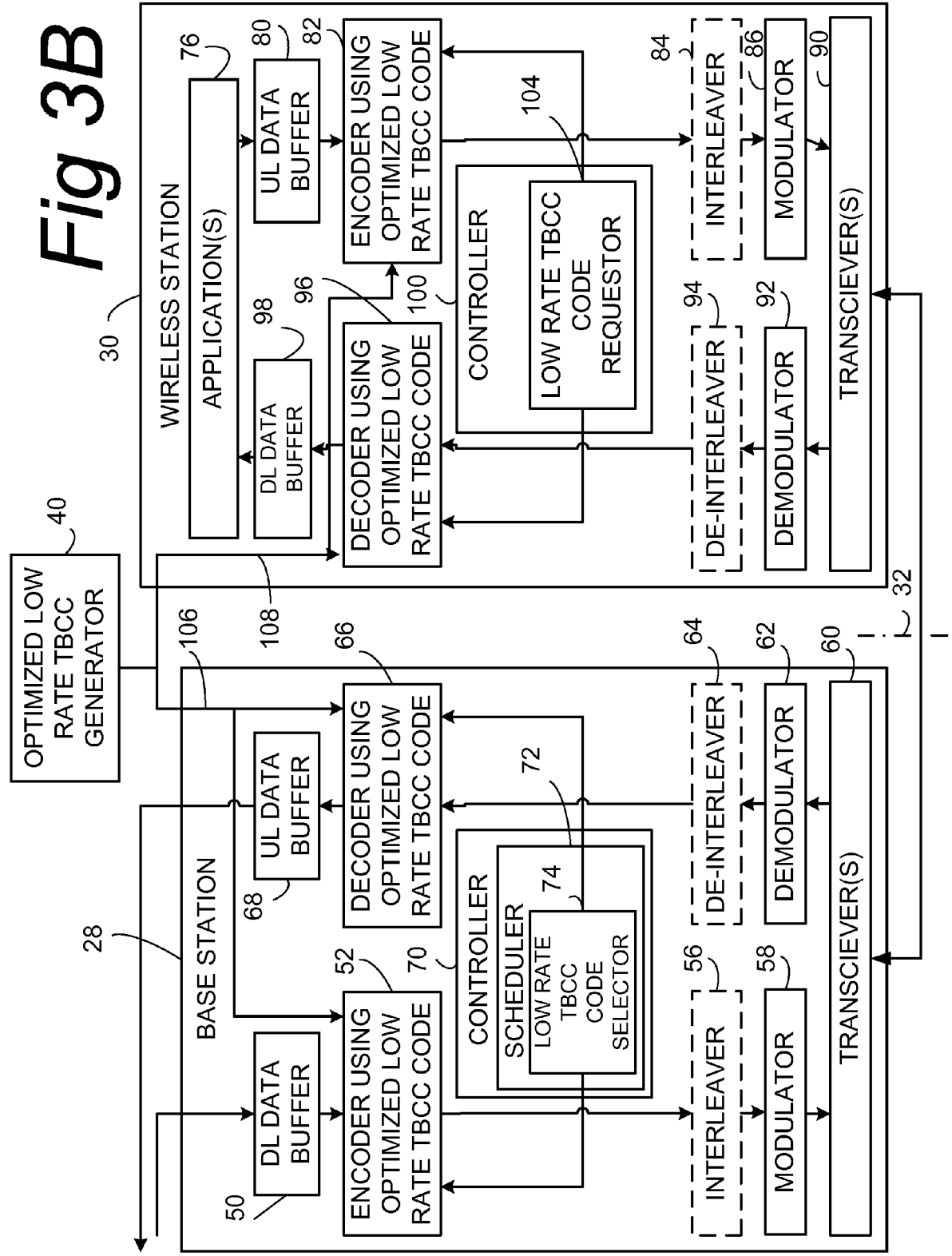

OPTIMUM DISTANCE SPECTRUM FEEDFORWARD LOW RATE TAIL-BITING CONVOLUTIONAL CODES

This application claims the priority and benefit of U.S. Provisional Patent Application 61/118,522 filed Nov. 28, 2008, entitled "OPTIMUM DISTANCE SPECTRUM FEEDFORWARD LOW RATE TAIL-BITING CONVOLUTIONAL CODES", which is incorporated by reference herein in its entirety. The application is a continuation-in-part of U.S. patent application Ser. No. 12/260,340, filed Oct. 29, 2008, entitled "OPTIMUM DISTANCE SPECTRUM FEEDFORWARD TAIL-BITING CONVOLUTIONAL CODES", which is incorporated by reference herein in its entirety, which in turn claims the benefit and priority of U.S. Provisional Patent Application 60/985,049 filed Nov. 2, 2007, entitled "OPTIMUM DISTANCE SPECTRUM FEEDFORWARD TAIL-BITING CONVOLUTIONAL CODES", which is incorporated by reference herein in its entirety. This application is related to the following United States patent applications (all of which are incorporated by reference herein in their entireties): (1) U.S. Provisional patent application Ser. No. 12/140,956, entitled REDUCED-COMPLEXITY DECODING ALGORITHMS FOR TAIL-BITING CONVOLUTIONAL CODES; (2) U.S. Provisional Patent Application 61/151,610, entitled ENCODING AND DECODING METHODS FOR EXPURGATED CONVOLUTIONAL CODES AND CONVOLUTIONAL TURBO CODES; and (3) U.S. Provisional Patent Application 61/149,113, filed Feb. 2, 2009, entitled ENCODING AND DECODING METHODS FOR EXPURGATED CONVOLUTIONAL CODES.

BACKGROUND

This invention pertains to convolutional coding, with particular but non-exclusive application to telecommunications.

In many environments data in various forms (e.g., various protocols, modulations, etc.) can be transmitted over a channel from a transmitter to a receiver. Depending on the type and circumstances of operation, some channels are more or less prone or susceptible to loss or degradation of the data being transmitted over the channel, with differing channels having differing degrees of potential loss or corruption. For example, a wireline channel typically has a relatively higher degree of integrity and reliability than a channel existing over a radio or interface.

Detection of loss or inaccurate transmission of data over a channel is possible when certain additional information in the form of an error detection code is added to the data stream. For example, at a transmitter a frame or block of data can have appended to it an error detection code in the form of (for example) a check character(s) or check sum which is computed or otherwise derived from the block. Upon reception of the block by the receiver, the receiver can independently recompute or re-derive the error detection code (e.g., the receiver's version of the check character(s) or check sum). If the recomputed or re-derived error detection code (e.g., check sum) is the same as the error detection code included in the received block or frame, the receiver can confirm that the block or frame is correctly decoded.

In addition to error detection techniques, error correcting techniques are also known. For example, error correction codes (generated by polynomials that operate over a frame or block of user data) can also be added to the data stream. Upon reception of the complete frame or block, using the known error correction code/technique the receiver can locate and correct certain errors in the data stream.

A convolutional code is a forward error-correction scheme, whereby the coded sequence is algorithmically achieved through the use of current data bits plus some of the previous data bits from the incoming stream. In telecommunications, a convolutional code is a type of error-correcting code in which (a) each m-bit information symbol (each m-bit string) to be encoded is transformed into an n-bit symbol, where m/n is the code rate (n≧m) and (b) the transformation is a function of the last k information symbols, where k is the constraint length of the code. A trellis description of a convolutional encoder shows how each possible input to the encoder influences both the output and the state transitions of the encoder.

A convolutional code (CC) is called tail-biting (or circular) if the beginning state of its encoding trellis is always equal to the ending state of its encoding trellis after encoding. Tail-biting convolutional codes (TBCC) are simple and powerful forward error correction (FEC) codes, as described, e.g., in H. H. Ma and J. K. Wolf, "On tail biting convolutional codes," IEEE Trans. Commun., vol. 34, pp. 104-111, February 1986.

Tail-biting convolutional codes (TBCC) are employed in many environments, including telecommunication networks having an air, radio, or "wireless" interface. Tail-biting convolutional codes (TBCC) have been adopted as the mandatory channel codes for the data channels and the overhead channels (like frame control header) in 802.16 WiMAX (Worldwide Interoperability for Microwave Access) system. 802.16 WiMAX is described, e.g., in IEEE Std 802.16-2004, "IEEE Standard for Local and Metropolitan Area Networks—Part 16: Air Interface for Fixed Broadband Wireless Access Systems", October, 2004; and IEEE Std P802.16e-2005, "IEEE Standard for Local and Metropolitan Area Networks—Part 16: Air Interface for Fixed and Mobile Broadband Wireless Access Systems", February, 2006, both of which are incorporated herein by reference. They have also been adopted as the channel codes for the header channel in the EDGE system and for the control channel in the IS-54 system. For a description of the EDGE system, see, e.g., M. Mzyece and J. Dunlop, "Performance evaluation of suboptimal decoding schemes for tail biting convolutional codes in EDGE headers," IEEE Electronics Letters, vol. 39, no. 17, pp. 1280-1281, August 2003, and 3GPP TS 45.003, "$3^{rd}$ Generation Partnership Project; Technical Specification Group GSM/EDGE Radio Access Network; Channel Coding (Release 7)", V7.1.0, 2007-02, both of which are incorporated herein by reference. For a description of the IS-54 system, see, e.g., R. V. Cox and C.-E. W. Sundberg, "An efficient adaptive circular viterbi algorithm for decoding generalized tail biting convolutional codes," IEEE Trans. Veh. Technol., vol. 43, pp. 57-68, February 1994, incorporated herein by reference. Further, they have also been adopted for the LTE (Long-Term Evolution) system (See, 3GPP TS 36.212, "$3^{rd}$ Generation Partnership Project; Technical Specification Group Radio Access Network; Evolved Universal Terrestrial Radio Access (E-UTRA); Multiplexing and channel Coding (Release 8)", V8.0.0, 2007-09, e.g., which is incorporated herein by reference).

Thus, tail biting convolutional codes comprise one class of error correction codes, which adds redundancy bits to the information bits (information bits and redundancy bits together is called one codeword) for error correction. At a receiver, the decoder can try to correct the corrupted bits (if errors happen during the transmission) with the help from the redundancy bits (or the information bits together). For example, if payload (information bits) size is K=6 bits and the coding rate is ⅓, then the length of the codeword is 6*3=18 bits and actually 18−6=12 redundancy bits are added to the 6 information bits. There are in total $2^6=64$ different codewords, corresponding to the 64 possible length-6 information bit vectors (from (0, 0, 0, 0, 0, 0), (0, 0, 0, 0, 0, 1), . . . , to (1, 1, 1, 1, 1, 1)).

The encoder structure of a rate 1/n feedforward convolutional code (CC) with overall constraint length v is shown in FIG. 1, where the content consisting of zeros and ones of the v number of shift-register elements is called the state of the encoder. The n number of generator polynomials specify the connections from the shift-registers to the n outputs. The n number of generator polynomials are represented by the set $G=(g_0, \ldots, g_{n-1})$, where $g_0=(g_0^{(0)}, g_0^{(1)}, \ldots, g_0^{(v)}), \ldots, g_{n-1}=(g_{n-1}^{(0)}, g_{n-1}^{(1)}, \ldots, g_{n-1}^{(v)})$. The coefficients $g_k^{(j)}$, for $k=0, \ldots, n-1$ and $j=0, \ldots, v$, is either 0 (no connection) or 1 (with connection). $U_i$ is the input bit at time i, and $(v_i^{(0)}, \ldots, v_i^{(n-1)})$ are the n output bits at time i. Thus, a convolutional code can be specified by its set of generator polynomials $G=(g_0, \ldots, g_{n-1})$.

A convolutional code (CC) is called tail-biting (or circular) if the beginning state of its encoding trellis is always equal to the ending state of its encoding trellis after encoding. For a feedforward CC, the beginning state is simply determined by the last v number of input bits, where v is the overall constraint length. For a feedback convolutional code (CC), the encoder structure has to comply with certain conditions so that the circular encoding is possible. In both cases (feedforward and feedback CC) the beginning state (also called the circular state) of the encoding trellis is determined from the input information bit vector. That is, the beginning state is not always equal to the all-zero state and depends on the values of the input bits. On the other hand, in the conventional zero-tail convolutional codes (ZTCC), the beginning state and the ending state are always equal to the all-zero state, and v number of redundant zero-tail bits are needed to return the encoder to the all-zero state.

An example encoder for the 802.16 Tail-biting convolutional codes (TBCC) is shown in FIG. 2. The encoder has code rate 1/n=½, constraint length v=6, and $G=(g_0, g_1)$, where $g_0=(1, 1, 1, 1, 0, 0, 1)$ and $g_1=(1, 0, 1, 1, 0, 1, 1)$. In other words, the adder $A_{g_0}$ for the first polynomial $g_0$ is connected to receive the bit values from the first through fourth positions and the seventh position of the shift register chain of FIG. 2 (e.g., the first position being the input to shift register $U_{i-1}$; the second position being the output of shift register $U_{i-2}$; the third position being the output of shift register $U_{i-3}$; and so on to the seventh position being the output of shift register $U_{i-6}$). The adder $A_{g_1}$ for the second polynomial $g_1$ is connected to receive the bit values from the first, third, fourth, sixth, and seventh positions of the shift register chain of FIG. 2.

To represent the generator polynomials in a more compact way, the octal notation is usually used, where zeros (0) are appended on the right of the binary notation to make the total number of digits a multiple of 3. For example, two zeroes are appended to the right of $g_0$ to generate the binary vector $g_0'=(1, 1, 1, 1, 0, 0, 1, 0, 0)$. Then the digits in $g_0'$ are grouped with 3 digits per group and the result is $g_0''=(111, 100, 100)$. Finally each group in $g_0''$ is transformed to its equivalent octal notation and the result is (7, 4, 4). The generator polynomials depicted in FIG. 2 for the 802.16 TBCC in octal notation are thus given by $G=(744, 554)$. The more compact octal notation is typically used herein to represent the generator polynomials.

There are many advantages of using Tail-biting convolutional codes (TBCC) over the conventional zero-tail convolutional codes (ZTCC) and some block codes. Two example advantages are listed below:

Advantage 1. zero-tail convolutional codes (ZTCC) need to use v number of redundant zero-tail bits to terminate the encoding trellises to the all-zero state. In Tail-biting convolutional codes (TBCC), zero-tail bits are not needed and they can be replaced by payload bits to increase the spectral efficiency of the channel code.

Advantage 2. Many good block codes can be generated by equivalent Tail-biting convolutional codes (TBCC), and hence can be decoded by the more efficient soft-input soft-output decoding algorithms for trellis codes.

Performances of convolutional codes (CC) are determined by the generator polynomials and the resulting weight spectrum, and the constructions of convolutional codes (CC) with good weight spectrum are usually done by extensive computer searches (as described, e.g., in references [2]-[9], listed hereinafter).

The weight spectrum (or distance spectrum) of a code C is defined by Expression 1.

$$WS(C)=\{(d, n_d, b_d): d=d_f, d_f+1, \ldots\} \qquad \text{Expression 1}$$

In Expression 1, $d_f$ is the free distance (or the minimum distance $d_{min}$), $n_d$ is the number of codewords with weight d, and $b_d$ is the total number of nonzero information bits associated with codewords with weight d. Each triple $(d, n_d, b_d)$ is called a line in the weight spectrum. If a convolutional code (CC) does not have a weight-$d_1$ codeword, then the corresponding line $(d_1, n_{d1}, b_{d1})$ does not exist.

The performances of convolutional codes (CC) are characterized either by the decoder frame error rate (FER) or the bit error rate (BER). It can be shown that, for a rate R=1/n Tail-biting convolutional codes (TBCC) with payload size K bits, the frame error rate (FER) and bit error rate (BER) can be upper bounded by Expression 2 and Expression 3.

$$P_{F,UB} = \sum_{d \geq df} n_d \cdot Q\left(\sqrt{2 \cdot d \cdot R \cdot (E_b/N_0)}\right) \qquad \text{Expression 2}$$

$$P_{B,UB} = \frac{1}{K} \cdot \sum_{d \geq df} b_d \cdot Q\left(\sqrt{2 \cdot d \cdot R \cdot (E_b/N_0)}\right) \qquad \text{Expression 3}$$

In the foregoing, $$Q(x) = \int_x^\infty \frac{1}{\sqrt{2\pi}} \exp(-z^2/2) dz$$

is the well-know Q-function. $E_b/N_0$ is the energy per bit to the noise power spectral density ratio. $E_b/N_0$ is used herein as the definition for signal to noise ratio (SNR). As can be seen from the above Expressions, the upper bound on the FER of a convolutional code (CC) can be reduced by minimizing the "multiplicity" $n_d$, and the upper bound on the BER can be reduced by minimizing the "bit multiplicity" $b_d$.

The search criteria for good convolutional codes (CC) can be roughly divided into the following two categories:

Category 1: Maximum Free Distance (MFD) Codes: The rule of thumb for finding good convolutional codes (CC) is to first find generator polynomials which will result in the maximum free distance (MFD) $d_f$ and the codes generated are called MFD codes (See, reference [2], listed hereinafter). If multiple generator polynomials have the same $d_f$, then the ones with minimum $n_d$ (or $b_d$) are selected and they are called MFD-FER codes (or MFD-BER codes). MFD codes are useful when the $E_b/N_0$ value is so large (i.e., over the very high SNR region) that only the $d_f$ term (the first line in the weight spectrum) has a significant contribution to $P_{F,UB}$ (or $P_{B,UB}$).

Category 2: ODS (Optimum Distance Spectrum) Codes: A Convolutional Code (CC) C with weight spectrum WS(C)= $\{(d, n_d, b_d): d=d_f, d_f+1, \ldots\}$ has a superior FER (or BER (See, reference [4], listed hereinafter)) distance spectrum than that of a Convolutional Code (CC) C with weight spectrum WS($\overline{C}$)=$\{(d, \overline{n}_d, \overline{b}_d): d=\overline{d}_f, \overline{d}_f+1, \ldots\}$ if one of the conditions of Expression 4 or Expression 5 is satisfied.

$$df > \underline{d}_f \text{ or} \qquad\qquad \text{Expression 4}$$

$$df = \underline{d}_f \qquad\qquad \text{Expression 5}$$

and there exists an integer j>1 such that $n_d=\overline{n}_d$ for $d=d_f, d_f+1, \ldots, d_f+j-1$ and $n_d<\overline{n}_d$ for $d=d_f+j$ (or $b_d=\overline{b}_d$ for $d=d_f, d_f+1, \ldots, d_f+j-1$ and $b_d<\overline{b}_d$ for $d=df+j$).

A Convolutional Code (CC) C is called ODS-FER code (or ODS-BER code) if it has a superior FER (or BER) distance spectrum than another code with the same code rate R and overall constraint length v.

From the above definitions it can be seen that an ODS code is always an MFD code, but not vice versa. For example, two MFD codes C and $\overline{C}$ with the same $(d_f, n_{df}, b_{df})$ may have quite different lines $(d, \overline{n}_d, \overline{b}_d)$ for $d>d_f$, and have different performances. Therefore, from the performance perspective, the ODS criterion should be used to find good convolutional codes (CC).

For zero-tail convolutional codes (ZTCC), the code searches have been extensively studied before. For example, generator polynomials for some MFD ZTCC are reported in reference [2], listed hereinafter, and the generator polynomials for some ODS-BER ZTCC are reported in references [3], [4] and [9], listed hereinafter.

Due to different encoding structures, the weight spectrums of Tail-biting convolutional codes (TBCC) are usually very different than those of zero-tail convolutional codes (ZTCC) with the same generator polynomials, especially for short and medium-length encoder packets. Moreover, for short and medium-length encoder packets, the optimum generator polynomials (for either the MFD or the ODS criterion) will usually be different for different encoder packet lengths (See, e.g., references [8] and [9]). That is, the optimization (or selection) of the Tail-biting convolutional codes (TBCC) generator polynomials needs to be done for each packet length. For example, generator polynomials for some MFD-FER TBCC codes have been reported (see references [5], [8] and [9], listed hereinafter). For long encoder packets (typically over 30 or 40 bits), the weight spectrums of Tail-biting convolutional codes (TBCC) and zero-tail convolutional codes (ZTCC) with the same generator polynomials will become approximately the same, and generator polynomials optimized for zero-tail convolutional codes (ZTCC) may be directly used for Tail-biting convolutional codes (TBCC) without performance degradation.

There are problems with the selection of the generator polynomials for Tail-biting convolutional codes (TBCC) as currently used. Two general problems are briefly described below:

Problem (1): Tail-biting convolutional codes (TBCC) are used by major wireless systems like EDGE, WiMAX and LTE. However, the generator polynomials of TBCC used by these systems are taken from the MFD zero-tail convolutional codes (ZTCC) or ODS zero-tail convolutional codes (ZTCC) and are not the optimum ones for Tail-biting convolutional codes (TBCC). This is mainly due to the unavailability of Tail-biting convolutional codes (TBCC) search results at the time when the corresponding standards were written. For LTE and EDGE systems, the impacts on performances by not using generator polynomials optimized for Tail-biting convolutional codes (TBCC) are very limited since the payload sizes used in these systems are relatively large. For WiMAX, since short payload sizes (12 bits or 24 bits) are used, performance degradations have been shown to be between 0.5 dB to 1 dB over the additive white Gaussian noise (AWGN) channel, and between 1 dB to 3.7 dB over the multipath fading channels.

Problem (2): The current available search results for the optimum generator polynomials for Tail-biting convolutional codes (TBCC) are MFD codes (See, references [5] [8] and [9], listed hereinafter). From the above discussions, it is now understood that ODS codes should be used instead.

SUMMARY

In one of its aspects, the technology disclosed herein concerns a method of implementing a low rate tail biting convolutional code to operate on data transmitted over a channel. In an example embodiment the method comprises: (0) specifying a constraint and a low code rate for the tail biting convolutional code, where the low rate code is lower than 1/n (n being an integer greater than 4); (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on the first L number of lines in the weight spectrum; (4) selecting an optimum code(s) from the best codes; and (5) configuring a circuit(s) of a data transceiver to implement the optimum code(s).

Optimum code(s) generated by the methods described herein can be expressed by a set of polynomials which are listed in Tables and/or stored in a memory.

In one of its implementations which concerns an ODS-FER operation, the method further comprises using a free distance parameter and a multiplicity parameter for selecting the optimum code(s) from the best codes. In an alternative implementation which concerns an ODS-BER operation, the method further comprises using a free distance parameter and a bit multiplicity parameter for selecting the optimum code(s) from the best codes.

In one of its aspects, the technology disclosed herein concerns a communications unit which participates in data transmissions over a channel. In an example embodiment the communications unit comprises a transceiver for sending and receiving data over the channel and a circuit (e.g., a shift register circuit) configured to implement an optimum low rate tail biting convolutional code for operating on the data transmitted over the channel. The optimum code can be expressed by a set of polynomials listed in Tables described herein and generated by acts of the afore-summarized method.

In an example implementation, the communications unit further comprises plural shift register circuits and a code activator. Each of the plural shift register circuits is configured to implement a respective different one of plural optimum low rate tail biting convolutional codes, each of the plural optimum low rate tail biting convolutional codes being of a different rate and being expressed by a set of polynomials listed in any of several tables described herein. The code activator is configured to include one of the plural shift register circuits in a processing stream for a respective data transmission over the channel.

In an example embodiment and implementation, the communication unit is or comprises a wireless terminal which communicates with a base station over an air interface, wherein the data transmitted over the channel comprises payload for a secondary fast feedback channel (SFBCH).

In another of its aspects, the technology disclosed herein concerns a method of operating a communications unit of a communications network. The method comprises configuring a circuit of the communications unit (e.g., a shift register circuit) to implement an optimum low rate tail biting convolutional code expressed by a set of polynomials listed in any one of certain tables described herein; and using the optimum low rate tail biting convolutional code to operate on data transmitted over a channel of the communications network.

In the methods and apparatus described herein, the circuit can be configured in accordance with the optimum low rate code either to function as an encoder to append error correction information to data transmitted over the channel.

In another of its aspects, the technology disclosed herein concerns a code generator comprising a computer which executes a computer program comprising instructions stored on a computer-readable medium, and a method performed by the execution. Execution of the instructions of the program results in performance of the acts of: (0) specifying a constraint and a low code rate for the tail biting convolutional code, where the low rate code is lower than 1/n (n being an integer greater than 4); (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on the first L number of lines in the weight spectrum; (4) selecting an optimum code(s) from the best codes; and (5) outputting an identification of the optimum code(s).

The technology disclosed herein optimizes the performances of tail-biting convolutional codes (TBCC) over short to medium-length encoder packets, codes with the best distance spectrum (ODS-FER codes or ODS-BER codes) being searched and tabulated. In an example embodiment, only the feedforward encoders are considered. In at least one of its aspects, the technology concerns ODS-FER and ODS-BER TBCC codes with short to medium-length encoder packets.

In example embodiments and modes, the low rate tail-biting convolutional codes (TBCC) have particularly advantageous employment for encoding a payload for a secondary fast feedback channel (SFBCH) that is transmitted from a wireless terminal over an air interface to a radio base station.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 3B is a diagrammatic view of portions of a communication network including a base station and a wireless station which communicate data over a channel using an optimized low rate tail biting convolutional code.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various elements including functional blocks labeled or described as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Figure 3A:
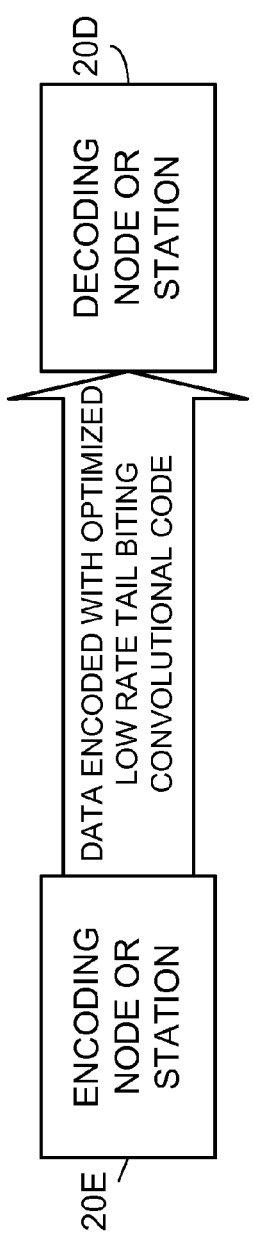
FIG. 3A is a diagrammatic view of portions of a communication network including nodes/communications units/stations which communicate data over a channel using an optimized low rate tail biting convolutional code.

FIG. 3A shows portions of an example communications network, and particularly two communications units or stations 20E and 20D. Communications unit/station 20E is an encoding communications unit/station which sends encoded data to decoding communications unit/station 20D. At least some of the data which is transmitted between encoding communications unit/station 30E and decoding communications unit/station 20D is encoded using an optimized low rate tail biting convolutional code. In an example implementation, the optimized low rate tail biting convolutional code is implemented and effected using methods described herein with reference, for example, to FIG. 4.

FIG. 3B shows in more detail example portions of an example implementation of a communications network such as that generically represented by FIG. 3A, and particularly a communications network portion which includes, as two of its communications units, base station 28 and wireless station 30. In the example network scenario shown in FIG. 3B, base station 28 and wireless station 30 communicate with each other over a channel which exists on or over a network interface, which interface happens in the example of FIG. 3B to be a radio or air interface 32. It should be understood that, in other communication networks which are not wireless, that the channel can be provided over a network interface which is other than wireless, e.g., a wired interface, for example.

As described herein, at least some of the data which is transmitted over network interface 32 is encoded using an optimized low rate tail biting convolutional code. In an example implementation, the optimized low rate tail biting convolutional code is generated by optimized low rate tail biting convolutional code generator 40 using methods described herein with reference, for example, to FIG. 4. In other words, at least some of the data transmitted over network interface 32 on a downlink from base station 28 to wireless station 30 is encoded using the optimized low rate tail biting convolutional code by base station 28, and therefore is decoded using the optimized low rate tail biting convolutional code upon receipt by wireless station 30. Conversely, at least some of the data transmitted over network interface 32 on an uplink from wireless station 30 to base station 28 is encoded using the optimized low rate tail biting convolutional code by wireless station 30, and therefore is decoded using the optimized low rate tail biting convolutional code upon receipt by base station 28.

FIG. 3B further illustrates certain units or functionalities comprising base station 28. On its downlink side, base station 28 comprises base station downlink data buffer 50, base station error correction encoder 52; an optional base station interleaver 56; base station modulator 58; and base station transceiver(s) 60. On its uplink side, base station 28 comprises base station demodulator 62; an optional base station de-interleaver 64; base station error correction decoder 66; and base station uplink data buffer 68. The base station 28 further comprises base station node controller 70, which in turn comprises (among other functionalities or units) base station scheduler 72. The base station scheduler 72 includes, among other entities or functionalities, low rate TBCC code selector 74.

FIG. 3B also illustrates certain units or functionalities comprising wireless station 30. The wireless station 30 executes, via a controller or the like, certain applications (e.g., application programs 76). On its uplink side, wireless station 30 comprises wireless station uplink data buffer 80, wireless station error correction encoder 82; an optional wireless station interleaver 84; wireless station modulator 86; and wireless station transceiver(s) 90. On its downlink side, wireless station 30 comprises wireless station demodulator 92; an optional wireless station de-interleaver 94; wireless station error correction decoder 96; and wireless station uplink data buffer 98. The air interface 32 further comprises wireless station controller 100, which in turn comprises (among other functionalities or units) low rate TBCC code requestor 104.

As mentioned above, when base station 28 and wireless station 30 are in communication over a channel existing over network interface 32, at least some of the data carried over the channel can be error correction encoded using the optimized low rate tail biting convolutional code generated by optimized low rate tail biting convolutional code generator 40. To this end, FIG. 3B shows by arrow 106 the loading of the optimized low rate tail biting convolutional code into base station error correction encoder 52 and base station error correction decoder 66. FIG. 3B also shows by arrow 108 the loading of the optimized low rate tail biting convolutional code into wireless station error correction encoder 82 and wireless station error correction decoder 96. For the encoding and decoding the data of the connection which exists between base station 28 and wireless station 30, the same optimized low rate tail biting convolutional code is loaded into the encoders and decoders of both base station 28 and wireless station 30.

As explained hereinafter, the "loading" of the optimized low rate tail biting convolutional code into an encoder can involve the configuring of circuit(s) (e.g., shift register circuit (s)) which comprise(s) the encoder(s).

In one of its aspects, the technology disclosed herein concerns a method of generating a set of generator polynomials for use as a tail biting convolutional code to operate on data transmitted over a channel. In particular the technology disclosed herein comprises an efficient method for computing a weight spectrum of low rate Tail-biting convolutional codes (TBCC). The method of the technology disclosed herein is a modified version of an approach for computing a turbo code weight spectrum (See, reference [7], listed hereinafter).

Figure 4:
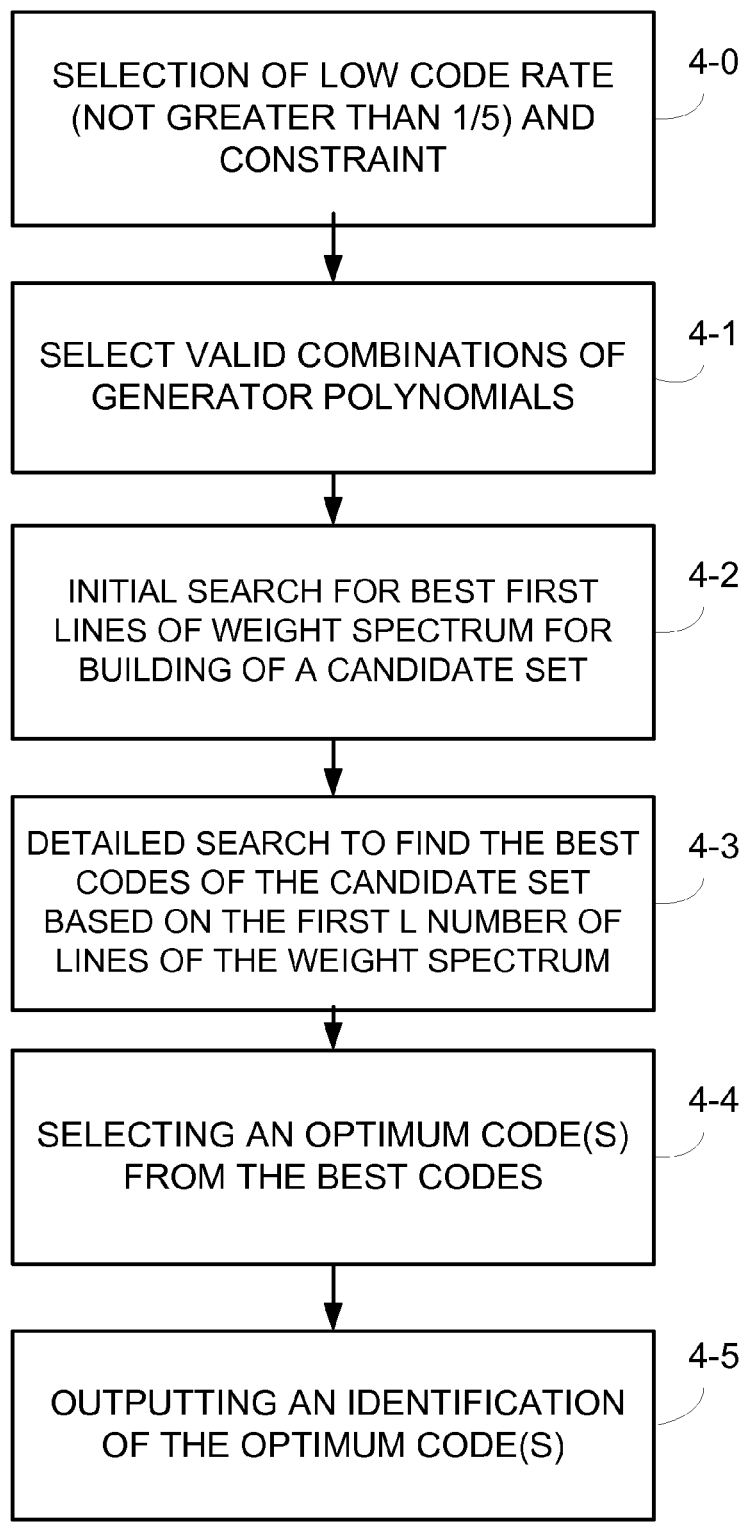
FIG. 4 is a flow chart showing basic, representative acts or steps which comprise a method of code determination according to the technology disclosed herein.

The method of generating an optimized low rate tail biting convolutional code can be performed by a unit such as the optimized low rate tail biting convolutional code generator 40 shown in FIG. 3B. The optimized low rate tail biting convolutional code generator 40 can be realized by (e.g., implemented using) a computer or processor which executes a computer program comprising instructions stored on a computer-readable medium. The basic, representative acts or steps for finding the ODS-FER TBCC codes and ODS-BER TBCC codes (as performed, e.g., by optimized low rate tail biting convolutional code generator 40) are illustrated in FIG. 4 and described herein.

Act 4-0 comprises selecting or specifying that the tail-biting convolutional code to be utilized is/will be a low rate code (e.g. a low code rate), and specifying or selecting the constraint length for the tail-biting convolutional code which is to be utilized. As used herein, a "low rate" code is a TBCC with coding rates lower than or equal to $\frac{1}{5}$, e.g., code rates of ⅕, ⅙, ⅐, etc. In other words, a low rate TBCC codes has a code rate value lower than 1/n (n being an integer greater than 4). As understood by those skilled in the art, the lower coding rate is indicated by the lower value of the entire fraction (e.g., increasing denominator). The constraint length is defined as the total number of shift register elements in the encoder.

The low rate codes are of interests since they provide very high coding gains, especially when compared with high rate codes followed by simple repetitions after encoding. For example, a properly designed low rate ⅙ code can provide more coding gain than a high rate ⅓ code followed by the 2-time repetitions on the encoded bits.

The act of selecting or specifying the code rate and the constraint for the tail-biting convolutional code to be utilized can be performed by input into a terminal or other device which comprises or interfaces with a computer, processor, or controller. The input can be user (e.g., human) input or can be automated input based on pre-stored or pre-selected parameters which form a basis for deducing the desired code rate and constraint.

Act 4-1 comprises selecting valid combinations of generator polynomials to include in a pool of potential codes, each valid combination being and/or yielding a potential code of the prescribed low code rate. The person skilled in the art understands how to use code rate and constraint length to select the appropriate generator polynomials. For a combination of generator polynomials to be considered valid for the technology disclosed herein, certain criteria must be satisfied. Such criteria can be understood with reference to the structure of a shift register circuit which implements the tail biting convolutional code, for example the shift register circuit of FIG. 1. The criteria which must be satisfied in order to have a valid combination of generator polynomials includes the following: (1) at least one coefficient for the most-left-hand-side connections of the shift register circuit (e.g., $g_0^{(0)}, \ldots, g_{n-1}^{(0)}$ in FIG. 1) needs to be 1; (2) at least one coefficient for the most-right-hand-side connections of the shift register circuit (e.g., $g_0^{(v)}, \ldots, g_{n-1}^{(v)}$ in FIG. 1) needs to be 1; and (3) the polynomial 000 is invalid (e.g., ineligible). Moreover, all different permutations of the generator polynomials $g_0$, $g_1, \ldots, g_{n-1}$ that will generate the same code and are counted as one, are considered the same.

Act 4-2 comprises performing an initial search for best first lines of weight spectrum for building of a candidate set. In other words, act 4-2 comprises determining first lines of a weight spectrum for each potential code in the pool, and including potential codes of the pool having best first lines in a candidate set. In the initial search of act 4-2, the first line of the weight spectrum (the first line being the minimum distance terms $(d_f, n_{df}, b_{df})$) for each valid combination (e.g., valid set) of polynomials from act 4-1 is computed, and the best ones (e.g., the best first lines) in terms of MFD-FER (or MFD-BER) are put into a set know as the candidate set. The Tail-biting convolutional codes (TBCC) in the candidate set are actually MFD-FER TBCC (or MFD-BER TBCC). The code (or the set of generator polynomials) with the largest free distance $d_f$ will be selected. If there are multiple codes with the same $d_f$, then the codes with the smallest $n_{df}$ (or smallest $b_{df}$) are selected as the MFD-FER codes (or MFD-BER codes).

Act 4-3 comprises a detailed search to find the best codes of the candidate set based on the first L number of lines of the weight spectrum. In other words, in the detailed search of act 4-3, the first L number of lines of the weight spectrum, $\{(d, n_d, b_d)$: d ranges from the first L codeword weights beginning from $d_f\}$, are computed for all codes in the candidate set obtained from act 4-2. The best codes in terms of ODS-FER (or ODS-BER) are selected, and the resulting sets are ODS-FER TBCC (or ODS-BER TBCC).

As a variation of the method of FIG. 4, certain checks can be implemented to reduce computational complexities of act 4-2 and act 4-3. The variation involves checking for the following three conditions:

Condition 1: If a new set of valid generator polynomials (whose weight spectrum is to be computed) G1 is equivalent to an existing set of generator polynomials G2 in the candidate set in the sense of weight spectrum, then the computation for the weight spectrum of G1 can be skipped. This condition can be detected by checking if the generator matrix of G1 can be obtained from the generator matrix of G2 by column permutation operations and/or row permutation operations (See, e.g., reference [9], listed hereinafter). The same rule can be applied to act 4-3.

Condition 2: During the computation of the weight spectrum for a new set of valid generator polynomials G1, if G1 has inferior FER (or BER) distance spectrum than that of any existing set of generator polynomials G2 in the candidate set, then the computation can be stopped early and G1 will not be included in the candidate set. The same rule can be applied to act 4-3.

Condition 3: During the computation of the weight spectrum for a new set of valid generator polynomials G1, if G1 has inferior FER (or BER) distance spectrum than that of any a priori known distance spectrum, then the computation can be early stopped and G1 will not be included in the candidate set. The same rule can be applied to (act 4-3).

Concerning act 4-2, it should be understood that G1 can refer to a valid set of polynomials that survive act 4-1 and G2 can refer to one set of generator polynomials in the candidate set (who survive act 4-2). In condition 1, G1 needs to be compared with all sets of polynomials in the candidate set to see if G1 is equivalent to any of them. In condition 2, G1 needs to be compared with one set of polynomials (since all sets of polynomials in the candidate set have the same first line weight spectrum) in the candidate set to see if G1 is inferior to any of them in terms of FER (or BER). Note that if G1 has better first line weight spectrum than that of the candidate set, the candidate set will be updated to G1; if G1 has the same first line weight spectrum as that of the candidate set, G1 will be added to the candidate set.

In conjunction with act 4-2, for the low rate codes the number of valid combinations of generator polynomials is extremely large for the large overall constraint length case, and proper division of all valid combinations of generator polynomials into smaller sets is needed for efficient search. The overall constraint length v is defined as the total number of shift register elements in the encoder. For TBCC with code rate 1/n (n>4) as described herein (instead of rates like ⅔, ⅖, etc), the "overall constraint length" is also called "constraint length".

Thus, as indicated in the preceding paragraph, using the low rate codes presents computational inefficiency/complexity which can be avoided by breaking the set of valid combinations of generator polynomials into subsets. Use of the smaller sets does not affect the results other than make them easier to obtain. For example, with respect to act 4-1 and act 4-2 all valid combinations of generator polynomials need to be considered when searching for optimum codes. The number of valid combinations will be proportional to $2^{(v+1)n}$, where n is the denominator from the code rate 1/n. Therefore for low rate codes where n is large (n>4) the computational complexity is very large if large constraint length v is also used, like v=7 (see Table 6). Therefore, dividing the search space (i.e., all valid combinations) into smaller sets does not affect the results other than make them easier to obtain. The smaller sets can be executed by different computers or central processing units (CPUs) in parallel (one CPU for computing the optimum distance spectrum of one smaller set), and the best optimum distance spectrum can be selected. The smaller sets can also be executed by a computer or CPU in a serial manner. In the serial computation the optimum weight spectrum obtained from a smaller set can be used as a-priori known distance spectrum for other smaller sets, as understood from an ensuing discussion.

The division of the valid combinations of generator polynomials into "smaller sets" can be viewed as providing a filtering or reduction in the number of results, e.g., reducing the overall computational complexity. The optimum weight spectrum obtained from a smaller set can be used as a-priori known distance spectrum for other smaller sets. "Filtering" as used in this context is in terms of reduction of the computational complexity by early stopping.

What now follows is an example of how act 4-2 and act 4-3 can be performed with condition 2, which provides an understanding of the previously used term "a-priori". Assume that a search is to be performed for the ODS-FER TBCC with rate=⅕, v=7 and K=12 (as represented by Table 6). First, as act 4-1 the set X=(G1, G2, . . . , GN) of all valid combinations of generator polynomials is found, where each Gi is a valid combination of generator polynomials and N is the number of possible combinations. That is, each G1 consists of n (here n=5 for rate ⅕) generator polynomials (g0, g1, g2, g3, g4).

Then during act 4-2 the first line of the weight spectrum (the minimum distance terms $(d_f, n_{df})$) is computed for each G1, and the best weight spectrum $(d_f, n_{df})$ best up to index i will be updated. Also, during the computation of $(d_f, n_{df})$ for G1, if it is found that its $(d_f, n_{df})$ is worse than the best weight spectrum $(d_f, n_{df})$ best up to index (i−1), then the computation is stopped early and G1 is discarded. This is called condition 2. Actually $(d_f, n_{df}, b_{df})$ is computed instead of $(d_f, n_{df})$, but since only the first two entries in $(d_f, n_{df}, b_{df})$ are used in finding the ODS-FER TBCC, the notation $(d_f, n_{df})$ is used in this example.

In an example illustrative scenario, act 4-2 may resemble the following logic flow in one particular situation for which non-limiting, illustrative, example values are provided:

i=1: $(d_f, n_{df})$ of $G_1$ is found to be (12, 240). Set $(d_f, n_{df})_{best}$ equal to (12, 240) and set the candidate set equal to $\{G_1\}$.

i=2: $(d_f, n_{df})$ of $G_2$ is found to be (13, 242). Since (13, 242) is better than $(d_f, n_{df})_{best}$=(12, 240) in terms of the MFD-FER criterion (because 13>12), update $(d_f, n_{df})_{best}$ by (13, 242) and update the candidate set by $\{G_2\}$.

i=3: $(d_f, n_{df})$ of $G_3$ is found to be (13, 242). Since (13, 242) is equivalent to $(d_f, n_{df})_{best}$=(13, 242) in terms of the MFD-FER criterion, do not update $(d_f, n_{df})_{best}$ but update the candidate set by $\{G_2, G_3\}$.

i=4: the computation of $(d_f, n_{df})$ for $G_4$ is not completed yet but during the computation process we already know that $(d_f, n_{df})$ of $G_4$ is worse than $(d_f, n_{df})_{best}$. In this case we early stop the computation of $(d_f, n_{df})$ for $G_4$ and this is called condition 2. $(d_f, n_{df})_{best}$ and the candidate set are not changed.

i=5: $(d_f, n_{df})$ of $G_5$ is found to be (13, 230). Since (13, 230) is better than $(d_f, n_{df})_{best}$(13, 242) in terms of the MFD-FER criterion (because 230<242), update $(d_f, n_{df})_{best}$ by (13, 230) and update the candidate set by $\{G_5\}$.

i=6: $(d_f, n_{df})$ of $G_6$ is found to be (14, 235). Since (14, 235) is better than $(d_f, n_{df})_{best}$=(13, 230) in terms of the MFD-FER criterion (because 14>13), update $(d_f, n_{df})_{best}$ by (14, 235) and update the candidate set by $\{G_6\}$.

. . .

i=N: finally $(d_f, n_{df})_{best}$=(24, 659) and there are N1 candidates in the candidate set $\{G_{C(1)}, G_{C(2)}, \ldots, G_{C(N1)}\}$.

Continuing with the example illustrative scenario, during act 4-3 the first-L-line weight spectrum are computed for each $G_{C(i)}$ in the candidate set for i=1, . . . , N1, and the best first-L-line weight spectrum in terms of ODS-FER up to index i will be updated. Also, during the computation of for $G_{C(i)}$, if it is found that its first-L-line weight spectrum is worse than the best first-L-line weight spectrum up to index (i−1), then the computation is stopped early and $G_{C(i)}$ is discarded. This is an implementation of condition 2.

Continuing with the above example illustrative scenario, and assuming L=2, an example execution of act 4-3 may resemble the following logic flow:

i=1: the first-L-line weight spectrum of $G_{C(1)}$ is (24, 659; 26, 440), where (24, 659) is the weight spectrum of the first line and (26, 440) is the weight spectrum of the second line. The best first-L-line weight spectrum is set to (24, 659; 26, 440) and the set of ODS-FER TBCC is $\{G_{C(1)}\}$.

i=2: the first-L-line weight spectrum of $G_{C(2)}$ is (24, 659; 26, 440). The best first-L-line weight spectrum is unchanged and the set of ODS-FER TBCC is updated to $\{G_{C(1)}, G_{C(2)}\}$.

i=3: the first-L-line weight spectrum of $G_{C(3)}$ is (24, 659; 27, 420). Since (24, 659; 27, 420) is better than (24, 659; 26, 440) in terms of the MFD-FER criterion (because 27>26), the best first-L-line weight spectrum is updated by (24, 659; 27, 420) and the set of ODS-FER TBCC is updated by $\{G_{C(3)}\}$.

i=4: the first-L-line weight spectrum of $G_{C(4)}$ is (24, 659; 27, 420). The best first-L-line weight spectrum is unchanged and the set of ODS-FER TBCC is updated to $\{G_{C(3)}, G_{C(4)}\}$.

i=5: the computation of the first-L-line weight spectrum for $G_{C(5)}$ is not completed yet but during the computation process we already know that its first-L-line weight spectrum is worse than (24, 659; 27, 420), which is the best so far. In this case we early stop the computation of the first-L-line weight spectrum for $G_{C(5)}$ and this is called condition 2. The best first-L-line weight spectrum and the set of ODS-FER TBCC are not changed.

. . .

i=N1: finally the best first-L-line weight spectrum is (24, 659; 28, 410) and there are 14 codes in the set of ODS-FER TBCC. By further examining whether these 14 codes are permutation equivalent and counting the permutation equivalent codes as one code, we found that there are 4 ODS-FER TBCC. These results are then put in the tables such as Tables 2-16.

From the above example, it can be seen that $(d_f, n_{df})_{best}$ is used as a reference in act 4-2, and the reference is updated during act 4-2: first (12, 240), then (13, 242), . . . , and finally (24, 659). In condition 3, we set the reference $(d_f, n_{df})_{best}$ to be an a-priori known distance spectrum at the beginning of act 4-2. For example, if we set $(d_f, n_{df})_{best}$=(14, 235) at the beginning of act 4-2, then the computations of $(d_f, n_{df})$ for $G_i$, i=1, . . . , 5, can be early stopped. Another example is that we set $(d_f, n_{df})_{best}$=(22, 24) at the beginning of act 4-2, then most of the computations in act 4-2 will be stopped early as the minimum distance 22 in (22, 24) is very close to the optimum minimum distance 24 in (24, 659). The selection of (22, 24) comes from the optimum weight spectrum in Table 5 (assuming we compute Table 5 before Table 6): given the same rate ⅕ and the same length K=12, we know that the optimum weight spectrum for TBCC with v=7 should be better than optimum weight spectrum (22, 24) for TBCC with v=6 in Table 5.

Therefore, a-priori known distance spectrum in condition 3 refers to a good reference from which we begin to search for optimum TBCC. The a-priori known distance spectrum can be obtained from some previous computation for weight spectrum for TBCC with smaller constraint length (like we searched TBCC with v=6 in Table 5 first before we searched TBCC with v=7 in Table 6). It can also be obtained from computation for other smaller set.

During act 4-3, G1 refers to a set of polynomials from the candidate set (who survive act 4-2), and G2 refers to one set of generator polynomials in the final set (who survive act 4-3). In condition 1, G1 needs to be compared with all sets of polynomials in the final set to see if G1 is equivalent to any of them. In condition 2, G1 needs to be compared with one set of polynomials (since all sets of polynomials in the final set have the same first L lines weight spectrum) in the final set to see if G1 is inferior to any of them in terms of FER (or BER). Note that if G1 has better first L lines weight spectrum than that of the final set, the final set will be updated to G1; if G1 has the same first L lines weight spectrum as that of the final set, G1 will be added to the final set.

In the search process comprising act 4-2 and act 4-3, the choice of whether to use MFD-FER or MFD-BER can be arbitrary as long as the choice (MFD-FER or MFD-BER) remains consistent for act 4-2 and act 4-3. If FER is to be minimized, then MFD-FER criterion should be used and codes marked with ODS-FER from the appropriate Table below should be used. Otherwise, if BER is to be minimized, then MFD-BER criterion should be used and codes marked with ODS-BER from the appropriate Table below should be used.

Act 4-4 comprises outputting an identification of the optimized low rate tail biting convolutional code(s) to be utilized for encoding data over the channel. The identification can be output in any suitable manner, such as displaying on a screen, printing or recording or affixing on/to any tangible medium, or storing in a memory, just to name a few examples. The identification can comprise an indication of the generator polynomials which comprise the optimized low rate tail biting convolutional code. The description or indication for a generator polynomial of the optimized low rate tail biting convolutional code can be expressed in the octal notation previously described herein.

One form of outputting the identification of the optimized low rate tail biting convolutional code can include listing or storing of the search results for generated optimized low rate tail biting convolutional code in a table, the table providing optimized low rate tail biting convolutional codes grouped by code rate and constraint length. The table can be stored in a memory or the like, such as a memory or a processor, a semiconductor memory, a non-volatile memory, for example.

Many different tables can be generated as act 4-4 using the technology disclosed herein, e.g., on the basis of the method described with reference to FIG. 4. Table 2-Table 16 show example new ODS feedforward low rate Tail-biting convolutional codes (TBCC) of various low rates and constraint lengths. Table 1 serves an index by which to reference Table 2-Table 16. That is, from Table 1 it can be determined which other Table to consult for a given rate and constraint length. In Table 1, columns 2-6 correspond to the rates of 1/5, 1/6, 1/7, 1/8, and 1/9, respectively; while rows 2-6 correspond to constraint lengths of 3-7, respectively. For example, to find a suitable ODS feedforward Tail-biting convolutional codes (TBCC) generated by the technology disclosed herein and having a rate of 1/5 and a constraint length v=5, Table 4 would be consulted.

Table 2-Table 16 list only search results (e.g., sets of generator polynomials) which are believed not to have been previously reported in the literature. In this regard, since low rate Tail-biting convolutional codes (TBCC) are specified by its set of generator polynomials, "sets of generator polynomials" are sometimes used herein to mean "codes".

Table 2-Table 16 are subject to the following comments and conditions, each of which is herein referred to as a "Table Note":

Table Note 1: In each of Table 2-Table 16, the letter "K" in the first column represents the number of payload bits; that is, the number of information bits to be encoded.

Table Note 2: In the searches performed according to the method of FIG. 4 and the technology disclosed herein, the ODS-BER TBCC (for a fixed code rate R, constraint length v, and payload size K) all have the same weight spectrum WS(C)={(d, $n_d$, $b_d$): d=$d_f$, $d_f$+1, ... }. In these searches, the ODS-FER TBCC may not have the same weight spectrum WS(C). That is, the ODS-FER TBCC have the same partial weight spectrum {(d,$n_d$): d=$d_f$, $d_f$+1, ... } but may have different partial weight spectrum {(d,$b_d$): d=$d_f$, $d_f$+1, ... }. In the case where ODS-FER TBCC do not have the same weight spectrum WS(C), only the ODS-FER TBCC with the best partial weight spectrum {(d,$b_d$): d=$d_f$, $d_f$+1, ... } are selected. In the fifth column, ODS-FER denotes that the TBCC in the corresponding row have ODS-FER, ODS-BER denotes that the TBCC in the corresponding row have ODS-BER, and ODS-FER/BER denotes that the TBCC in the corresponding row have both ODS-FER and ODS-BER.

Table Note 3: "G" (the second column) of each of Table 2-Table 16 is the set of generator polynomials. Usually more than one set of generator polynomials exists for each row. For 2 sets of generator polynomials G1 and G2 in the same row, if the generator matrix of G1 can be obtained from the generator matrix of G2 by column permutation operations and/or row permutation operations, it is said that G1 is permutation equivalent to G2 and only one of them is listed in the second column. Therefore, for each value of K, the sets of generator polynomials are divided into different permutation equivalent groups. The number of equivalent sets of generator polynomials in each group is listed under the fourth column labeled by "# permutation equivalent codes".

Table Note 4: The term "WS" in the third column of the tables stands for weight spectrum. Under this column only the first line of the weight spectrum ($d_f$, $n_{df}$, $b_{df}$) is listed.

In an example implementation, L is chosen to be 20 for the search of act 4-3. To find ODS codes, by definition all lines of the weight spectrum need to be computed at act 4-3. Most of the codes considered herein have less than 20 lines of the weight spectrum. Therefore, L can be chosen to be 20 to cover most of the cases. During act 4-3, if some code has more than 20 lines of the weight spectrum (for example, when the payload size K is very large), then only the first 20 lines are computed and are used in act 4-3 to see if the code is ODF-FER (or ODS-BER).

If the ODS-FER (or ODS-BER) codes found after act 4-3 have more than 20 lines of the weight spectrum, the extra lines beyond the first 20 lines will be computed to make sure the selected codes have the optimum weight spectrum.

The function Q(x), described previously, is a monotonically decreasing function, which means that Q(x)>Q(y) if y>x. For large Eb/N0 values (high SNR region), only the first few lines of the weight spectrum (with smaller values of d) will have significant contributions to $P_{F,UB}$ and $P_{B,UB}$. For the extremely large Eb/N0 value, only the first line of the weight spectrum will have significant contributions to $P_{F,UB}$ and $P_{B,UB}$, and this corresponds to the MFD-FER (or MFD-BER) criterion where we assume Eb/N0 value is very large. For the small and medium Eb/N0 values, all lines of the weight spectrum will contribute to $P_{F,UB}$ and $P_{B,UB}$. Therefore, for the MFD-FER (or MFD-BER) codes, it can only be guaranteed that they will have the smallest value of $P_{F,UB}$ (or $P_{B,UB}$) over the high SNR region. Over the small and medium SNR region, the MFD-FER (or MFD-BER) codes may not have the smallest value of $P_{F,UB}$ (or $P_{B,UB}$). However, as the low error rate transmission (that is, over the high SNR region) is the desired mode of transmission, it makes sense to optimize the codes over the high SNR region. Since ODS-FER (or ODS-BER) codes have the optimum first L lines (L=20 in this example) of the weight spectrum, they will have the smallest value of $P_{F,UB}$ (or $P_{B,UB}$) over most of the SNR region.

Advantageously, ODS-FER TBCC have the optimum weight spectrum for achieving lower FER, and ODS-BER TBCC have the optimum weight spectrum for achieving lower BER. Also, the low rate codes provide more coding gains than the high rate codes followed by repetitions on the encoded bits. Therefore, low rate TBCC are good candidates to replace high rate codes followed by repetitions on the encoded bits.

Figure 5:
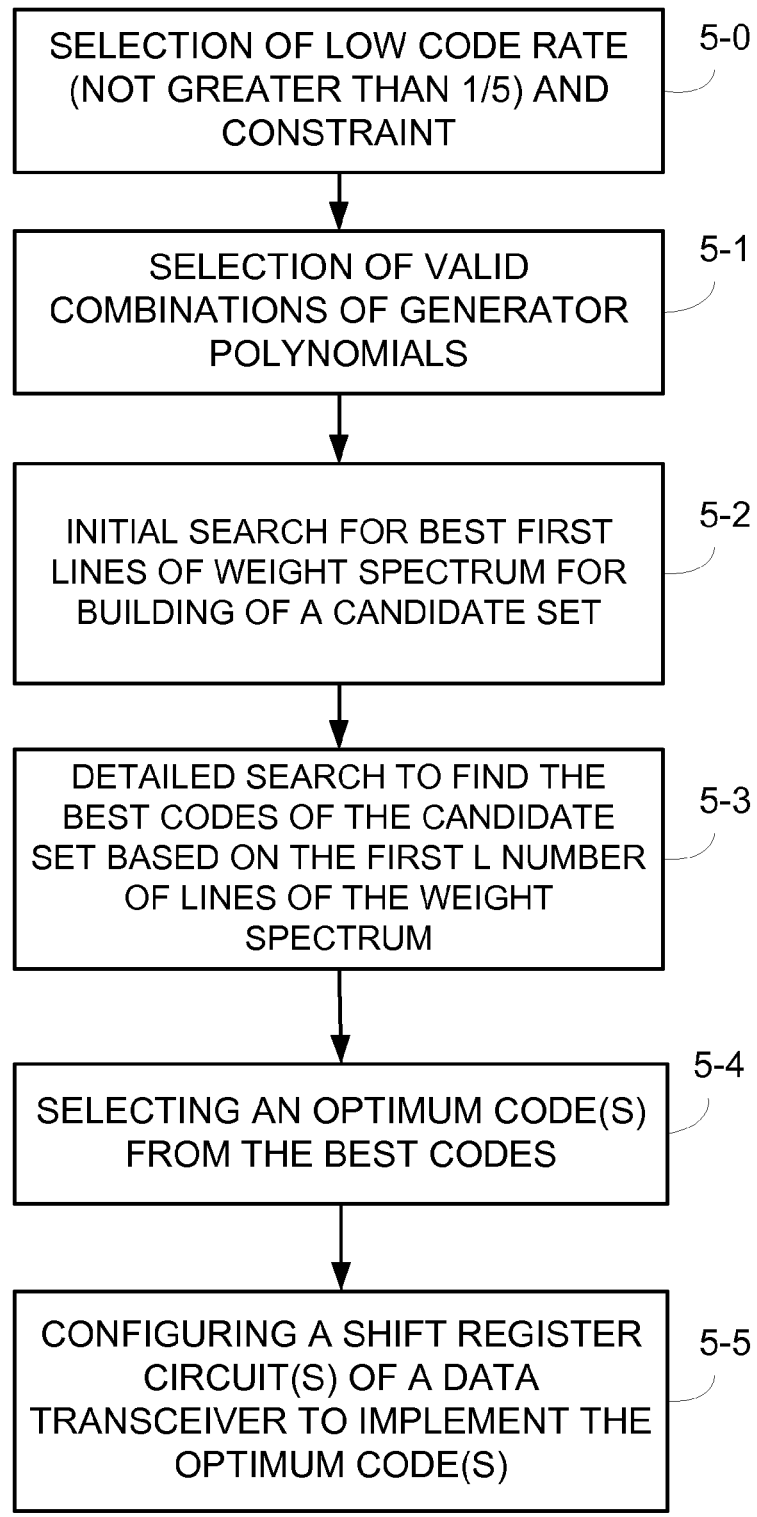
FIG. 5 is a flow chart showing basic, representative acts or steps which comprise a method of code determination and utilization according to the technology disclosed herein.

FIG. 5 shows a variation of the general method of FIG. 4, wherein acts 5-0 through 5-4 are essentially the same as acts 4-0 through 4-4, respectively, of FIG. 4. FIG. 5 differs from FIG. 4 by showing that, in one example method implementation, act 4-5 of FIG. 4 (the act of outputting the optimized low rate tail biting convolutional code(s)) can comprise configuring a circuit(s) of a data transceiver to implement the optimum code(s). In an illustrated example embodiment, the circuit(s) so configured can be shift register circuit(s).

Figure 1:
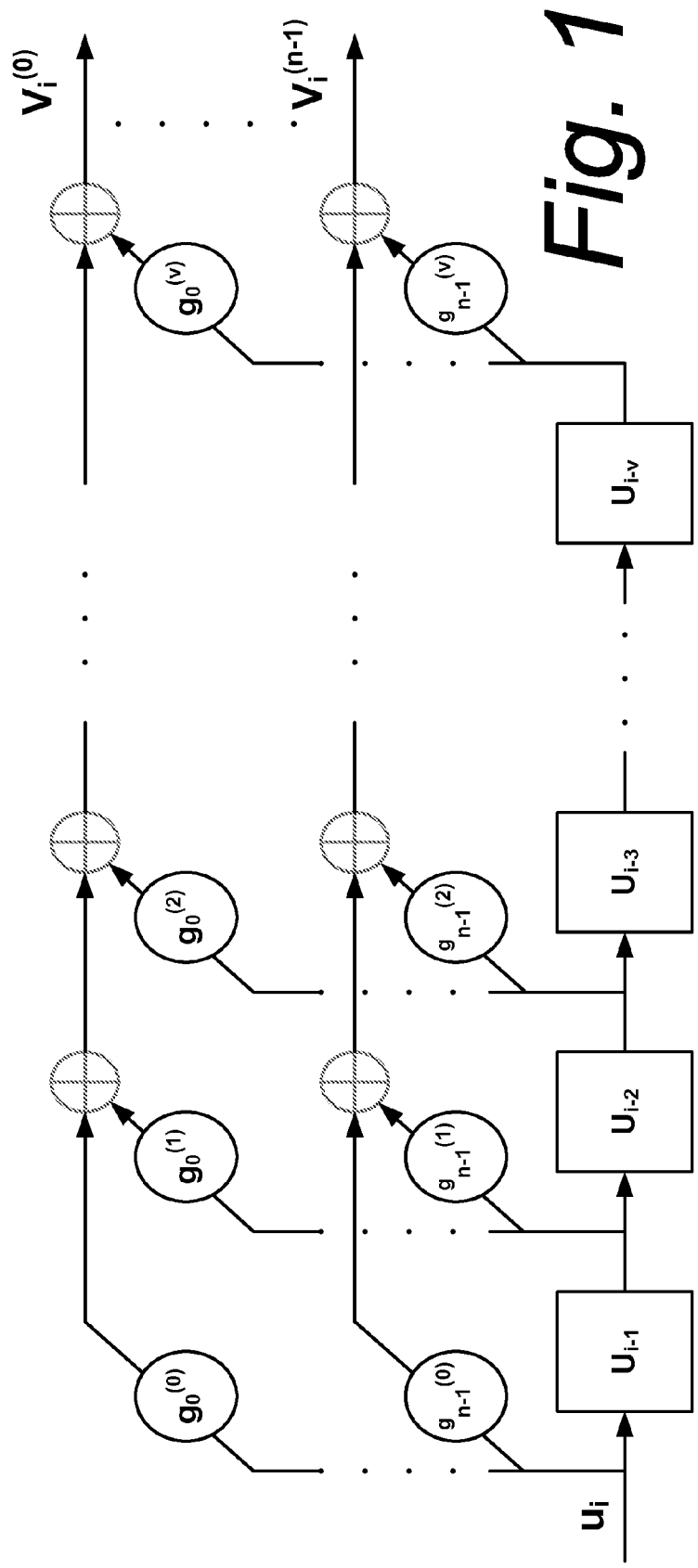
FIG. 1 is a diagrammatic view of encoder structure of a rate 1/n feedforward convolutional code with constraint length v.
Figure 2:
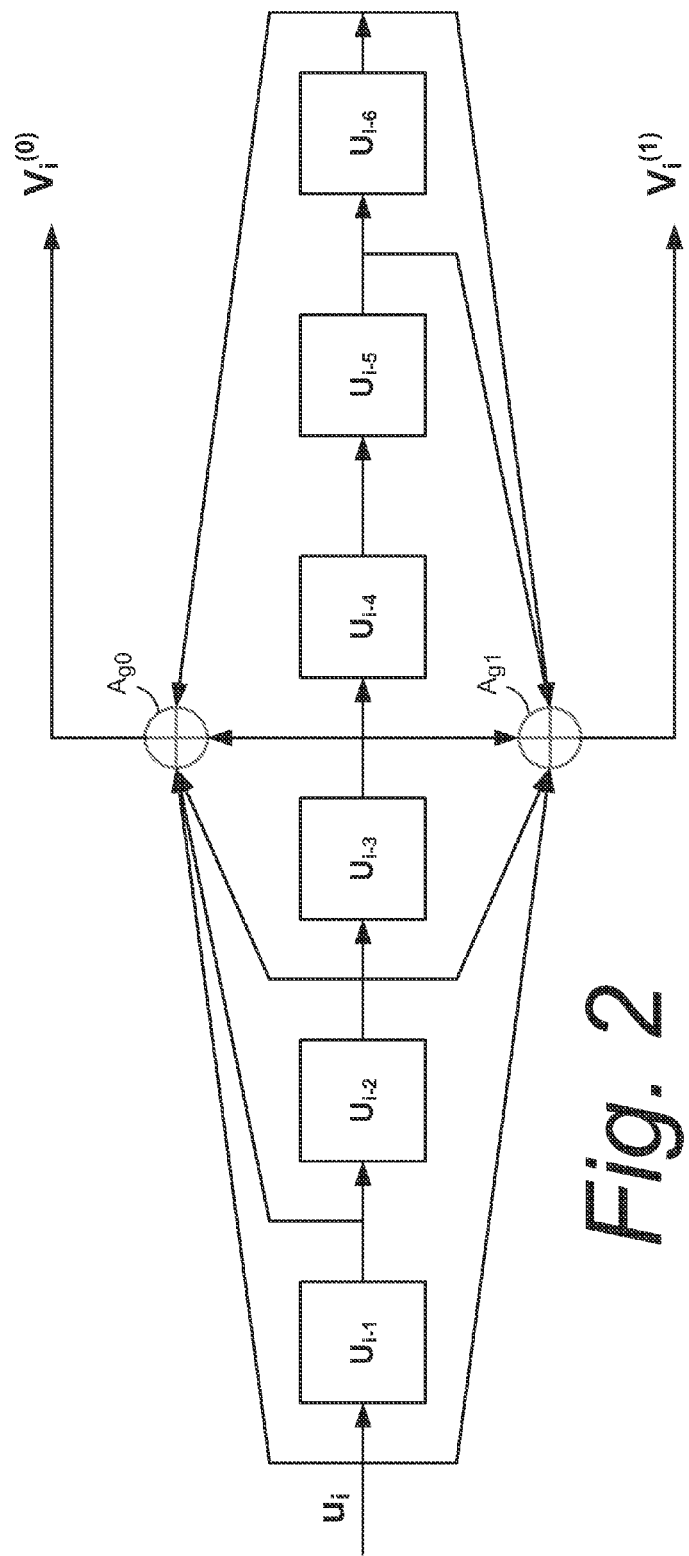
FIG. 2 is a diagrammatic view of an example encoder for 802.16 Tail-biting convolutional codes (TBCC) having code rate 1/n=½, constraint length v=6, and G=($g_0$,$g_1$), where $g_0$=(1, 1, 1, 1, 0, 0, 1) and $g_1$=(1, 0, 1, 1, 0, 1, 1).

The person skilled in the art will appreciate, particularly with reference to the preceding discussion of FIG. 1 and FIG. 2, how to configure a shift register circuit by connecting outputs of shift registers in order to implement the set of generator polynomials that comprise the optimized low rate tail biting convolutional code. The shift register circuit which is configured to implement the optimized low rate tail biting convolutional code can comprise, for example, one or more of base station error correction encoder 52 and base station error correction decoder 66 of base station 28 and wireless station error correction encoder 82 and wireless station error correction decoder 96 of wireless station 30. Since the mapping from one set of generator polynomials to the shift register encoder is illustrated in FIG. 1 and FIG. 2, and taking FIG. 2 as an example, implementation of a optimized low rate tail biting convolutional code in a shift register circuit can be realized in three basic acts. A first act comprises obtaining the set of optimum generator polynomials, i.e., from an appropriate one of the Tables 2-16. The second act comprises transforming the octal representation (utilized in the table) to binary representation. The third act comprises configuring the connections (from shift registers to outputs) in the circuit according to g0 and g1, where 1=connection and 0=no connection. For example, g0 is for connections from the upper part of the shift registers to output Vi(0), and (from left to right) there are four connections followed by two "no connections" then ended by one connection.

Figure 6:
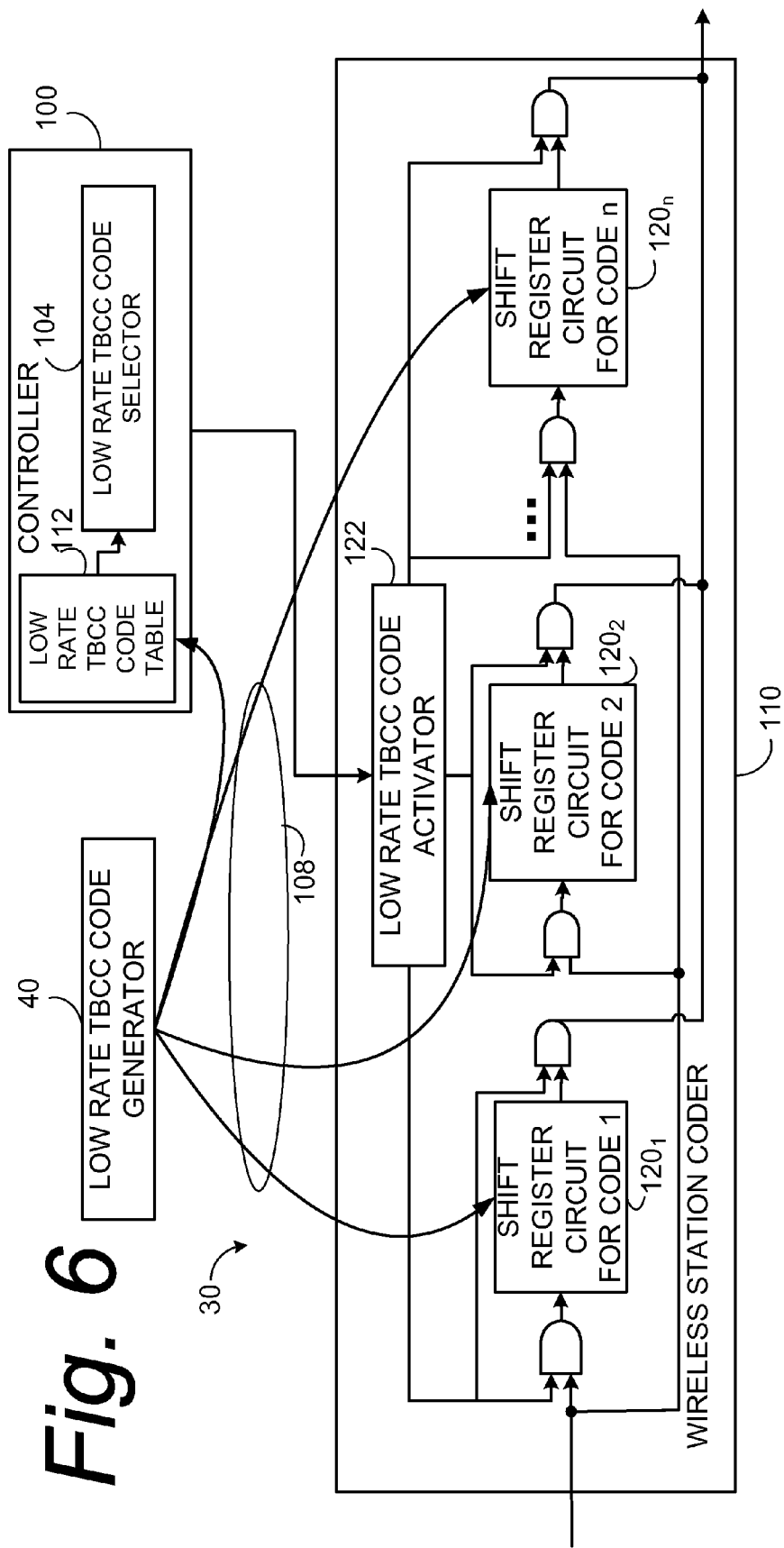
FIG. 6 is a diagrammatic view of a portion of a wireless station including a wireless station coder according to an example embodiment.

FIG. 6 illustrates portions of an example wireless station 30, and particularly portions of a wireless station coder 110 which operates in conjunction with wireless station controller 100. The wireless station coder 110 can comprise a portion of a baseband application specific integrated circuit (ASIC) which hosts, in addition to coding, other baseband processing functionalities. In the example embodiment shown in FIG. 6, wireless station controller 100 comprises not only low rate TBCC code requestor 104, but also low rate TBCC code table 112. The wireless station coder of FIG. 6 serves to illustrate the wireless station error correction encoder 82. As shown in FIG. 6, wireless station coder 110 comprises plural shift register circuits $120_1$-$120_n$ and code activator 122. Each of the plural shift register circuits $120_1$-$120_n$ is configured to implement a respective different one of plural optimum low rate tail biting convolutional codes. Each of the plural optimum low rate tail biting convolutional codes implemented by the respective shift register circuits $120_1$-$120_n$ is of a different rate and is expressed by a set of polynomials listed in any of Table 2-Table 16. FIG. 6 shows by arrow 108 that the configuration of the respective shift register circuits $120_1$-$120_n$ is based upon identification of different ones of the optimized low rate tail biting convolutional codes generated by optimized low rate tail biting convolutional code generator 40. The code activator 122 is configured to include one of the plural shift register circuits $120_1$-$120_n$ in a processing stream for a respective data transmission over the channel. The code activator 122 includes an appropriate one of the plural shift register circuits $120_1$-$120_n$ in the processing stream by operating AND gates so that an input signal to wireless station coder 110 is applied only to the one activated shift register circuits 120, and so that an output signal from the wireless station coder 110 is taken only from the activated shift register circuits 120.

Figure 7:
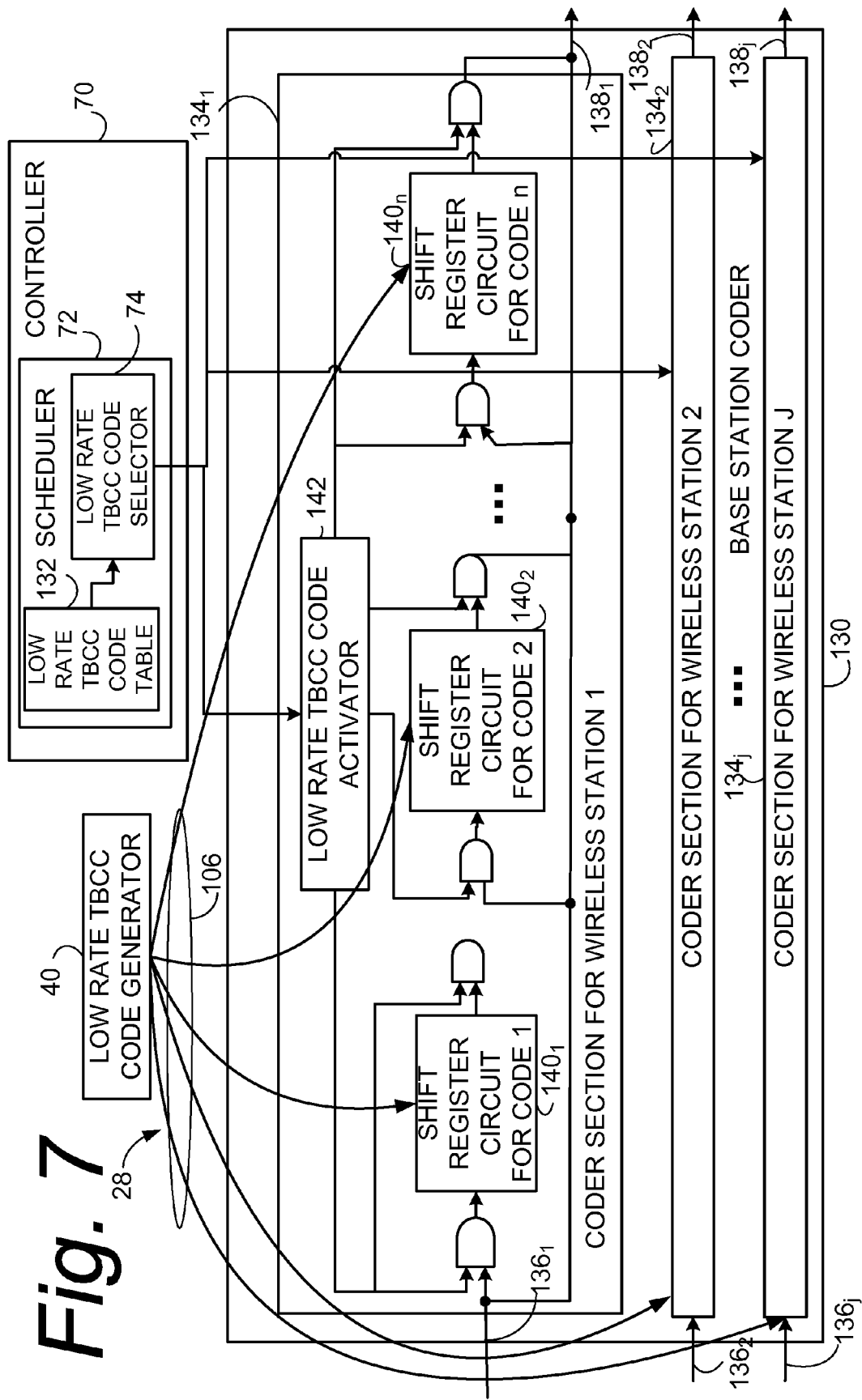
FIG. 7 is a diagrammatic view of a portion of a base station node including a base station coder according to an example embodiment.

FIG. 7 illustrates portions of an example base station 28, and particularly portions of a base station coder 130 and base station node controller 70. Base station node controller 70 comprises base station scheduler 72, which in turn comprises low rate TBCC code selector 74 and low rate TBCC code table 132.

The base station coder 130 can, at any one time, serve plural channels or even plural wireless stations by engaging in separately encodable connections, frames, or sessions with the plural wireless stations over network interface 32. For example, base station 28 may transmit multiple signals, like one control channel and one data channel, to a first wireless station at the same time, and the TBCCs (or other error correction code) in these channels may be different. For example, the base station 28 may use different tail biting convolutional codes (or different error correction codes) to protect the data of different wireless stations, as different wireless stations may have different applications or requirements.

Therefore in one example embodiment it is not possible for multiple TBCCs (for multiple channels) to use the same shift registers but different output connections at the same time. Different channels may be encoded at different times (with reconfigurations between them), but this option is dependent upon the available processing time. In an example implementation, each wireless station 30 has one ASIC to do the baseband processing including channel encoder/decoder. The wireless station 30 may transmit multiple signals, like one control channel and one data channel, to base station 28.

In view of the foregoing, base station coder 130 is shown as comprising plural coder sections $134_1$ through $134_j$, each separate coder section 134 being assignable to or usable in conjunction with a different channel or wireless station or set of wireless stations. Each coder section can comprise a portion of a baseband application specific integrated circuit (ASIC) which hosts, in addition to coding, other baseband processing functionalities. The base station coder 130 of FIG. 7 with its plural coder sections $134_1$ through $134_j$ represents the base station error correction encoder 52 of FIG. 3B. Since base station coder 130 serves plural channels or wireless stations, data in a data stream involving a first channel or wireless station can be applied to a first coder section 134$_1$ as indicated by arrow 136$_1$, be processed by a selected shift register circuit 140 of coder section 134$_1$, and output from the selected shift register circuit 140 of coder section 134$_1$ as indicated by arrow 138$_1$. Similarly, data in a data stream involving a second channel or second wireless station can be applied to a second coder section 134$_2$ as indicated by arrow 136$_2$, be processed by a selected shift register circuit 140 of coder section 134$_2$, and output from the selected shift register circuit 140 of coder section 134$_2$ as indicated by arrow 138$_2$, and so forth for each of the plural coder sections 134.

Each of the plural coder sections 134 of base station coder 130 comprises plural shift register circuits 140 and a TBCC code activator 142. For example, coder section 134$_1$ is shown in FIG. 7 as comprising shift register circuits 140$_1$-140$_n$. As in similar manner with the wireless station coder 110 of FIG. 6, each of the plural optimum tail biting convolutional codes implemented by the respective shift register circuits 140$_1$-140$_n$ is of a different rate and is expressed by a set of polynomials listed in any of Table 2-Table 16. FIG. 7 shows by arrow 106 that the configuration of the respective shift register circuits 140$_1$-140$_n$ is based upon identification of different ones of the optimized low rate tail biting convolutional codes generated by optimized low rate tail biting convolutional code generator 40. For each coder section 134, the code activator 142 is configured to include one of the plural shift register circuits 140$_1$-140$_n$ in a processing stream for a respective data transmission over the channel. For each coder section 134, the code activator 142 includes an appropriate one of the plural shift register circuits 140$_1$-140$_n$ in the processing stream by operating AND gates so that an input signal to base station coder 130 is applied only to the one activated shift register circuit 140, and so that an output signal from the base station coder 130 is taken only from the activated shift register circuits 140.

Now that the example embodiment of base station 28 of FIG. 7 and the example embodiment of wireless station 30 of FIG. 6 have been described, an example operation scenario involving both now follows. Suppose for example that there are four possible tail biting convolutional codes that can be used between base station 28 and wireless station 30, with these four possible tail biting convolutional codes each having different rates.

To accommodate these TBCC having different rates, in wireless station coder 110 the coder section 120$_1$ is configured to implement a first TBCC, the coder section 120$_2$ is configured to implement the second example TBCC, a coder section 120$_3$ is configured to implement the third example TBCC; and a coder section 120$_4$ is configured to implement the fourth example TBCC. Similarly, in base station coder 130 an appropriate one of the coder sections 134 for the involved wireless station is configured to implement the four TBCCs of different rates. For example, in base station coder 130 the coder section 140$_1$ is configured to implement the first TBCC, the coder section 140$_2$ is configured to implement the second example TBCC, a coder section 140$_3$ is configured to implement the third example TBCC; and a coder section 140$_4$ is configured to implement the fourth example TBCC.

In the scenario under discussion, wireless station 30 typically measures the strength of the signal it receives from base station 28, for example the symbol energy to noise power spectral density ratio Es/N0. Then the measurement (e.g. Es/N0) will be further processed by the wireless station 30 to decide which TBCC the wireless station 30 thinks should be used between base station 28 and wireless station 30. If wireless station 30 gets a very strong measurement (Es/N0 is larger than a threshold, meaning that the channel quality is very good and the weakest code is good enough for error protection), then the TBCC with the higher rate (and thus the weaker code) is selected by TBCC code requestor 104 and is sent from the 104 of wireless station 30 to base station 28 through an appropriate message or channel, e.g., on the Channel Quality Indicator (CQI) channel. On the other hand, if wireless station 30 obtains a very weak measurement (Es/N0 is smaller than a threshold, meaning that the channel quality is very bad and the strongest code is needed for error protection), then the TBCC with the lower rate (and thus the stronger code) is selected by TBCC code requestor 104 of wireless station 30 is sent from wireless station 30 to base station 28 (e.g., through the CQI channel).

It will be appreciated that a message such as the CQI message may and does also include other suggestions in addition to TBCC preference, such as (for example) the modulation order (2 for QPSK, 4 for 16QAM, 6 for 64-QAM, etc). Moreover, the rate value carried from TBCC code requestor 104 of wireless station 30 to base station 28 in a message (such as the CQI message) is just a suggestion from the TBCC code requestor 104 to the base station 28 about which TBCC the TBCC code requestor 104 of the wireless station 30 thinks should be used.

Upon receipt of the suggestion from wireless station 30, and possibly in conjunction with CQI messages received from all wireless stations, the base station 28 makes its final decisions about which TBCC is to be used for each/which wireless station 30. The TBCC choice decided by the base station 28 may be different from the suggestion of the wireless station 30 as expressed in the CQI message. The TBCC code selector 74 of the base station 28 makes the decisions according to such factors as the available resources, the Quality of Service (QoS) requirements of different UEs, etc. The TBCC code selector 74 is able to make an intelligent decision regarding which particular TBCCs are possible at a particular wireless station in view of the fact that the base station scheduler 72 comprises low rate TBCC code table 132. The low rate TBCC code table 132 includes a listing of the wireless stations served by the base station 28, as well as an identification of the optimized low rate tail biting convolutional codes available at (implemented or implementable in the shift register circuit(s)) the respective wireless stations 30.

Upon making its TBCC selection for a particular wireless station, the TBCC code selector 74 directs the TBCC code activator 142 for the appropriate coder section 134 to activate one of the shift register circuits 140 which corresponds to the selected tail biting convolutional code for that wireless station 30. Further, the decision of which TBCC to be used for each wireless station 30 is sent from the base station 28 to the wireless station through an appropriate message, such as the Media Access Control (MAC) management message in the UL-Media Access Protocol (MAP) channel (in WiMAX system). Upon receipt of the TBCC decision, the wireless station controller 100 directs the code activator 122 to activate one of the shift register circuits 120 which corresponds to the selected low rate tail biting convolutional code for that wireless station 30.

Figure 8:
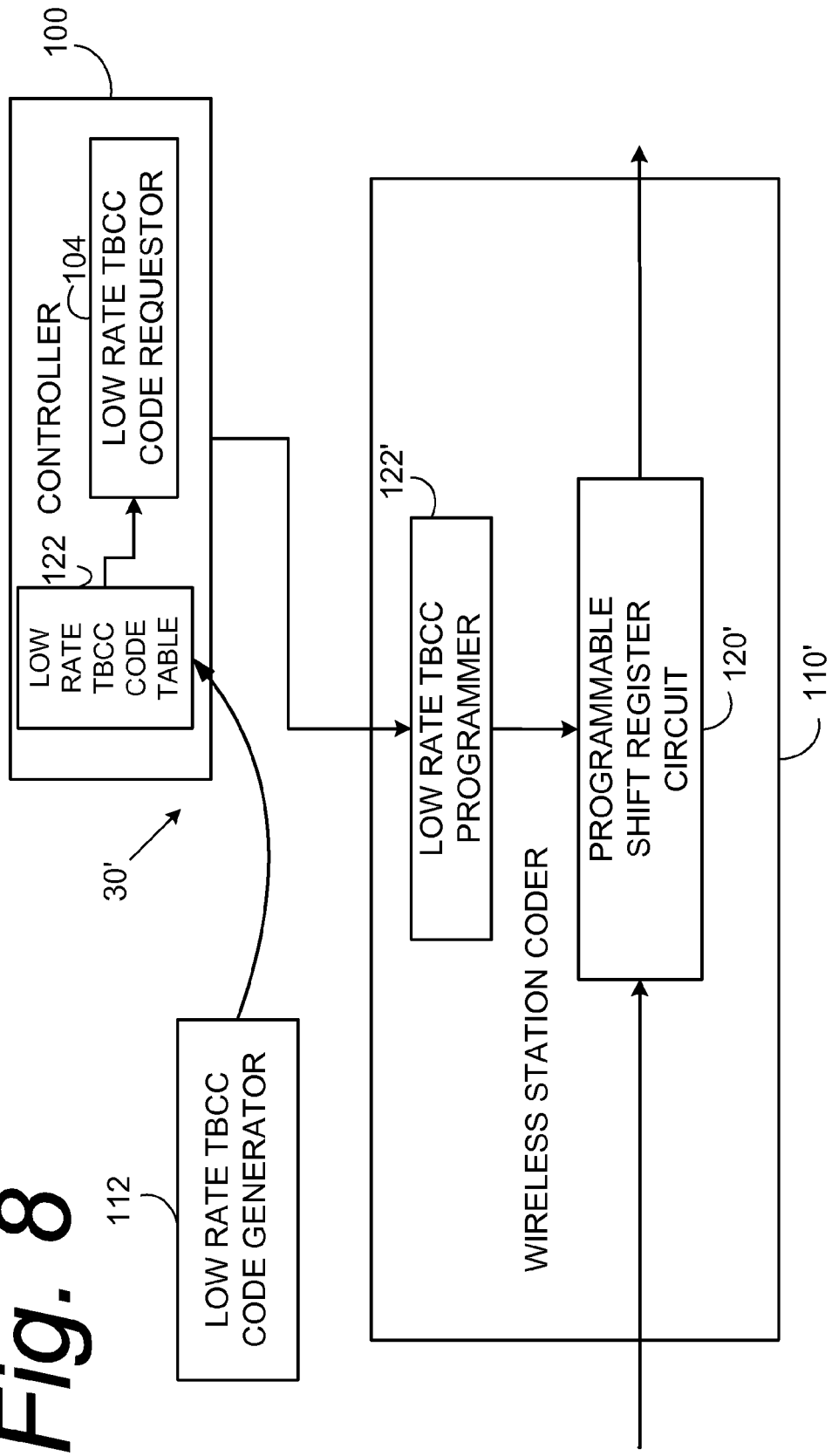
FIG. 8 is a diagrammatic view of a portion of a wireless station including a wireless station coder according to another example embodiment.
Figure 9:
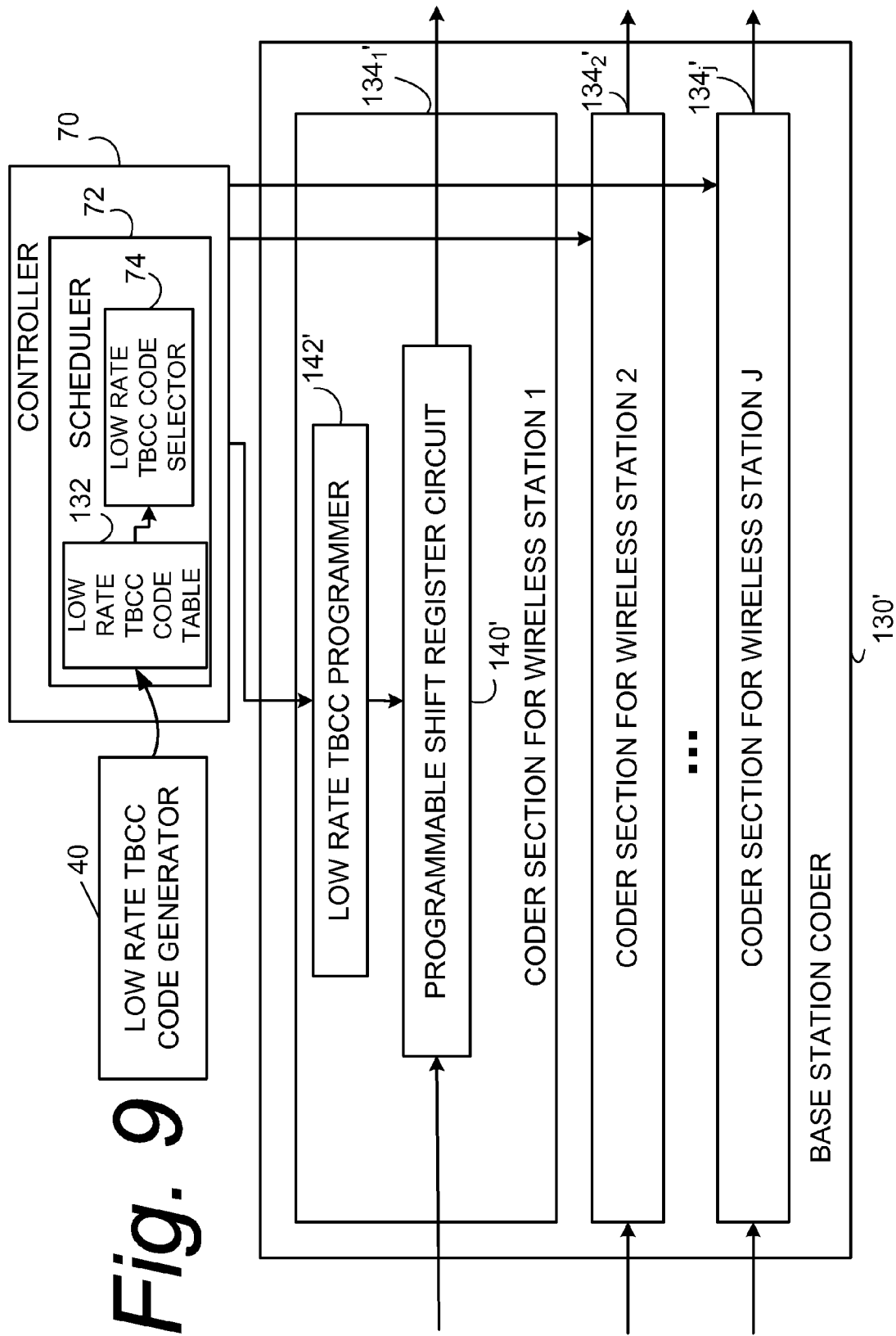
FIG. 9 is a diagrammatic view of a portion of a base station node including a base station coder according to another example embodiment.

Whereas the wireless station 30 of FIG. 6 and the base station 28 of FIG. 7 comprise coder sections which include plural dedicated shift register circuits (with each shift register circuit being configured in essentially dedicated manner to implement a specific optimized low rate tail biting convolutional code), the wireless station 30' partially shown in FIG. 8 and base station 28' partially shown in FIG. 9 comprise coder sections which include a programmable shift register circuit that is changed for implementing different optimized low rate tail biting convolutional codes at different times. In this regard, in wireless station 30' of FIG. 8 the wireless station coder 110' comprises programmable shift register circuit 120' and TBCC programmer 122'. Similarly, each coder section 134' of base station coder 130' of FIG. 9 comprises programmable shift register circuit 140' and TBCC programmer 142'.

The programmable shift register circuit 120' of the wireless station coder 110' of FIG. 8 and the programmable shift register circuit 140' of base station coder 130' of FIG. 9 can be reprogrammed essentially on the fly by the respective programmers 122' and 142' to implement a specific optimized low rate tail biting convolutional code which, at any given moment, the coder section needs to utilize. In this regard, the outputs of the method of FIG. 3B as generated by optimized low rate tail biting convolutional code generator 40 can be applied (e.g., stored) in low rate TBCC code table 112 and low rate TBCC code table 132, so that the respective controllers 100 and 70 can interact with the programmers 122' and 142' for implementing in the programmable shift register circuits the specific optimized low rate tail biting convolutional code which is necessary at any given time. For example, a limited set of possible optimized low rate tail biting convolutional codes generated by the method of FIG. 3B and/or FIG. 4 can be generated by optimized low rate tail biting convolutional code generator 40 and their generator polynomials stored in TBCC code table 112 of wireless station 30' and in TBCC code table 132 of base station 28', so that base station 28' and wireless station 30' have pre-knowledge of the possible optimized low rate tail biting convolutional codes to be used.

The configuration of output terminals of a shift register circuit for a low rate TBCC coder is understood by the person skilled in the art from the descriptions of FIG. 1 and FIG. 2, and programmable shift register circuits are understood with reference to, for example, U.S. Patent Publication 2008/0228951.

While the controllers and coders of both the base stations and wireless stations have been illustrated and described as being structurally distinct, it should be realized that functionalities may be shared. For example, the code tables and code requestor(s)/selector(s) mentioned herein can, instead of being separate from the coders, actually comprise ASICs or other circuitry that embody the shift resister circuit-hosting coders.

There are usually more than one control channels sent at the beginning of each frame, and frame control header (FCH) is one of them in WiMAX. Different control channels can send different messages for controlling different functionalities. The technology disclosed herein can be applied to channels whose payload sizes are not too big (less than about 40 bits), as TBCC are more efficient when payload size is small. So the technology disclosed herein can be applied to control channels and to the specific frame control headers, with there being essentially no difference in considerations or acts/steps performed.

In an example employment tail-biting convolutional codes (TBCCs) including the low rate tail-biting convolutional codes described herein are utilized for a secondary fast feedback channel (SFBCH). The secondary fast feedback channel (SFBCH) is used (in addition to a primary fast feedback channel) for uplink fast feedback from a wireless terminal (e.g., a mobile station) to a base station in accordance with proposals of IEEE 802.16 Broadband Wireless Access Working Group (http://ieee802.org/16). In an example employment described herein the tail-biting convolutional codes (TBCCs) including the low rate tail-biting convolutional codes described herein are utilized to encode a payload of the secondary fast feedback channel (SFBCH). The encoding can be performed (only) once for each payload, so that there is no need to divide a larger payload (a payload greater than or equal to thirteen bits) into two smaller payloads followed by two separate encodings. As is understood by those skilled in the art, the SFBCH is comprised of 3 distributed FMTs with two pilots allocated in each FMT.

Figure 10:
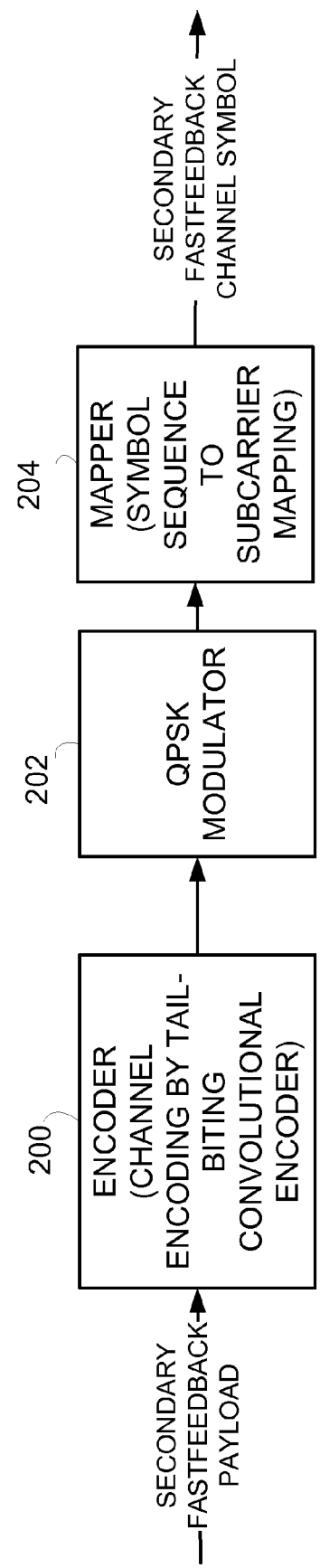
FIG. 10 is a schematic view of an example SFBCH symbol generation/information mapping procedure.

An example SFBCH symbol generation/information mapping procedure is shown in FIG. 10. First, the SFBCH payload information bits $a_0\ a_1\ a_2\ \ldots\ a_{L-1}$ are applied to encoder 200 where they are encoded to N bits $b_0\ b_1\ b_2\ \ldots\ b_{N-1}$ using tail-biting convolutional codes such as the low rate tail-biting convolutional codes described herein (including codes where N=60 in an example embodiment). The encoder 200 can be programmed or otherwise provided/loaded with the tail-biting convolutional codes such as the low rate tail-biting convolutional codes described herein in manners such as those described herein.

Figure 11:
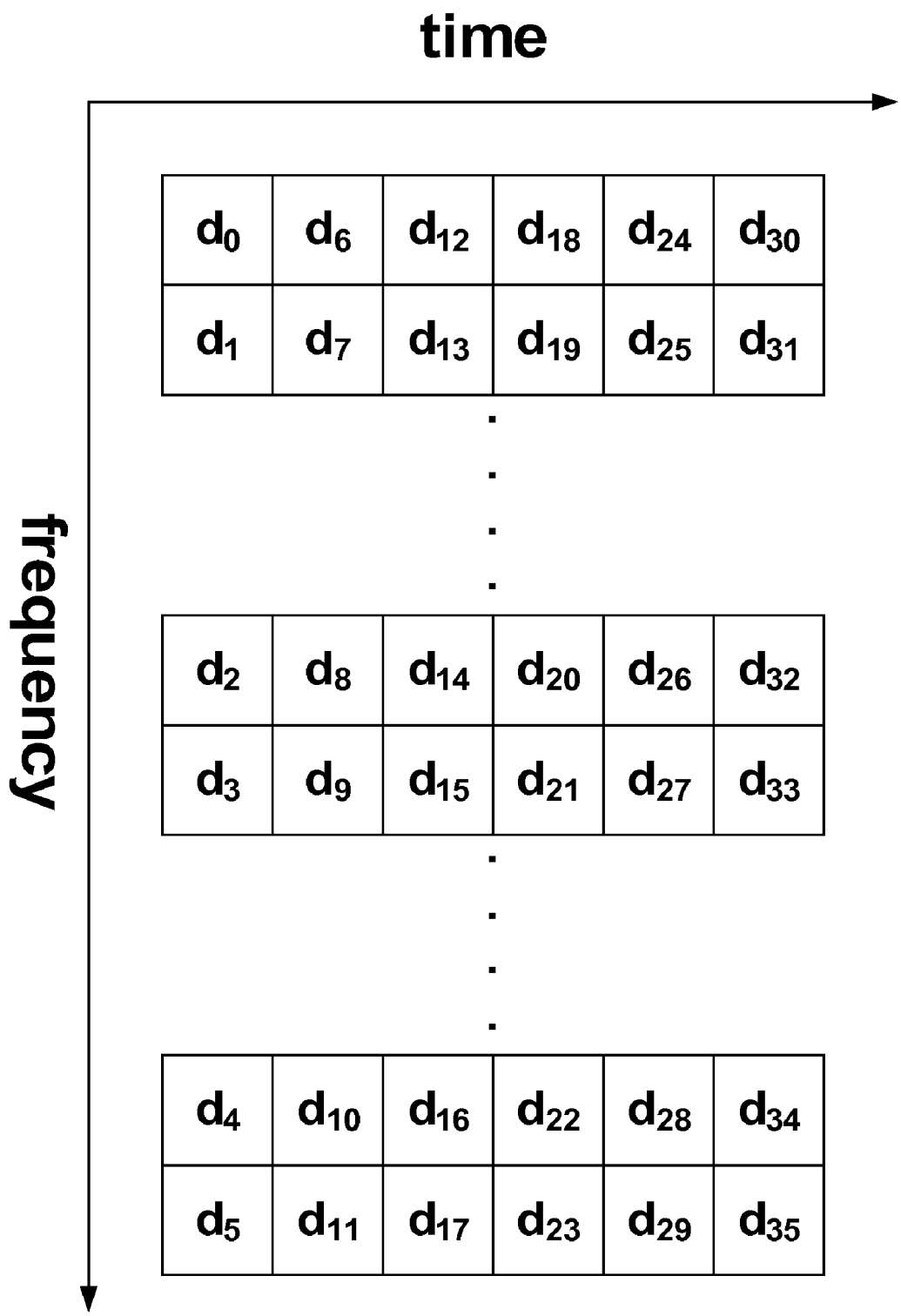
FIG. 11 is a diagrammatic view illustrating an example secondary fast feedback channel (SFBCH) comprising three distributed 2×6 uplink FMTs.

The coded sequence $b_0\ b_1\ b_2\ \ldots\ b_{N-1}$ output from encoder 200 is modulated by QPSK modulator 202 to $$\frac{N}{2} \text{ symbols } c_0 c_1 c_2 \ldots c_{\frac{N}{2}-1}$$

using QPSK. The modulated symbols $$c_0 c_1 c_2 \ldots c_{\frac{N}{2}-1}$$

and pilot sequence are combined to form the sequence $d_0\ d_1\ d_2\ \ldots\ d_{35}$ and then mapped by mapper 204 to the data subcarriers of the SFBCH FMTs as shown in FIG. 11. In FIG. 11, $d_0, d_8, d_{16}, d_{19}, d_{27}$ and $d_{35}$ correspond to pilot symbols.

Figure 12:
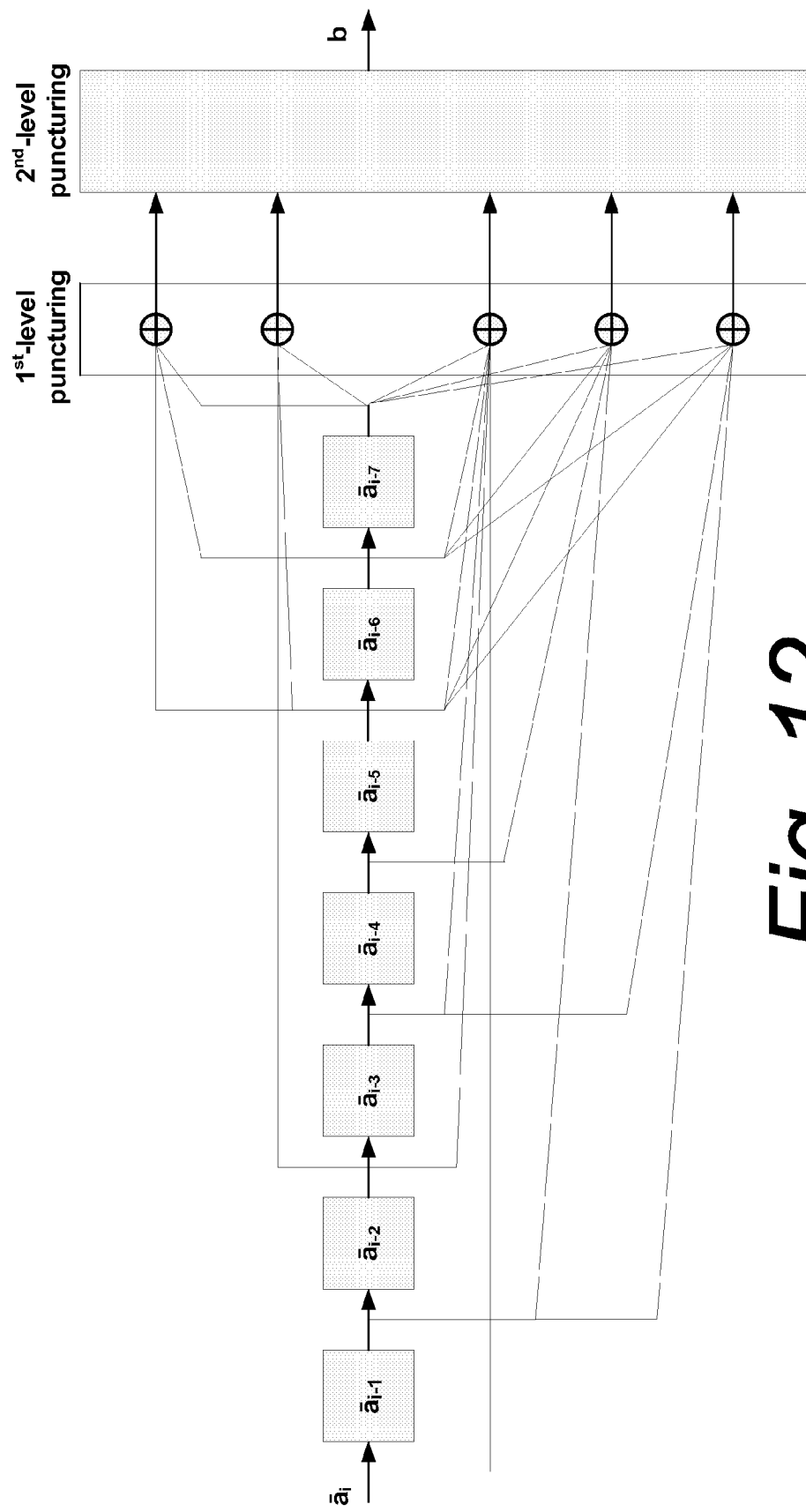
FIG. 12 is a schematic view of an example secondary fast feedback channel (SFBCH) TBCC encoder.

In an example embodiment and mode the L ($7 \times L \leq 24$) number of information bits in the SFBCH can be encoded using tail-biting convolutional code (TBCC) with codeword length N. For example, let the L number of information bits be denoted by $a_0\ a_1\ a_2\ \ldots\ a_{L-1}$ and the N bits codeword be denoted by $b_0, b_1, \ldots, b_{N-1}$. FIG. 12 shows an example encoder configure to perform tail-biting convolutional codes for encoding SFBCH with payload sizes 7 to 24 bits. For payload sizes 7 to 11 bits, zeros are inserted into the information bits input to the encoder, and the first-level puncturing and the second-level puncturing do not apply.

The set of generator polynomials for the mother TBCC is given in octal format by (16, 112, 556, 636, 656). For N=60, the information bits, $(a_0, a_1, \ldots, a_{L-1})$, in the SFBCH are encoded to 60 encoded bits, $(b_0, b_1, \ldots, b_{59})$. For $7 \leq L \leq 11$, 5 to 1 zeros, respectively, are inserted into the information bits to perform the expurgation operation. The resulting length-12 zero-padded information bits vectors are encoded by the rate ⅕ mother TBCC by the encoder of FIG. 12 to generate 60 encoded bits. For $7 \leq L \leq 11$, the input bits vectors are given by:

$(\bar{a}_0, \ldots, \bar{a}_{11}) = (a_0, a_1, a_2, 0, a_3, 0, a_4, 0, a_5, 0, a_6, 0)$ for L=7,
$(\bar{a}_0, \ldots, \bar{a}_{11}) = (a_0, a_1, a_2, a_3, a_4, 0, a_5, 0, a_6, 0, a_7, 0)$ for L=8,
$(\bar{a}_0, \ldots, \bar{a}_{11}) = (a_0, a_1, a_2, a_3, a_4, a_5, 0, a_6, a_7, 0, a_8, 0)$ for L=9,
$(\bar{a}_0, \ldots, \bar{a}_{11}) = (a_0, a_1, a_2, a_3, a_4, a_5, 0, a_6, a_7, a_8, a_9, 0)$ for L=10,
$(a_0, a_{ii}) = (a_0, a_1, a_2, a_3, a_4, a_5, a_6, a_7, a_8, a_9, a_{10}, 0)$ for L=11.

For $12 \leq L \leq 24$, the input bits vector, $(\bar{a}_0, \bar{a}_1, \ldots, \bar{a}_{L-1}) = (a_0, a_1, \ldots, a_{L-1})$, are encoded by the rate ⅕ mother TBCC, the rate ¼ TBCC, or the rate ⅓ TBCC according to the first-level puncturing given in Table 17. The rate ¼ TBCC and rate ⅓ TBCC are punctured from the rate ⅕ mother TBCC by using only 3 and 4, respectively, generator polynomials from the set (16, 112, 556, 636, 656). The encoded bits from the TBCC encoders are optionally punctured by the second-level puncturing given in Table 17. For the encoder of FIG. 12, and taking (60,21) (L=21) TBCC as an example, the 21 information bits are first encoded by the TBCC with the set of generator polynomials (112, 556, 636), and 63 encoded bits are generated. The $(3 \cdot m)^{th}$, $(3 \cdot m+1)^{th}$, and $(3 \cdot m+2)^{th}$ encoded bits are the encoder outputs from generator polynomials 112, 556, and 636, respectively, for the $m^{th}$ input information bit, where m=0, 1, . . . , 20. During the second-level puncturing, the $0^{th}$, $27^{th}$, and $54^{th}$ encoded bits are further punctured and the remaining 60 encoded bits exit the encoder.

Table 17 shows puncturing patterns for generating (60 μL) TBCC from the rate ⅕ mother TBCC with the set of generator polynomials (16, 112, 556, 636, 656). In the first-level puncturing, TBCC with all or part of the generator polynomials (in the second column) from the mother code set (16, 112, 556, 636, 656) are used to encode payloads from 12 bits to 24 bits. In the second-level puncturing, some of the encoded bits from the TBCC encoders (after the first-level puncturing) are optionally punctured according to the bit positions listed in the third column.

Puncturing and expurgation for codes such as convolutional codes and turbo convolutional codes is described in, e.g., one or more of U.S. Provisional Patent Application 61/151,610, ENTITLED ENCODING AND DECODING METHODS FOR EXPURGATED CONVOLUTIONAL CODES AND CONVOLUTIONAL TURBO CODES; and U.S. Provisional Patent Application 61/149,113, filed Feb. 2, 2009, ENTITLED ENCODING AND DECODING METHODS FOR EXPURGATED CONVOLUTIONAL CODES, both of which are incorporated herein by reference in their entireties.

Figure 13:
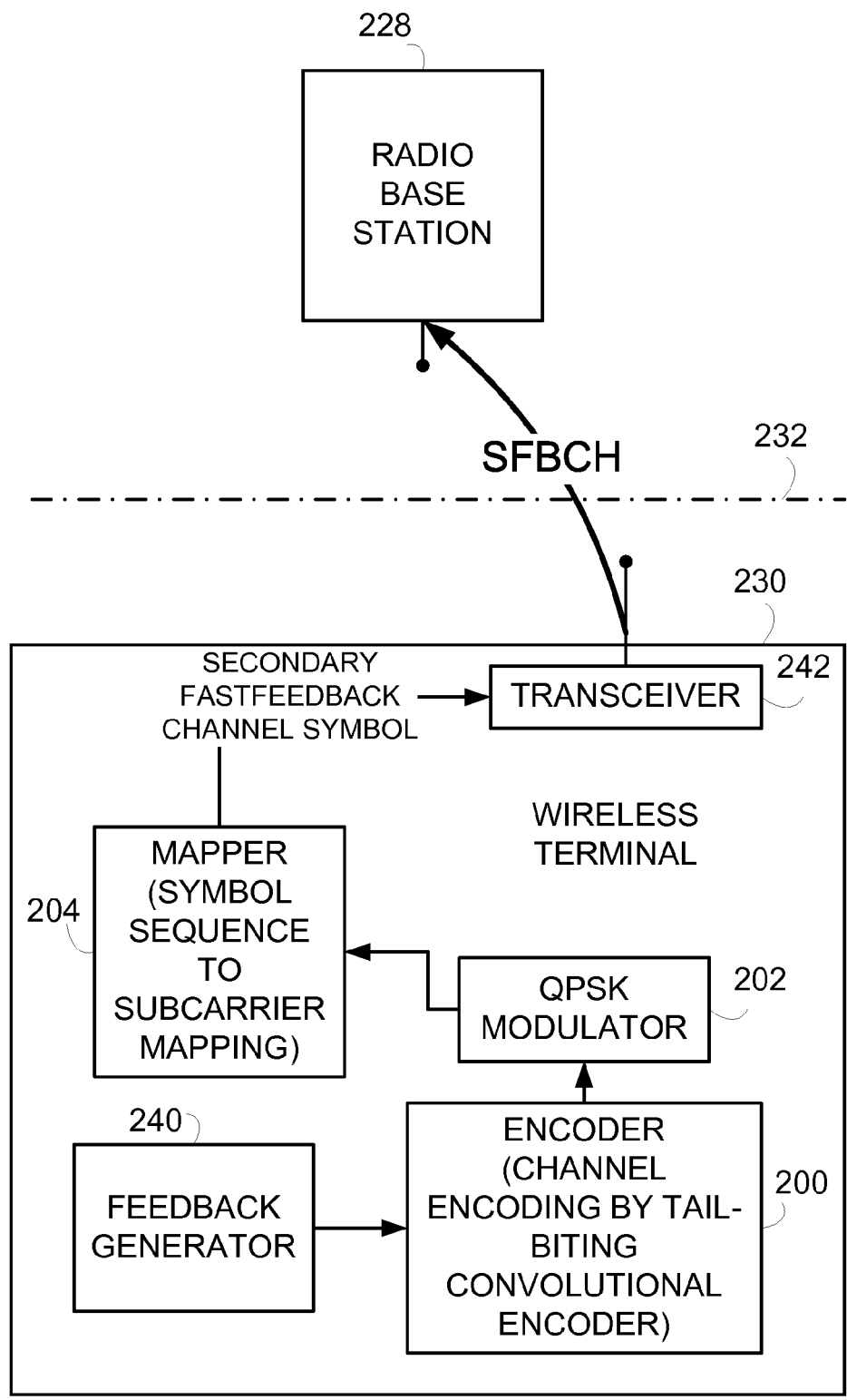
FIG. 13 is a schematic view of portions of a radio access network which provides an example environment for employment of low rate tail-biting convolutional codes (TBCC) for encoding payload of a secondary fast feedback channel (SFBCH).

FIG. 13 shows portions of a radio access network which provides an example environment for employment of the low rate tail-biting convolutional codes (TBCC) described herein for encoding payload of a secondary fast feedback channel (SFBCH). The network of FIG. 13 comprises radio base station 228 and wireless terminal (e.g. mobile station or user equipment unit (UE)) 230 which communicates over air or radio interface 232 with radio base station 228. In an example embodiment the wireless terminal 230 comprises functionalities and units previously described in conjunction with FIG. 10, including encoder 200, QPSK modulator 202, and mapper 204. FIG. 13 shows the encoder 200 as receiving the secondary fastfeedback payload from feedback generator 240, and the secondary fastfeedback channel symbol(s) as being applied from mapper 204 to transceiver 242. FIG. 13 further illustrates transmission of the secondary fast feedback channel (SFBCH) over air interface 232 between antenna element(s) of wireless terminal 230 and radio base station 228.

The units and functionalities of the wireless terminal 230 of FIG. 13 including but not limited to encoder 200, QPSK modulator 202, and mapper 204 can, in an example embodiment, be implemented using a computer, processor, or controller as those terms are herein expansively defined. Moreover, it will be appreciated that wireless terminal 230 comprises other units and functionalities that are understood by the person skilled in the art but not necessarily germane to the technology disclosed herein.

REFERENCES

All of which are Incorporated by Reference Herein

[1] H. H. Ma and J. K. Wolf, "On tail biting convolutional codes," IEEE Trans. Commun., vol. 34, pp. 104-111, February 1986.

[2] K. J. Larsen, "Short convolutional codes with maximal free distance for rate ½, ⅓, and ¼," IEEE Trans. Inform. Theory, vol. 19, pp. 371-372, May 1973.

[3] J.-J. Chang, D.-J. Hwang and M.-C. Lin, "Some extended results on the search for good convolutional codes," IEEE Trans. Inform. Theory, vol. 43, pp. 1682-1697, September 1997.

[4] P. Frenger, P. Orten and T. Ottosson, "Convolutional codes with optimum distance spectrum," IEEE Commun. Letters, vol. 3, pp. 317-319, November 1999.

[5] P. Ståhl, J. B. Anderson and R. Johannesson, "Optimal and near-optimal encoders for short and moderate-length tail-biting trellises," IEEE Trans. Inform. Theory, vol. 45, pp. 2562-2571, November 1999.

[6] P. Ståhl, J. B. Anderson and R. Johannesson, "A note on tailbiting codes and their feedback encoders," IEEE Trans. Inform. Theory, vol. 48, pp. 529-534, February 2002.

[7] Y. Ould-Cheikh-Mouhamedou, S. Crozier and P. Kabal, "Distance measurement method for double binary turbo codes and a new interleaver design for DVB-RCS," IEEE Globecom 04, pp. 172-178.

[8] R. Johannesson and K. S. Zigangirov, Fundamentals of convolutional coding. Piscataway, N.J.: IEEE Press, 1999.

[9] S. Lin and D. J. Costello, Jr, Error control coding. Upper Saddle River, N.J.: Pearson, 2004.

[10] 3GPP TS 45.003, "$3^{rd}$ Generation Partnership Project; Technical Specification Group GSM/EDGE Radio Access Network; Channel Coding (Release 7)", V7.1.0, 2007-02.

[11] IEEE Std 802.16-2004, "IEEE Standard for Local and Metropolitan Area Networks—Part 16: Air Interface for Fixed Broadband Wireless Access Systems", October, 2004.

[12] IEEE Std P802.16e-2005, "IEEE Standard for Local and Metropolitan Area Networks—Part 16: Air Interface for Fixed and Mobile Broadband Wireless Access Systems", February, 2006.

[13] 3GPP TS 36.212, "$3^{rd}$ Generation Partnership Project; Technical Specification Group Radio Access Network; Evolved Universal Terrestrial Radio Access (E-UTRA); Multiplexing and channel Coding (Release 8)", V8.0.0, 2007-09.

[14] M. Mzyece and J. Dunlop, "Performance evaluation of suboptimal decoding schemes for tail biting convolutional codes in EDGE headers," IEEE Electronics Letters, vol. 39, no. 17, pp. 1280-1281, August 2003.

[15] R. V. Cox and C.-E. W. Sundberg, "An efficient adaptive circular viterbi algorithm for decoding generalized tailbiting convolutional codes," IEEE Trans. Veh. Technol., vol. 43, pp. 57-68, February 1994.

[17] IEEE C80216m-09_0506r2, "Tail-Biting Convolutional Codes with Expurgation and Rate-Compatible Puncturing for the Secondary Fast Feedback Channel".

[18] IEEE C80216m-09_0910r1, "Tail-Biting Convolutional Codes for the Secondary Fast Feedback Channel: Fading Channel Results".

[19] IEEE 802.16m-09/0010r1a, "Part 16: Air Interface for Fixed and Mobile Broadband Wireless Access Systems," March. 2009.

TABLE 1

SUMMARY OF TABLES FOR THE ODS FEEDFORWARD LOW RATE TAIL-BITING CONVOLUTIONAL CODES (TBCC)

| Constraint length v | Rate 1/5 | Rate 1/6 | Rate 1/7 | Rate 1/8 | Rate 1/9 |
|---|---|---|---|---|---|
| 3 | Table 2 | Table 7 | Table 10 | Table 12 | Table 14 |
| 4 | Table 3 | Table 8 | Table 11 | Table 13 | Table 15 |
| 5 | Table 4 | Table 9 | | | Table 16 |
| 6 | Table 5 | | | | |
| 7 | Table 6 | | | | |

TABLE 2

NEW ODS FEEDFORWARD LOW RATE TBCC WITH RATE 1/5 AND CONSTRAINT LENGTH V = 3

| K | G | WS | # permutation equivalent codes | Note |
|---|---|---|---|---|
| 4 | (4, 4, 14, 34, 54) | (10, 12, 24) | 376 | ODS-FER/BER |
| 5 | (4, 4, 34, 54, 74) | (12, 25, 55) | 40 | ODS-FER/BER |
| 6 | (4, 34, 54, 64, 74) | (12, 2, 6) | 8 | ODS-FER |
|   | (4, 14, 34, 54, 64) | (12, 6, 6) | 24 | ODS-BER |
| 7 | (14, 34, 54, 64, 74) | (14, 7, 14) | 6 | ODS-FER/BER |
| 8 | (34, 54, 54, 64, 74) | (16, 82, 320) | 4 | ODS-FER/BER |
| 9 | (44, 54, 64, 74, 74) | (16, 36, 108) | 1 | ODS-FER/BER |
| 10 | (44, 54, 64, 74, 74) | (16, 20, 30) | 1 | ODS-FER/BER |
| 11 | (54, 54, 64, 74, 74) | (16, 11, 22) | 2 | ODS-FER/BER |
| 12 | (54, 54, 64, 74, 74) | (16, 12, 24) | 2 | ODS-FER/BER |
| 13 | (54, 54, 64, 74, 74) | (16, 13, 26) | 2 | ODS-FER/BER |
| 14 | (54, 54, 64, 74, 74) | (16, 14, 28) | 2 | ODS-FER/BER |
| 15 | (54, 54, 64, 74, 74) | (16, 15, 30) | 2 | ODS-FER/BER |
| 16 | (54, 54, 64, 74, 74) | (16, 16, 32) | 2 | ODS-FER/BER |
| 17 | (54, 54, 64, 74, 74) | (16, 17, 34) | 2 | ODS-FER/BER |
| 18 | (54, 54, 64, 74, 74) | (16, 18, 36) | 2 | ODS-FER/BER |
| 19 | (54, 54, 64, 74, 74) | (16, 19, 38) | 2 | ODS-FER/BER |
| 20 | (54, 54, 64, 74, 74) | (16, 20, 40) | 2 | ODS-FER/BER |
| 21 | (54, 54, 64, 74, 74) | (16, 21, 42) | 2 | ODS-FER/BER |
| 22 | (54, 54, 64, 74, 74) | (16, 22, 44) | 2 | ODS-FER/BER |
| 23 | (54, 54, 64, 74, 74) | (16, 23, 46) | 2 | ODS-FER/BER |
| 24 | (54, 54, 64, 74, 74) | (16, 24, 48) | 2 | ODS-FER/BER |

TABLE 3

NEW ODS FEEDFORWARD LOW RATE TBCC WITH RATE 1/5 AND CONSTRAINT LENGTH V = 4

| K | G | WS | # permutation equivalent codes | Note |
|---|---|---|---|---|
| 4 | (2, 2, 6, 16, 54) | (10, 12, 24) | 9580 | ODS-FER/BER |
| 5 | (2, 2, 16, 26, 56) | (12, 25, 55) | 1795 | ODS-FER/BER |
| 6 | (2, 16, 26, 32, 76) | (14, 15, 42) | 135 | ODS-FER/BER |
| 7 | (22, 26, 46, 52, 76) | (16, 84, 315) | 24 | ODS-FER/BER |
| 8 | (6, 26, 56, 62, 76) | (16, 8, 16) | 16 | ODS-FER/BER |
| 9 | (52, 56, 66, 72, 76) | (18, 58, 261) | 1 | ODS-FER |
|   | (46, 56, 62, 66, 72) | (18, 58, 216) | 1 | ODS-BER |
| 10 | (36, 46, 52, 66, 72) | (18, 10, 10) | 4 | ODS-FER/BER |
| 11 | (46, 52, 56, 72, 76) | (19, 11, 11) | 2 | ODS-FER/BER |
| 12 | (52, 56, 66, 72, 76) | (20, 72, 216) | 1 | ODS-FER/BER |
| 13 | (52, 56, 66, 72, 76) | (20, 52, 104) | 1 | ODS-FER/BER |
| 14 | (52, 56, 66, 72, 76) | (20, 56, 112) | 1 | ODS-FER/BER |
| 15 | (52, 56, 66, 72, 76) | (20, 60, 120) | 1 | ODS-FER/BER |
| 16 | (52, 56, 66, 72, 76) | (20, 64, 128) | 1 | ODS-FER/BER |
| 17 | (52, 56, 66, 72, 76) | (20, 68, 136) | 1 | ODS-FER/BER |
| 18 | (52, 56, 66, 72, 76) | (20, 72, 144) | 1 | ODS-FER/BER |
| 19 | (52, 56, 66, 72, 76) | (20, 76, 152) | 1 | ODS-FER/BER |
| 20 | (52, 56, 66, 72, 76) | (20, 80, 160) | 1 | ODS-FER/BER |
| 21 | (52, 56, 66, 72, 76) | (20, 84, 168) | 1 | ODS-FER/BER |
| 22 | (52, 56, 66, 72, 76) | (20, 88, 176) | 1 | ODS-FER/BER |
| 23 | (52, 56, 66, 72, 76) | (20, 92, 184) | 1 | ODS-FER/BER |
| 24 | (52, 56, 66, 72, 76) | (20, 96, 192) | 1 | ODS-FER/BER |

TABLE 4

NEW ODS FEEDFORWARD LOW RATE TBCC WITH RATE 1/5 AND CONSTRAINT LENGTH V = 5

| K | G | WS | # permutation equivalent codes | Note |
|---|---|---|---|---|
| 5 | (1, 1, 7, 13, 56) | (12, 25, 55) | 51290 | ODS-FER/BER |
| 6 | (1, 7, 13, 15, 57) | (14, 15, 42) | 7506 | ODS-FER/BER |
| 7 | (1, 3, 25, 37, 67) | (16, 84, 266) | 1440 | ODS-FER/BER |
| 8 | (11, 23, 47, 73, 77) | (16, 5, 16) | 48 | ODS-FER/BER |
| 9 | (17, 45, 47, 67, 75) | (18, 27, 126) | 6 | ODS-FER |
|   | (5, 13, 53, 57, 67) | (18, 27, 126) | 24 | ODS-BER |
| 10 | (25, 33, 45, 67, 75) | (20, 127, 630) | 8 | ODS-FER |
|   | (11, 27, 35, 67, 73) | (20, 141, 620) | 12 | ODS-BER |

TABLE 4-continued

NEW ODS FEEDFORWARD LOW RATE TBCC WITH RATE 1/5 AND CONSTRAINT LENGTH V = 5

| K | G | WS | # permutation equivalent codes | Note |
|---|---|---|---|---|
| 11 | (27, 51, 53, 67, 73) | (21, 88, 374) | 4 | ODS-FER/BER |
| 12 | (37, 47, 55, 57, 65) | (22, 108, 504) | 4 | ODS-FER/BER |
| 13 | (47, 55, 57, 73, 75) | (22, 13, 26) | 2 | ODS-FER/BER |
| 14 | (47, 57, 65, 73, 75) | (22, 14, 28) | 2 | ODS-FER/BER |
| 15 | (47, 55, 57, 67, 75) | (22, 15, 30) | 2 | ODS-FER/BER |
| 16 | (47, 55, 57, 67, 75) | (22, 16, 32) | 2 | ODS-FER/BER |
| 17 | (47, 55, 57, 67, 75) | (22, 17, 34) | 2 | ODS-FER/BER |
| 18 | (47, 55, 57, 67, 75) | (22, 18, 36) | 2 | ODS-FER/BER |

TABLE 5

NEW ODS FEEDFORWARD LOW RATE TBCC WITH RATE 1/5 AND CONSTRAINT LENGTH V = 6

| K | G | WS | # permutation equivalent codes | Note |
|---|---|---|---|---|
| 12 | (54, 254, 434, 724, 774) | (22, 24, 48) | 15 | ODS-FER/BER |

TABLE 6

NEW ODS FEEDFORWARD LOW RATE TBCC WITH RATE 1/5 AND CONSTRAINT LENGTH V = 7

| K | G | WS | # permutation equivalent codes | Note |
|---|---|---|---|---|
| 12 | (16, 112, 556, 636, 656) | (24, 659, 4044) | 4 | ODS-FER |

TABLE 7

NEW ODS FEEDFORWARD LOW RATE TBCC WITH RATE 1/6 AND CONSTRAINT LENGTH V = 5

| K | G | WS | # permutation equivalent codes | Note |
|---|---|---|---|---|
| 7 | (1, 3, 13, 25, 37, 67) | (19, 35, 105) | 11520 | ODS-FER/BER |
| 8 | (1, 23, 35, 45, 57, 77) | (22, 144, 528) | 144 | ODS-FER/BER |
| 9 | (5, 23, 27, 37, 53, 57) | (23, 81, 351) | 64 | ODS-FER |
|   | (13, 27, 33, 43, 57, 63) | (23, 81, 333) | 48 | ODS-BER |
| 10 | (27, 47, 55, 57, 61, 73) | (24, 20, 80) | 4 | ODS-FER/BER |
| 11 | (43, 55, 57, 67, 71, 75) | (26, 99, 462) | 2 | ODS-FER/BER |

TABLE 8

NEW ODS FEEDFORWARD LOW RATE TBCC WITH RATE 1/6 AND CONSTRAINT LENGTH V = 3

| K | G | WS | # permutation equivalent codes | Note |
|---|---|---|---|---|
| 4 | (4, 4, 14, 24, 34, 54) | (12, 10, 20) | 776 | ODS-FER/BER |
| 5 | (4, 14, 24, 34, 54, 74) | (15, 16, 40) | 144 | ODS-FER/BER |
| 6 | (14, 34, 44, 54, 64, 74) | (16, 9, 36) | 6 | ODS-FER/BER |
| 7 | (14, 24, 34, 54, 64, 74) | (17, 7, 7) | 12 | ODS-FER/BER |
| 8 | (34, 44, 54, 54, 64, 74) | (18, 8, 8) | 4 | ODS-FER/BER |
| 9 | (44, 54, 54, 64, 74, 74) | (19, 18, 54) | 2 | ODS-FER/BER |
| 10 | (44, 54, 54, 64, 74, 74) | (19, 10, 10) | 2 | ODS-FER/BER |
| 11 | (54, 54, 64, 64, 74, 74) | (20, 44, 143) | 1 | ODS-FER/BER |
| 12 | (54, 54, 64, 64, 74, 74) | (20, 36, 72) | 1 | ODS-FER/BER |
| 13 | (54, 54, 64, 64, 74, 74) | (20, 39, 78) | 1 | ODS-FER/BER |
| 14 | (54, 54, 64, 64, 74, 74) | (20, 42, 84) | 1 | ODS-FER/BER |
| 15 | (54, 54, 64, 64, 74, 74) | (20, 45, 90) | 1 | ODS-FER/BER |
| 16 | (54, 54, 64, 64, 74, 74) | (20, 48, 96) | 1 | ODS-FER/BER |
| 17 | (54, 54, 64, 64, 74, 74) | (20, 51, 102) | 1 | ODS-FER/BER |
| 18 | (54, 54, 64, 64, 74, 74) | (20, 54, 108) | 1 | ODS-FER/BER |

TABLE 9

NEW ODS FEEDFORWARD LOW RATE TBCC WITH RATE 1/6 AND CONSTRAINT LENGTH V = 4

| K | G | WS | # permutation equivalent codes | Note |
|---|---|---|---|---|
| 4 | (2, 2, 6, 12, 16, 54) | (12, 10, 20) | 39884 | ODS-FER/BER |
| 5 | (2, 6, 12, 16, 26, 56) | (15, 16, 40) | 15337 | ODS-FER/BER |
| 6 | (2, 6, 16, 26, 32, 76) | (16, 6, 12) | 540 | ODS-FER/BER |
| 7 | (22, 26, 32, 46, 52, 76) | (19, 42, 154) | 24 | ODS-FER/BER |
| 8 | (26, 36, 46, 56, 62, 66) | (20, 18, 72) | 8 | ODS-FER |
|   | (16, 26, 32, 36, 56, 72) | (20, 20, 64) | 24 | ODS-BER |
| 9 | (26, 52, 56, 66, 72, 76) | (23, 90, 360) | 4 | ODS-FER/BER |
| 10 | (46, 52, 56, 66, 72, 76) | (23, 10, 10) | 2 | ODS-FER/BER |
| 11 | (46, 52, 56, 66, 72, 76) | (23, 11, 11) | 2 | ODS-FER/BER |
| 12 | (52, 56, 56, 66, 72, 76) | (24, 85, 288) | 2 | ODS-FER/BER |
| 13 | (52, 56, 56, 66, 72, 76) | (24, 52, 104) | 2 | ODS-FER/BER |
| 14 | (52, 56, 56, 66, 72, 76) | (24, 56, 112) | 2 | ODS-FER/BER |
| 15 | (52, 56, 56, 66, 72, 76) | (24, 60, 120) | 2 | ODS-FER/BER |
| 16 | (52, 56, 56, 66, 72, 76) | (24, 64, 128) | 2 | ODS-FER/BER |
| 17 | (52, 56, 56, 66, 72, 76) | (24, 68, 136) | 2 | ODS-FER/BER |

TABLE 9-continued

NEW ODS FEEDFORWARD LOW RATE TBCC WITH RATE 1/6 AND CONSTRAINT LENGTH V = 4

| K | G | WS | # permutation equivalent codes | Note |
|---|---|---|---|---|
| 18 | (52, 56, 56, 66, 72, 76) | (24, 72, 144) | 2 | ODS-FER/BER |

TABLE 10

NEW ODS FEEDFORWARD LOW RATE TBCC WITH RATE 1/7 AND CONSTRAINT LENGTH V = 3

| K | G | WS | # permutation equivalent codes | Note |
|---|---|---|---|---|
| 4 | (4, 4, 14, 14, 24, 34, 54) | (14, 8, 16) | 1964 | ODS-FER/BER |
| 5 | (4, 4, 14, 24, 34, 54, 74) | (16, 5, 5) | 360 | ODS-FER/BER |
| 6 | (14, 24, 34, 44, 54, 64, 74) | (18, 1, 6) | 12 | ODS-FER |
|   | (4, 14, 34, 44, 54, 64, 74) | (18, 6, 6) | 24 | ODS-BER |
| 7 | (14, 24, 34, 54, 64, 74, 74) | (20, 7, 14) | 12 | ODS-FER/BER |
| 8 | (34, 44, 54, 54, 64, 64, 74) | (21, 8, 8) | 2 | ODS-FER |
|   | (34, 34, 44, 54, 54, 64, 74) | (21, 8, 8) | 6 | ODS-BER |
| 9 | (34, 44, 54, 54, 64, 74, 74) | (22, 18, 27) | 4 | ODS-FER/BER |
| 10 | (44, 54, 54, 64, 64, 74, 74) | (22, 10, 10) | 1 | ODS-FER/BER |
| 11 | (54, 54, 54, 64, 64, 74, 74) | (23, 33, 121) | 2 | ODS-FER/BER |
| 12 | (54, 54, 54, 64, 64, 74, 74) | (23, 24, 48) | 2 | ODS-FER/BER |
| 13 | (54, 54, 54, 64, 64, 74, 74) | (23, 26, 52) | 2 | ODS-FER/BER |
| 14 | (54, 54, 54, 64, 64, 74, 74) | (23, 28, 56) | 2 | ODS-FER/BER |
| 15 | (54, 54, 54, 64, 64, 74, 74) | (23, 30, 60) | 2 | ODS-FER/BER |
| 16 | (54, 54, 54, 64, 64, 74, 74) | (23, 32, 64) | 2 | ODS-FER/BER |
| 17 | (54, 54, 54, 64, 64, 74, 74) | (23, 34, 68) | 2 | ODS-FER/BER |
| 18 | (54, 54, 54, 64, 64, 74, 74) | (23, 36, 72) | 2 | ODS-FER/BER |

TABLE 11

NEW ODS FEEDFORWARD LOW RATE TBCC WITH RATE 1/7 AND CONSTRAINT LENGTH V = 4

| K | G | WS | # permutation equivalent codes | Note |
|---|---|---|---|---|
| 4 | (2, 2, 6, 6, 12, 16, 54) | (14, 8, 16) | 182642 | ODS-FER/BER |
| 5 | (2, 2, 6, 12, 16, 26, 56) | (16, 5, 5) | 46155 | ODS-FER/BER |
| 6 | (2, 6, 12, 26, 32, 56, 76) | (20, 33, 96) | 2160 | ODS-FER/BER |
| 7 | (2, 16, 26, 32, 46, 66, 76) | (22, 35, 105) | 120 | ODS-FER/BER |
| 8 | (16, 26, 36, 46, 52, 56, 76) | (24, 20, 64) | 24 | ODS-FER/BER |
| 9 | (36, 46, 52, 56, 66, 72, 76) | (26, 18, 72) | 4 | ODS-FER/BER |
| 10 | (46, 52, 56, 66, 72, 72, 76) | (27, 20, 60) | 2 | ODS-FER/BER |
| 11 | (46, 52, 56, 66, 72, 72, 76) | (27, 11, 11) | 2 | ODS-FER/BER |
| 12 | (46, 52, 56, 66, 72, 72, 76) | (27, 12, 12) | 2 | ODS-FER/BER |
| 13 | (52, 52, 56, 66, 66, 76, 76) | (28, 52, 104) | 2 | ODS-FER/BER |
| 14 | (52, 52, 56, 66, 66, 76, 76) | (28, 56, 112) | 2 | ODS-FER/BER |
| 15 | (52, 56, 56, 66, 72, 72, 76) | (28, 60, 120) | 1 | ODS-FER/BER |
| 16 | (52, 56, 56, 66, 72, 72, 76) | (28, 64, 128) | 1 | ODS-FER/BER |
| 17 | (52, 56, 56, 66, 72, 72, 76) | (28, 68, 136) | 1 | ODS-FER/BER |
| 18 | (52, 56, 56, 66, 72, 72, 76) | (28, 72, 144) | 1 | ODS-FER/BER |

TABLE 12

NEW ODS FEEDFORWARD LOW RATE TBCC WITH RATE 1/8 AND CONSTRAINT LENGTH V = 3

| K | G | WS | # permutation equivalent codes | Note |
|---|---|---|---|---|
| 4 | (4, 4, 14, 14, 24, 34, 34, 74) | (16, 7, 16) | 2000 | ODS-FER/BER |
| 5 | (4, 4, 14, 24, 34, 54, 74, 74) | (20, 26, 60) | 360 | ODS-FER/BER |
| 6 | (4, 14, 34, 44, 54, 64, 74, 74) | (22, 30, 78) | 24 | ODS-FER/BER |
| 7 | (14, 24, 34, 54, 54, 64, 74, 74) | (24, 28, 84) | 24 | ODS-FER/BER |
| 8 | (34, 44, 54, 54, 64, 64, 74, 74) | (24, 4, 16) | 2 | ODS-FER |
|   | (24, 34, 44, 54, 54, 64, 74, 74) | (24, 10, 16) | 8 | ODS-BER |
| 9 | (34, 44, 54, 54, 64, 64, 74, 74) | (25, 9, 9) | 2 | ODS-FER |
|   | (24, 34, 54, 54, 64, 64, 74, 74) | (25, 9, 9) | 4 | ODS-BER |
| 10 | (44, 54, 54, 64, 64, 74, 74, 74) | (26, 20, 30) | 1 | ODS-FER/BER |
| 11 | (54, 54, 54, 64, 64, 74, 74, 74) | (26, 11, 22) | 2 | ODS-FER/BER |
| 12 | (54, 54, 54, 64, 64, 74, 74, 74) | (26, 12, 24) | 2 | ODS-FER/BER |
| 13 | (54, 54, 54, 64, 64, 74, 74, 74) | (26, 13, 26) | 2 | ODS-FER/BER |
| 14 | (54, 54, 54, 64, 64, 74, 74, 74) | (26, 14, 28) | 2 | ODS-FER/BER |
| 15 | (54, 54, 54, 64, 64, 74, 74, 74) | (26, 15, 30) | 2 | ODS-FER/BER |

TABLE 13

NEW ODS FEEDFORWARD LOW RATE TBCC WITH RATE 1/8 AND CONSTRAINT LENGTH V = 4

| K | G | WS | # permutation equivalent codes | Note |
|---|---|---|---|---|
| 4 | (2, 2, 6, 6, 12, 16, 16, 74) | (16, 7, 16) | 369248 | ODS-FER/BER |

TABLE 13-continued

NEW ODS FEEDFORWARD LOW RATE TBCC
WITH RATE 1/8 AND CONSTRAINT LENGTH V = 4

| K | G | WS | # permutation equivalent codes | Note |
|---|---|---|---|---|
| 5 | (2, 2, 6, 12, 16, 26, 36, 56) | (20, 26, 60) | 139905 | ODS-FER/BER |
| 6 | (2, 6, 12, 26, 32, 36, 56, 76) | (24, 60, 180) | 2880 | ODS-FER/BER |
| 7 | (2, 16, 26, 32, 36, 46, 52, 76) | (25, 14, 28) | 240 | ODS-FER/BER |
| 8 | (16, 26, 32, 36, 52, 56, 72, 76) | (28, 20, 64) | 24 | ODS-FER/BER |
| 9 | (36, 46, 52, 56, 62, 66, 72, 76) | (30, 27, 81) | 2 | ODS-FER |
|  | (26, 36, 46, 52, 56, 66, 72, 76) | (30, 27, 72) | 8 | ODS-BER |
| 10 | (46, 52, 56, 56, 66, 72, 72, 76) | (30, 1, 10) | 2 | ODS-FER |
|  | (36, 46, 52, 52, 56, 66, 72, 76) | (30, 10, 10) | 4 | ODS-BER |
| 11 | (46, 52, 56, 56, 66, 72, 72, 76) | (31, 11, 11) | 2 | ODS-FER/BER |
| 12 | (52, 52, 56, 66, 66, 72, 76, 76) | (32, 87, 300) | 1 | ODS-FER/BER |
| 13 | (52, 52, 56, 66, 66, 72, 76, 76) | (32, 52, 104) | 1 | ODS-FER/BER |
| 14 | (52, 52, 56, 66, 66, 72, 76, 76) | (32, 56, 112) | 1 | ODS-FER/BER |
| 15 | (52, 52, 56, 66, 66, 72, 76, 76) | (32, 60, 120) | 1 | ODS-FER/BER |

TABLE 14

NEW ODS FEEDFORWARD LOW RATE TBCC
WITH RATE 1/9 AND CONSTRAINT LENGTH V = 3

| K | G | WS | # permutation equivalent codes | Note |
|---|---|---|---|---|
| 4 | (4, 4, 4, 14, 14, 24, 34, 34, 74) | (18, 6, 12) | 4000 | ODS-FER/BER |
| 5 | (4, 4, 14, 24, 34, 34, 54, 54, 74) | (22, 15, 35) | 810 | ODS-FER/BER |
| 6 | (14, 24, 34, 34, 44, 54, 64, 74, 74) | (24, 6, 24) | 18 | ODS-FER |
|  | (4, 14, 24, 34, 44, 54, 64, 74, 74) | (24, 9, 18) | 48 | ODS-BER |
| 7 | (14, 24, 34, 54, 54, 64, 64, 74, 74) | (27, 14, 42) | 12 | ODS-FER |
|  | (24, 34, 44, 54, 54, 64, 64, 74, 74) | (27, 14, 28) | 4 | ODS-BER |
| 8 | (34, 34, 54, 54, 54, 64, 64, 74, 74) | (28, 14, 40) | 6 | ODS-FER |
|  | (34, 34, 44, 54, 54, 64, 64, 74, 74) | (28, 20, 40) | 3 | ODS-BER |
| 9 | (24, 44, 54, 54, 64, 64, 74, 74, 74) | (28, 9, 9) | 2 | ODS-FER/BER |
| 10 | (44, 54, 54, 54, 64, 64, 74, 74, 74) | (29, 10, 10) | 2 | ODS-FER/BER |
| 11 | (54, 54, 54, 64, 64, 64, 74, 74, 74) | (30, 44, 143) | 1 | ODS-FER/BER |
| 12 | (54, 54, 54, 64, 64, 64, 74, 74, 74) | (30, 36, 72) | 1 | ODS-FER/BER |
| 13 | (54, 54, 54, 64, 64, 64, 74, 74, 74) | (30, 39, 78) | 1 | ODS-FER/BER |
| 14 | (54, 54, 54, 64, 64, 64, 74, 74, 74) | (30, 42, 84) | 1 | ODS-FER/BER |
| 15 | (54, 54, 54, 64, 64, 64, 74, 74, 74) | (30, 45, 90) | 1 | ODS-FER/BER |

TABLE 15

NEW ODS FEEDFORWARD LOW RATE TBCC
WITH RATE 1/9 AND CONSTRAINT LENGTH V = 4

| K | G | WS | # permutation equivalent codes | Note |
|---|---|---|---|---|
| 6 | (2, 6, 12, 16, 26, 32, 36, 56, 76) | (26, 12, 36) | 8640 | ODS-FER/BER |
| 7 | (2, 16, 26, 32, 36, 46, 52, 56, 76) | (28, 7, 28) | 480 | ODS-FER |
|  | (6, 16, 22, 26, 32, 36, 46, 66, 76) | (28, 7, 14) | 576 | ODS-BER |
| 8 | (16, 26, 32, 36, 52, 56, 66, 72, 76) | (32, 16, 48) | 24 | ODS-FER/BER |
| 9 | (26, 36, 46, 52, 56, 56, 66, 72, 76) | (34, 45, 144) | 8 | ODS-FER/BER |
| 10 | (36, 46, 52, 52, 56, 66, 72, 72, 76) | (34, 10, 10) | 4 | ODS-FER/BER |

TABLE 16

NEW ODS FEEDFORWARD LOW RATE TBCC
WITH RATE 1/9 AND CONSTRAINT LENGTH V = 5

| K | G | WS | # permutation equivalent codes | Note |
|---|---|---|---|---|
| 7 | (1, 34, 37, 43, 45, 46, 54, 57, 67) | (31, 63, 217) | 48769 | |

TABLE 17

| L | First-level puncturing: the set of generator polynomials for the TBCC encoding | Second-level puncturing: positions of bits to be punctured after the TBCC encoding |
|---|---|---|
| 12 | (16, 112, 556, 636, 656) | none |
| 13 | (16, 112, 556, 636, 656) | (1, 16, 31, 46, 61) |
| 14 | (16, 112, 556, 636, 656) | (3, 8, 13, 18, 23, 28, 33, 38, 43, 48) |
| 15 | (16, 112, 636, 656) | none |
| 16 | (16, 112, 636, 656) | (0, 16, 32, 48) |
| 17 | (16, 112, 636, 656) | (0, 8, 16, 24, 32, 40, 48, 56) |
| 18 | (16, 112, 636, 656) | (0, 4, 8, 12, 16, 20, 24, 28, 32, 36, 40, 44) |
| 19 | (16, 112, 636, 656) | (0, 4, 8, 12, 16, 20, 24, 32, 36, 40, 48, 52, 56, 64, 68, 72) |
| 20 | (112, 556, 636) | none |
| 21 | (112, 556, 636) | (0, 27, 54) |
| 22 | (112, 636, 656) | (2, 15, 23, 31, 52, 60) |
| 23 | (112, 636, 656) | (0, 3, 12, 21, 30, 33, 42, 51, 60) |
| 24 | (112, 636, 656) | (1, 7, 13, 19, 25, 31, 37, 43, 49, 55, 61, 67) |

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of implementing a tail biting convolutional code to operate on data transmitted over a channel, the method comprising:
    (1) specifying a constraint and a low code rate for the tail biting convolutional code, where the low code rate is lower than 1/n (n being an integer greater than 4);
    (2) selecting valid combinations of generator polynomials to include in a pool of potential codes, each valid combination being a potential code of the low code rate;
    (3) determining first lines of a weight spectrum for each potential code in the pool and including potential codes of the pool having best first lines in a candidate set;
    (4) determining best codes of the candidate set based on a first L number of lines in the weight spectrum, L being an integer greater than one;
    (5) selecting an optimum code(s) from the best codes;
    (6) configuring a circuit(s) of a data transceiver to implement the optimum code(s) for operating on the data transmitted over the channel.

2. The method of claim 1, further comprising using a computer to perform at least acts (2)-(5).

3. The method of claim 1, further comprising configuring a shift register circuit(s) of the data transceiver to implement the optimum code(s).

4. The method of claim 1, further comprising dividing the valid combinations of generator polynomials into subsets and performing act (3) separately with respect to each subset.

5. The method of claim 4, further comprising performing act (3) essentially in parallel with respect to plural subsets.

6. The method of claim 4, further comprising performing act (3) in series with respect to plural subsets and using an optimum weight spectrum obtained from one subset as an a-priori known distance spectrum for other subsets.

7. The method of claim 1, further comprising using a free distance parameter and a multiplicity parameter for selecting the optimum code(s) from the best codes.

8. The method of claim 1, further comprising using a free distance parameter and a bit multiplicity parameter for selecting the optimum code(s) from the best codes.

9. The method of claim 1, further comprising using a shift register circuit configured in accordance with the optimum code to append error correction information to data transmitted over the channel.

10. A communications unit which participates in data transmissions over a channel, the communications unit comprising:
    a transceiver configured to send and receive data over the channel;
    a circuit configured to implement an optimum low rate tail biting convolutional code for operating on the data transmitted over the channel, the optimum code having been generated by performing the acts of claim 1.

11. The apparatus of claim 10, wherein the communication unit is a wireless terminal which communicates with a base station over an air interface, and wherein the data transmitted over the channel comprises payload for a secondary fast feedback channel (SFBCH).

12. The apparatus of claim 10, wherein the circuit configured to implement the optimum low rate tail biting convolutional code is a shift register circuit.

13. The apparatus of claim 12, further comprising:
    plural shift register circuits, each of the shift register circuits being configured to implement a respective different one of plural optimum tail biting convolutional codes, each of the plural optimum tail biting convolutional codes being of a different rate and having been generated by performing the acts of claim 1;
    a code activator configured to include one of the plural shift register circuits in a processing stream for a respective data transmission over the channel.

14. The apparatus of claim 12, wherein the shift register circuit comprises an encoder configured to append error correction information to data transmitted over the channel.

15. The method of claim 1, wherein the optimum code is expressed by a set of polynomials listed in any of Table 2-Table 16, polynomials being shown in octal notation in column G of Table 2-Table 16:

TABLE 2

NEW ODS FEEDFORWARD LOW RATE TBCC WITH RATE 1/5 AND CONSTRAINT LENGTH V = 3

| K | G | WS | # permutation equivalent codes | Note |
|---|---|----|------|------|
| 4 | (4, 4, 14, 34, 54) | (10, 12, 24) | 376 | ODS-FER/BER |
| 5 | (4, 4, 34, 54, 74) | (12, 25, 55) | 40 | ODS-FER/BER |
| 6 | (4, 34, 54, 64, 74) | (12, 2, 6) | 8 | ODS-FER |
|   | (4, 14, 34, 54, 64) | (12, 6, 6) | 24 | ODS-BER |
| 7 | (14, 34, 54, 64, 74) | (14, 7, 14) | 6 | ODS-FER/BER |
| 8 | (34, 54, 54, 64, 74) | (16, 82, 320) | 4 | ODS-FER/BER |
| 9 | (44, 54, 64, 74, 74) | (16, 36, 108) | 1 | ODS-FER/BER |
| 10 | (44, 54, 64, 74, 74) | (16, 20, 30) | 1 | ODS-FER/BER |
| 11 | (54, 54, 64, 74, 74) | (16, 11, 22) | 2 | ODS-FER/BER |
| 12 | (54, 54, 64, 74, 74) | (16, 12, 24) | 2 | ODS-FER/BER |
| 13 | (54, 54, 64, 74, 74) | (16, 13, 26) | 2 | ODS-FER/BER |
| 14 | (54, 54, 64, 74, 74) | (16, 14, 28) | 2 | ODS-FER/BER |
| 15 | (54, 54, 64, 74, 74) | (16, 15, 30) | 2 | ODS-FER/BER |
| 16 | (54, 54, 64, 74, 74) | (16, 16, 32) | 2 | ODS-FER/BER |
| 17 | (54, 54, 64, 74, 74) | (16, 17, 34) | 2 | ODS-FER/BER |
| 18 | (54, 54, 64, 74, 74) | (16, 18, 36) | 2 | ODS-FER/BER |
| 19 | (54, 54, 64, 74, 74) | (16, 19, 38) | 2 | ODS-FER/BER |
| 20 | (54, 54, 64, 74, 74) | (16, 20, 40) | 2 | ODS-FER/BER |
| 21 | (54, 54, 64, 74, 74) | (16, 21, 42) | 2 | ODS-FER/BER |
| 22 | (54, 54, 64, 74, 74) | (16, 22, 44) | 2 | ODS-FER/BER |
| 23 | (54, 54, 64, 74, 74) | (16, 23, 46) | 2 | ODS-FER/BER |
| 24 | (54, 54, 64, 74, 74) | (16, 24, 48) | 2 | ODS-FER/BER |

TABLE 3

NEW ODS FEEDFORWARD LOW RATE TBCC WITH RATE 1/5 AND CONSTRAINT LENGTH V = 4

| K | G | WS | # permutation equivalent codes | Note |
|---|---|----|------|------|
| 4 | (2, 2, 6, 16, 54) | (10, 12, 24) | 9580 | ODS-FER/BER |
| 5 | (2, 2, 16, 26, 56) | (12, 25, 55) | 1795 | ODS-FER/BER |
| 6 | (2, 16, 26, 32, 76) | (14, 15, 42) | 135 | ODS-FER/BER |
| 7 | (22, 26, 46, 52, 76) | (16, 84, 315) | 24 | ODS-FER/BER |
| 8 | (6, 26, 56, 62, 76) | (16, 8, 16) | 16 | ODS-FER/BER |
| 9 | (52, 56, 66, 72, 76) | (18, 58, 261) | 1 | ODS-FER |
|   | (46, 56, 62, 66, 72) | (18, 58, 216) | 1 | ODS-BER |
| 10 | (36, 46, 52, 66, 72) | (18, 10, 10) | 4 | ODS-FER/BER |
| 11 | (46, 52, 56, 72, 76) | (19, 11, 11) | 2 | ODS-FER/BER |

TABLE 3-continued

NEW ODS FEEDFORWARD LOW RATE TBCC WITH RATE 1/5 AND CONSTRAINT LENGTH V = 4

| K | G | WS | # permutation equivalent codes | Note |
|---|---|---|---|---|
| 12 | (52, 56, 66, 72, 76) | (20, 72, 216) | 1 | ODS-FER/BER |
| 13 | (52, 56, 66, 72, 76) | (20, 52, 104) | 1 | ODS-FER/BER |
| 14 | (52, 56, 66, 72, 76) | (20, 56, 112) | 1 | ODS-FER/BER |
| 15 | (52, 56, 66, 72, 76) | (20, 60, 120) | 1 | ODS-FER/BER |
| 16 | (52, 56, 66, 72, 76) | (20, 64, 128) | 1 | ODS-FER/BER |
| 17 | (52, 56, 66, 72, 76) | (20, 68, 136) | 1 | ODS-FER/BER |
| 18 | (52, 56, 66, 72, 76) | (20, 72, 144) | 1 | ODS-FER/BER |
| 19 | (52, 56, 66, 72, 76) | (20, 76, 152) | 1 | ODS-FER/BER |
| 20 | (52, 56, 66, 72, 76) | (20, 80, 160) | 1 | ODS-FER/BER |
| 21 | (52, 56, 66, 72, 76) | (20, 84, 168) | 1 | ODS-FER/BER |
| 22 | (52, 56, 66, 72, 76) | (20, 88, 176) | 1 | ODS-FER/BER |
| 23 | (52, 56, 66, 72, 76) | (20, 92, 184) | 1 | ODS-FER/BER |
| 24 | (52, 56, 66, 72, 76) | (20, 96, 192) | 1 | ODS-FER/BER |

TABLE 4

NEW ODS FEEDFORWARD LOW RATE TBCC WITH RATE 1/5 AND CONSTRAINT LENGTH V = 5

| K | G | WS | # permutation equivalent codes | Note |
|---|---|---|---|---|
| 5 | (1, 1, 7, 13, 56) | (12, 25, 55) | 51290 | ODS-FER/BER |
| 6 | (1, 7, 13, 15, 57) | (14, 15, 42) | 7506 | ODS-FER/BER |
| 7 | (1, 3, 25, 37, 67) | (16, 84, 266) | 1440 | ODS-FER/BER |
| 8 | (11, 23, 47, 73, 77) | (16, 5, 16) | 48 | ODS-FER/BER |
| 9 | (17, 45, 47, 67, 75) | (18, 27, 126) | 6 | ODS-FER |
|   | (5, 13, 53, 57, 67) | (18, 27, 126) | 24 | ODS-BER |
| 10 | (25, 33, 45, 67, 75) | (20, 127, 630) | 8 | ODS-FER |
|    | (11, 27, 35, 67, 73) | (20, 141, 620) | 12 | ODS-BER |
| 11 | (27, 51, 53, 67, 73) | (21, 88, 374) | 4 | ODS-FER/BER |
| 12 | (37, 47, 55, 57, 65) | (22, 108, 504) | 4 | ODS-FER/BER |
| 13 | (47, 55, 57, 73, 75) | (22, 13, 26) | 2 | ODS-FER/BER |
| 14 | (47, 57, 65, 73, 75) | (22, 14, 28) | 2 | ODS-FER/BER |
| 15 | (47, 55, 57, 67, 75) | (22, 15, 30) | 2 | ODS-FER/BER |
| 16 | (47, 55, 57, 67, 75) | (22, 16, 32) | 2 | ODS-FER/BER |
| 17 | (47, 55, 57, 67, 75) | (22, 17, 34) | 2 | ODS-FER/BER |
| 18 | (47, 55, 57, 67, 75) | (22, 18, 36) | 2 | ODS-FER/BER |

TABLE 5

NEW ODS FEEDFORWARD LOW RATE TBCC WITH RATE 1/5 AND CONSTRAINT LENGTH V = 6

| K | G | WS | # permutation equivalent codes | Note |
|---|---|---|---|---|
| 12 | (54, 254, 434, 724, 774) | (22, 24, 48) | 15 | ODS-FER/BER |

TABLE 6

NEW ODS FEEDFORWARD LOW RATE TBCC WITH RATE 1/5 AND CONSTRAINT LENGTH V = 7

| K | G | WS | # permutation equivalent codes | Note |
|---|---|---|---|---|
| 12 | (16, 112, 556, 636, 656) | (24, 659, 4044) | 4 | ODS-FER |

TABLE 7

NEW ODS FEEDFORWARD LOW RATE TBCC WITH RATE 1/6 AND CONSTRAINT LENGTH V = 5

| K | G | WS | # permutation equivalent codes | Note |
|---|---|---|---|---|
| 7 | (1, 3, 13, 25, 37, 67) | (19, 35, 105) | 11520 | ODS-FER/BER |
| 8 | (1, 23, 35, 45, 57, 77) | (22, 144, 528) | 144 | ODS-FER/BER |
| 9 | (5, 23, 27, 37, 53, 57) | (23, 81, 351) | 64 | ODS-FER |
|   | (13, 27, 33, 43, 57, 63) | (23, 81, 333) | 48 | ODS-BER |
| 10 | (27, 47, 55, 57, 61, 73) | (24, 20, 80) | 4 | ODS-FER/BER |
| 11 | (43, 55, 57, 67, 71, 75) | (26, 99, 462) | 2 | ODS-FER/BER |

TABLE 8

NEW ODS FEEDFORWARD LOW RATE TBCC WITH RATE 1/6 AND CONSTRAINT LENGTH V = 3

| K | G | WS | # permutation equivalent codes | Note |
|---|---|---|---|---|
| 4 | (4, 4, 14, 24, 34, 54) | (12, 10, 20) | 776 | ODS-FER/BER |
| 5 | (4, 14, 24, 34, 54, 74) | (15, 16, 40) | 144 | ODS-FER/BER |
| 6 | (14, 34, 44, 54, 64, 74) | (16, 9, 36) | 6 | ODS-FER/BER |
| 7 | (14, 24, 34, 54, 64, 74) | (17, 7, 7) | 12 | ODS-FER/BER |
| 8 | (34, 44, 54, 54, 64, 74) | (18, 8, 8) | 4 | ODS-FER/BER |
| 9 | (44, 54, 54, 64, 74, 74) | (19, 18, 54) | 2 | ODS-FER/BER |
| 10 | (44, 54, 54, 64, 74, 74) | (19, 10, 10) | 2 | ODS-FER/BER |
| 11 | (54, 54, 64, 64, 74, 74) | (20, 44, 143) | 1 | ODS-FER/BER |
| 12 | (54, 54, 64, 64, 74, 74) | (20, 36, 72) | 1 | ODS-FER/BER |
| 13 | (54, 54, 64, 64, 74, 74) | (20, 39, 78) | 1 | ODS-FER/BER |
| 14 | (54, 54, 64, 64, 74, 74) | (20, 42, 84) | 1 | ODS-FER/BER |
| 15 | (54, 54, 64, 64, 74, 74) | (20, 45, 90) | 1 | ODS-FER/BER |
| 16 | (54, 54, 64, 64, 74, 74) | (20, 48, 96) | 1 | ODS-FER/BER |
| 17 | (54, 54, 64, 64, 74, 74) | (20, 51, 102) | 1 | ODS-FER/BER |
| 18 | (54, 54, 64, 64, 74, 74) | (20, 54, 108) | 1 | ODS-FER/BER |

TABLE 9

NEW ODS FEEDFORWARD LOW RATE TBCC WITH RATE 1/6 AND CONSTRAINT LENGTH V = 4

| K | G | WS | # permutation equivalent codes | Note |
|---|---|---|---|---|
| 4 | (2, 2, 6, 12, 16, 54) | (12, 10, 20) | 39884 | ODS-FER/BER |
| 5 | (2, 6, 12, 16, 26, 56) | (15, 16, 40) | 15337 | ODS-FER/BER |
| 6 | (2, 6, 16, 26, 32, 76) | (16, 6, 12) | 540 | ODS-FER/BER |
| 7 | (22, 26, 32, 46, 52, 76) | (19, 42, 154) | 24 | ODS-FER/BER |
| 8 | (26, 36, 46, 56, 62, 66) | (20, 18, 72) | 8 | ODS-FER |
|   | (16, 26, 32, 36, 56, 72) | (20, 20, 64) | 24 | ODS-BER |
| 9 | (26, 52, 56, 66, 72, 76) | (23, 90, 360) | 4 | ODS-FER/BER |
| 10 | (46, 52, 56, 66, 72, 76) | (23, 10, 10) | 2 | ODS-FER/BER |
| 11 | (46, 52, 56, 66, 72, 76) | (23, 11, 11) | 2 | ODS-FER/BER |
| 12 | (52, 56, 56, 66, 72, 76) | (24, 85, 288) | 2 | ODS-FER/BER |
| 13 | (52, 56, 56, 66, 72, 76) | (24, 52, 104) | 2 | ODS-FER/BER |
| 14 | (52, 56, 56, 66, 72, 76) | (24, 56, 112) | 2 | ODS-FER/BER |
| 15 | (52, 56, 56, 66, 72, 76) | (24, 60, 120) | 2 | ODS-FER/BER |
| 16 | (52, 56, 56, 66, 72, 76) | (24, 64, 128) | 2 | ODS-FER/BER |
| 17 | (52, 56, 56, 66, 72, 76) | (24, 68, 136) | 2 | ODS-FER/BER |
| 18 | (52, 56, 56, 66, 72, 76) | (24, 72, 144) | 2 | ODS-FER/BER |

TABLE 10

NEW ODS FEEDFORWARD LOW RATE TBCC WITH RATE 1/7 AND CONSTRAINT LENGTH V = 3

| K | G | WS | # permutation equivalent codes | Note |
|---|---|---|---|---|
| 4 | (4, 4, 14, 14, 24, 34, 54) | (14, 8, 16) | 1964 | ODS-FER/BER |
| 5 | (4, 4, 14, 24, 34, 54, 74) | (16, 5, 5) | 360 | ODS-FER/BER |
| 6 | (14, 24, 34, 44, 54, 64, 74) | (18, 1, 6) | 12 | ODS-FER |
|  | (4, 14, 34, 44, 54, 64, 74) | (18, 6, 6) | 24 | ODS-BER |
| 7 | (14, 24, 34, 54, 64, 74, 74) | (20, 7, 14) | 12 | ODS-FER/BER |
| 8 | (34, 44, 54, 54, 64, 64, 74) | (21, 8, 8) | 2 | ODS-FER |
|  | (34, 34, 44, 54, 54, 64, 74) | (21, 8, 8) | 6 | ODS-BER |
| 9 | (34, 44, 54, 54, 64, 74, 74) | (22, 18, 27) | 4 | ODS-FER/BER |
| 10 | (44, 54, 54, 64, 64, 74, 74) | (22, 10, 10) | 1 | ODS-FER/BER |
| 11 | (54, 54, 54, 64, 64, 74, 74) | (23, 33, 121) | 2 | ODS-FER/BER |
| 12 | (54, 54, 54, 64, 64, 74, 74) | (23, 24, 48) | 2 | ODS-FER/BER |
| 13 | (54, 54, 54, 64, 64, 74, 74) | (23, 26, 52) | 2 | ODS-FER/BER |
| 14 | (54, 54, 54, 64, 64, 74, 74) | (23, 28, 56) | 2 | ODS-FER/BER |
| 15 | (54, 54, 54, 64, 64, 74, 74) | (23, 30, 60) | 2 | ODS-FER/BER |
| 16 | (54, 54, 54, 64, 64, 74, 74) | (23, 32, 64) | 2 | ODS-FER/BER |
| 17 | (54, 54, 54, 64, 64, 74, 74) | (23, 34, 68) | 2 | ODS-FER/BER |
| 18 | (54, 54, 54, 64, 64, 74, 74) | (23, 36, 72) | 2 | ODS-FER/BER |

TABLE 11

NEW ODS FEEDFORWARD LOW RATE TBCC WITH RATE 1/7 AND CONSTRAINT LENGTH V = 4

| K | G | WS | # permutation equivalent codes | Note |
|---|---|---|---|---|
| 4 | (2, 2, 6, 6, 12, 16, 54) | (14, 8, 16) | 182642 | ODS-FER/BER |
| 5 | (2, 2, 6, 12, 16, 26, 56) | (16, 5, 5) | 46155 | ODS-FER/BER |
| 6 | (2, 6, 12, 26, 32, 56, 76) | (20, 33, 96) | 2160 | ODS-FER/BER |
| 7 | (2, 16, 26, 32, 46, 66, 76) | (22, 35, 105) | 120 | ODS-FER/BER |
| 8 | (16, 26, 36, 46, 52, 56, 76) | (24, 20, 64) | 24 | ODS-FER/BER |
| 9 | (36, 46, 52, 56, 66, 72, 76) | (26, 18, 72) | 4 | ODS-FER/BER |
| 10 | (46, 52, 56, 66, 72, 72, 76) | (27, 20, 60) | 2 | ODS-FER/BER |
| 11 | (46, 52, 56, 66, 72, 72, 76) | (27, 11, 11) | 2 | ODS-FER/BER |
| 12 | (46, 52, 56, 66, 72, 72, 76) | (27, 12, 12) | 2 | ODS-FER/BER |
| 13 | (52, 52, 56, 66, 66, 76, 76) | (28, 52, 104) | 2 | ODS-FER/BER |
| 14 | (52, 52, 56, 66, 66, 76, 76) | (28, 56, 112) | 2 | ODS-FER/BER |
| 15 | (52, 56, 56, 66, 72, 72, 76) | (28, 60, 120) | 1 | ODS-FER/BER |
| 16 | (52, 56, 56, 66, 72, 72, 76) | (28, 64, 128) | 1 | ODS-FER/BER |
| 17 | (52, 56, 56, 66, 72, 72, 76) | (28, 68, 136) | 1 | ODS-FER/BER |
| 18 | (52, 56, 56, 66, 72, 72, 76) | (28, 72, 144) | 1 | ODS-FER/BER |

TABLE 12

NEW ODS FEEDFORWARD LOW RATE TBCC WITH RATE 1/8 AND CONSTRAINT LENGTH V = 3

| K | G | WS | # permutation equivalent codes | Note |
|---|---|---|---|---|
| 4 | (4, 4, 14, 14, 24, 34, 34, 74) | (16, 7, 16) | 2000 | ODS-FER/BER |
| 5 | (4, 4, 14, 24, 34, 54, 74, 74) | (20, 26, 60) | 360 | ODS-FER/BER |
| 6 | (4, 14, 34, 44, 54, 64, 74, 74) | (22, 30, 78) | 24 | ODS-FER/BER |
| 7 | (14, 24, 34, 54, 54, 64, 74, 74) | (24, 28, 84) | 24 | ODS-FER/BER |
| 8 | (34, 44, 54, 54, 64, 64, 74, 74) | (24, 4, 16) | 2 | ODS-FER |
|  | (24, 34, 44, 54, 54, 64, 74, 74) | (24, 10, 16) | 8 | ODS-BER |

TABLE 12-continued

NEW ODS FEEDFORWARD LOW RATE TBCC WITH RATE 1/8 AND CONSTRAINT LENGTH V = 3

| K | G | WS | # permutation equivalent codes | Note |
|---|---|---|---|---|
| 9 | (34, 44, 54, 54, 64, 64, 74, 74) | (25, 9, 9) | 2 | ODS-FER |
|  | (24, 34, 54, 54, 64, 64, 74, 74) | (25, 9, 9) | 4 | ODS-BER |
| 10 | (44, 54, 54, 64, 64, 74, 74, 74) | (26, 20, 30) | 1 | ODS-FER/BER |
| 11 | (54, 54, 54, 64, 64, 74, 74, 74) | (26, 11, 22) | 2 | ODS-FER/BER |
| 12 | (54, 54, 54, 64, 64, 74, 74, 74) | (26, 12, 24) | 2 | ODS-FER/BER |
| 13 | (54, 54, 54, 64, 64, 74, 74, 74) | (26, 13, 26) | 2 | ODS-FER/BER |
| 14 | (54, 54, 54, 64, 64, 74, 74, 74) | (26, 14, 28) | 2 | ODS-FER/BER |
| 15 | (54, 54, 54, 64, 64, 74, 74, 74) | (26, 15, 30) | 2 | ODS-FER/BER |

TABLE 13

NEW ODS FEEDFORWARD LOW RATE TBCC WITH RATE 1/8 AND CONSTRAINT LENGTH V = 4

| K | G | WS | # permutation equivalent codes | Note |
|---|---|---|---|---|
| 4 | (2, 2, 6, 6, 12, 16, 16, 74) | (16, 7, 16) | 369248 | ODS-FER/BER |
| 5 | (2, 2, 6, 12, 16, 26, 36, 56) | (20, 26, 60) | 139905 | ODS-FER/BER |
| 6 | (2, 6, 12, 26, 32, 36, 56, 76) | (24, 60, 180) | 2880 | ODS-FER/BER |
| 7 | (2, 16, 26, 32, 36, 46, 52, 76) | (25, 14, 28) | 240 | ODS-FER/BER |
| 8 | (16, 26, 32, 36, 52, 56, 72, 76) | (28, 20, 64) | 24 | ODS-FER/BER |
| 9 | (36, 46, 52, 56, 62, 66, 72, 76) | (30, 27, 81) | 2 | ODS-FER |
|  | (26, 36, 46, 52, 56, 66, 72, 76) | (30, 27, 72) | 8 | ODS-BER |
| 10 | (46, 52, 56, 56, 66, 72, 72, 76) | (30, 1, 10) | 2 | ODS-FER |
|  | (36, 46, 52, 52, 56, 66, 72, 76) | (30, 10, 10) | 4 | ODS-BER |
| 11 | (46, 52, 56, 56, 66, 72, 72, 76) | (31, 11, 11) | 2 | ODS-FER/BER |
| 12 | (52, 52, 56, 66, 66, 72, 76, 76) | (32, 87, 300) | 1 | ODS-FER/BER |
| 13 | (52, 52, 56, 66, 66, 72, 76, 76) | (32, 52, 104) | 1 | ODS-FER/BER |
| 14 | (52, 52, 56, 66, 66, 72, 76, 76) | (32, 56, 112) | 1 | ODS-FER/BER |
| 15 | (52, 52, 56, 66, 66, 72, 76, 76) | (32, 60, 120) | 1 | ODS-FER/BER |

TABLE 14

NEW ODS FEEDFORWARD LOW RATE TBCC WITH RATE 1/9 AND CONSTRAINT LENGTH V = 3

| K | G | WS | # permutation equivalent codes | Note |
|---|---|---|---|---|
| 4 | (4, 4, 4, 14, 14, 24, 34, 34, 74) | (18, 6, 12) | 4000 | ODS-FER/BER |
| 5 | (4, 4, 14, 24, 34, 34, 54, 54, 74) | (22, 15, 35) | 810 | ODS-FER/BER |

TABLE 14-continued

NEW ODS FEEDFORWARD LOW RATE TBCC WITH
RATE 1/9 AND CONSTRAINT LENGTH V = 3

| K | G | WS | # permutation equivalent codes | Note |
|---|---|----|---|------|
| 6 | (14, 24, 34, 34, 44, 54, 64, 74, 74) | (24, 6, 24) | 18 | ODS-FER |
|   | (4, 14, 24, 34, 44, 54, 64, 74, 74) | (24, 9, 18) | 48 | ODS-BER |
| 7 | (14, 24, 34, 54, 54, 64, 64, 74, 74) | (27, 14, 42) | 12 | ODS-FER |
|   | (24, 34, 44, 54, 54, 64, 64, 74, 74) | (27, 14, 28) | 4 | ODS-BER |
| 8 | (34, 34, 54, 54, 54, 64, 64, 74, 74) | (28, 14, 40) | 6 | ODS-FER |
|   | (34, 34, 44, 54, 54, 64, 64, 74, 74) | (28, 20, 40) | 3 | ODS-BER |
| 9 | (24, 44, 54, 54, 64, 64, 74, 74, 74) | (28, 9, 9) | 2 | ODS-FER/BER |
| 10 | (44, 54, 54, 54, 64, 64, 74, 74, 74) | (29, 10, 10) | 2 | ODS-FER/BER |
| 11 | (54, 54, 54, 64, 64, 64, 74, 74, 74) | (30, 44, 143) | 1 | ODS-FER/BER |
| 12 | (54, 54, 54, 64, 64, 64, 74, 74, 74) | (30, 36, 72) | 1 | ODS-FER/BER |
| 13 | (54, 54, 54, 64, 64, 64, 74, 74, 74) | (30, 39, 78) | 1 | ODS-FER/BER |
| 14 | (54, 54, 54, 64, 64, 64, 74, 74, 74) | (30, 42, 84) | 1 | ODS-FER/BER |
| 15 | (54, 54, 54, 64, 64, 64, 74, 74, 74) | (30, 45, 90) | 1 | ODS-FER/BER |

TABLE 15

NEW ODS FEEDFORWARD LOW RATE TBCC WITH
RATE 1/9 AND CONSTRAINT LENGTH V = 4

| K | G | WS | # permutation equivalent codes | Note |
|---|---|----|---|------|
| 6 | (2, 6, 12, 16, 26, 32, 36, 56, 76) | (26, 12, 36) | 8640 | ODS-FER/BER |
| 7 | (2, 16, 26, 32, 36, 46, 52, 56, 76) | (28, 7, 28) | 480 | ODS-FER |
|   | (6, 16, 22, 26, 32, 36, 46, 66, 76) | (28, 7, 14) | 576 | ODS-BER |
| 8 | (16, 26, 32, 36, 52, 56, 66, 72, 76) | (32, 16, 48) | 24 | ODS-FER/BER |
| 9 | (26, 36, 46, 52, 56, 56, 66, 72, 76) | (34, 45, 144) | 8 | ODS-FER/BER |
| 10 | (36, 46, 52, 52, 56, 66, 72, 72, 76) | (34, 10, 10) | 4 | ODS-FER/BER |

TABLE 16

NEW ODS FEEDFORWARD LOW RATE TBCC WITH
RATE 1/9 AND CONSTRAINT LENGTH V = 5

| K | G | WS | # permutation equivalent codes | Note |
|---|---|----|---|------|
| 7 | (1, 34, 37, 43, 45, 46, 54, 57, 67). | (31, 63, 217) | 48769 |  |

16. A code generator comprising a computer which executes a computer program comprising instructions stored on a computer-readable medium which, when executed, performs the acts of:

(1) specifying a constraint and a low code rate for a tail biting convolutional code, where the low code rate is lower than 1/n (n being an integer greater than 4);
(2) selecting valid combinations of generator polynomials to include in a pool of potential codes, each valid combination being a potential code;
(3) determining first lines of a weight spectrum for each potential code in the pool and including potential codes of the pool having best first lines in a candidate set;
(4) determining best codes of the candidate set based on a first L number of lines in the weight spectrum, L being an integer greater than one;
(5) selecting an optimum code(s) from the best codes;
(6) outputting an identification of the optimum code(s).

17. The generator of claim 16, wherein when executed the instructions further perform the act of using a free distance parameter and a multiplicity parameter for selecting the optimum code(s) from the best codes.

18. The generator of claim 16, wherein when executed the instructions further perform the act of using a free distance parameter and a bit multiplicity parameter for selecting the optimum code(s) from the best codes.

19. A method of operating a communications unit comprising:

configuring a circuit of the unit to implement an optimum tail biting convolutional code expressed by a set of polynomials listed in any of Table 2-Table 16, polynomials being shown in octal notation in column G of Table 2-Table 16;

TABLE 2

NEW ODS FEEDFORWARD LOW RATE TBCC WITH RATE 1/5
AND CONSTRAINT LENGTH V = 3

| K | G | WS | # permutation equivalent codes | Note |
|---|---|----|---|------|
| 4 | (4, 4, 14, 34, 54) | (10, 12, 24) | 376 | ODS-FER/BER |
| 5 | (4, 4, 34, 54, 74) | (12, 25, 55) | 40 | ODS-FER/BER |
| 6 | (4, 34, 54, 64, 74) | (12, 2, 6) | 8 | ODS-FER |
|   | (4, 14, 34, 54, 64) | (12, 6, 6) | 24 | ODS-BER |
| 7 | (14, 34, 54, 64, 74) | (14, 7, 14) | 6 | ODS-FER/BER |
| 8 | (34, 54, 54, 64, 74) | (16, 82, 320) | 4 | ODS-FER/BER |
| 9 | (44, 54, 64, 74, 74) | (16, 36, 108) | 1 | ODS-FER/BER |
| 10 | (44, 54, 64, 74, 74) | (16, 20, 30) | 1 | ODS-FER/BER |
| 11 | (54, 54, 64, 74, 74) | (16, 11, 22) | 2 | ODS-FER/BER |
| 12 | (54, 54, 64, 74, 74) | (16, 12, 24) | 2 | ODS-FER/BER |
| 13 | (54, 54, 64, 74, 74) | (16, 13, 26) | 2 | ODS-FER/BER |
| 14 | (54, 54, 64, 74, 74) | (16, 14, 28) | 2 | ODS-FER/BER |
| 15 | (54, 54, 64, 74, 74) | (16, 15, 30) | 2 | ODS-FER/BER |
| 16 | (54, 54, 64, 74, 74) | (16, 16, 32) | 2 | ODS-FER/BER |
| 17 | (54, 54, 64, 74, 74) | (16, 17, 34) | 2 | ODS-FER/BER |
| 18 | (54, 54, 64, 74, 74) | (16, 18, 36) | 2 | ODS-FER/BER |
| 19 | (54, 54, 64, 74, 74) | (16, 19, 38) | 2 | ODS-FER/BER |
| 20 | (54, 54, 64, 74, 74) | (16, 20, 40) | 2 | ODS-FER/BER |
| 21 | (54, 54, 64, 74, 74) | (16, 21, 42) | 2 | ODS-FER/BER |
| 22 | (54, 54, 64, 74, 74) | (16, 22, 44) | 2 | ODS-FER/BER |
| 23 | (54, 54, 64, 74, 74) | (16, 23, 46) | 2 | ODS-FER/BER |
| 24 | (54, 54, 64, 74, 74) | (16, 24, 48) | 2 | ODS-FER/BER |

TABLE 3

NEW ODS FEEDFORWARD LOW RATE TBCC WITH RATE 1/5
AND CONSTRAINT LENGTH V = 4

| K | G | WS | # permutation equivalent codes | Note |
|---|---|----|---|------|
| 4 | (2, 2, 6, 16, 54) | (10, 12, 24) | 9580 | ODS-FER/BER |
| 5 | (2, 2, 16, 26, 56) | (12, 25, 55) | 1795 | ODS-FER/BER |

TABLE 3-continued

NEW ODS FEEDFORWARD LOW RATE TBCC WITH RATE 1/5 AND CONSTRAINT LENGTH V = 4

| K | G | WS | # permutation equivalent codes | Note |
|---|---|---|---|---|
| 6 | (2, 16, 26, 32, 76) | (14, 15, 42) | 135 | ODS-FER/BER |
| 7 | (22, 26, 46, 52, 76) | (16, 84, 315) | 24 | ODS-FER/BER |
| 8 | (6, 26, 56, 62, 76) | (16, 8, 16) | 16 | ODS-FER/BER |
| 9 | (52, 56, 66, 72, 76) | (18, 58, 261) | 1 | ODS-FER |
|   | (46, 56, 62, 66, 72) | (18, 58, 216) | 1 | ODS-BER |
| 10 | (36, 46, 52, 66, 72) | (18, 10, 10) | 4 | ODS-FER/BER |
| 11 | (46, 52, 56, 72, 76) | (19, 11, 11) | 2 | ODS-FER/BER |
| 12 | (52, 56, 66, 72, 76) | (20, 72, 216) | 1 | ODS-FER/BER |
| 13 | (52, 56, 66, 72, 76) | (20, 52, 104) | 1 | ODS-FER/BER |
| 14 | (52, 56, 66, 72, 76) | (20, 56, 112) | 1 | ODS-FER/BER |
| 15 | (52, 56, 66, 72, 76) | (20, 60, 120) | 1 | ODS-FER/BER |
| 16 | (52, 56, 66, 72, 76) | (20, 64, 128) | 1 | ODS-FER/BER |
| 17 | (52, 56, 66, 72, 76) | (20, 68, 136) | 1 | ODS-FER/BER |
| 18 | (52, 56, 66, 72, 76) | (20, 72, 144) | 1 | ODS-FER/BER |
| 19 | (52, 56, 66, 72, 76) | (20, 76, 152) | 1 | ODS-FER/BER |
| 20 | (52, 56, 66, 72, 76) | (20, 80, 160) | 1 | ODS-FER/BER |
| 21 | (52, 56, 66, 72, 76) | (20, 84, 168) | 1 | ODS-FER/BER |
| 22 | (52, 56, 66, 72, 76) | (20, 88, 176) | 1 | ODS-FER/BER |
| 23 | (52, 56, 66, 72, 76) | (20, 92, 184) | 1 | ODS-FER/BER |
| 24 | (52, 56, 66, 72, 76) | (20, 96, 192) | 1 | ODS-FER/BER |

TABLE 4

NEW ODS FEEDFORWARD LOW RATE TBCC WITH RATE 1/5 AND CONSTRAINT LENGTH V = 5

| K | G | WS | # permutation equivalent codes | Note |
|---|---|---|---|---|
| 5 | (1, 1, 7, 13, 56) | (12, 25, 55) | 51290 | ODS-FER/BER |
| 6 | (1, 7, 13, 15, 57) | (14, 15, 42) | 7506 | ODS-FER/BER |
| 7 | (1, 3, 25, 37, 67) | (16, 84, 266) | 1440 | ODS-FER/BER |
| 8 | (11, 23 47, 73, 77) | (16, 5, 16) | 48 | ODS-FER/BER |
| 9 | (17, 45, 47, 67, 75) | (18, 27, 126) | 6 | ODS-FER |
|   | (5, 13, 53, 57, 67) | (18, 27, 126) | 24 | ODS-BER |
| 10 | (25, 33, 45, 67, 75) | (20, 127, 630) | 8 | ODS-FER |
|   | (11, 27, 35, 67, 73) | (20, 141, 620) | 12 | ODS-BER |
| 11 | (27, 51, 53, 67, 73) | (21, 88, 374) | 4 | ODS-FER/BER |
| 12 | (37, 47, 55, 57, 65) | (22, 108, 504) | 4 | ODS-FER/BER |
| 13 | (47, 55, 57, 73, 75) | (22, 13, 26) | 2 | ODS-FER/BER |
| 14 | (47, 57, 65, 73, 75) | (22, 14, 28) | 2 | ODS-FER/BER |
| 15 | (47, 55, 57, 67, 75) | (22, 15, 30) | 2 | ODS-FER/BER |
| 16 | (47, 55, 57, 67, 75) | (22, 16, 32) | 2 | ODS-FER/BER |
| 17 | (47, 55, 57, 67, 75) | (22, 17, 34) | 2 | ODS-FER/BER |
| 18 | (47, 55, 57, 67, 75) | (22, 18, 36) | 2 | ODS-FER/BER |

TABLE 5

NEW ODS FEEDFORWARD LOW RATE TBCC WITH RATE 1/5 AND CONSTRAINT LENGTH V = 6

| K | G | WS | # permutation equivalent codes | Note |
|---|---|---|---|---|
| 12 | (54, 254, 434, 724, 774) | (22, 24, 48) | 15 | ODS-FER/BER |

TABLE 6

NEW ODS FEEDFORWARD LOW RATE TBCC WITH RATE 1/5 AND CONSTRAINT LENGTH V = 7

| K | G | WS | # permutation equivalent codes | Note |
|---|---|---|---|---|
| 12 | (16, 112, 556, 636, 656) | (24, 659, 4044) | 4 | ODS-FER |

TABLE 7

NEW ODS FEEDFORWARD LOW RATE TBCC WITH RATE 1/6 AND CONSTRAINT LENGTH V = 5

| K | G | WS | # permutation equivalent codes | Note |
|---|---|---|---|---|
| 7 | (1, 3, 13, 25, 37, 67) | (19, 35, 105) | 11520 | ODS-FER/BER |
| 8 | (1, 23, 35, 45, 57, 77) | (22, 144, 528) | 144 | ODS-FER/BER |
| 9 | (5, 23, 27, 37, 53, 57) | (23, 81, 351) | 64 | ODS-FER |
|   | (13, 27, 33, 43, 57, 63) | (23, 81, 333) | 48 | ODS-BER |
| 10 | (27, 47, 55, 57, 61, 73) | (24, 20, 80) | 4 | ODS-FER/BER |
| 11 | (43, 55, 57, 67, 71, 75) | (26, 99, 462) | 2 | ODS-FER/BER |

TABLE 8

NEW ODS FEEDFORWARD LOW RATE TBCC WITH RATE 1/6 AND CONSTRAINT LENGTH V = 3

| K | G | WS | # permutation equivalent codes | Note |
|---|---|---|---|---|
| 4 | (4, 4, 14, 24, 34, 54) | (12, 10, 20) | 776 | ODS-FER/BER |
| 5 | (4, 14, 24, 34, 54, 74) | (15, 16, 40) | 144 | ODS-FER/BER |
| 6 | (14, 34, 44, 54, 64, 74) | (16, 9, 36) | 6 | ODS-FER/BER |
| 7 | (14, 24, 34, 54, 64, 74) | (17, 7, 7) | 12 | ODS-FER/BER |
| 8 | (34, 44, 54, 54, 64, 74) | (18, 8, 8) | 4 | ODS-FER/BER |
| 9 | (44, 54, 54, 64, 74, 74) | (19, 18, 54) | 2 | ODS-FER/BER |
| 10 | (44, 54, 54, 64, 74, 74) | (19, 10, 10) | 2 | ODS-FER/BER |
| 11 | (54, 54, 64, 64, 74, 74) | (20, 44, 143) | 1 | ODS-FER/BER |
| 12 | (54, 54, 64, 64, 74, 74) | (20, 36, 72) | 1 | ODS-FER/BER |
| 13 | (54, 54, 64, 64, 74, 74) | (20, 39, 78) | 1 | ODS-FER/BER |
| 14 | (54, 54, 64, 64, 74, 74) | (20, 42, 84) | 1 | ODS-FER/BER |
| 15 | (54, 54, 64, 64, 74, 74) | (20, 45, 90) | 1 | ODS-FER/BER |
| 16 | (54, 54, 64, 64, 74, 74) | (20, 48, 96) | 1 | ODS-FER/BER |
| 17 | (54, 54, 64, 64, 74, 74) | (20, 51, 102) | 1 | ODS-FER/BER |
| 18 | (54, 54, 64, 64, 74, 74) | (20, 54, 108) | 1 | ODS-FER/BER |

TABLE 9

NEW ODS FEEDFORWARD LOW RATE TBCC WITH RATE 1/6 AND CONSTRAINT LENGTH V = 4

| K | G | WS | # permutation equivalent codes | Note |
|---|---|---|---|---|
| 4 | (2, 2, 6, 12, 16, 54) | (12, 10, 20) | 39884 | ODS-FER/BER |
| 5 | (2, 6, 12, 16, 26, 56) | (15, 16, 40) | 15337 | ODS-FER/BER |
| 6 | (2, 6, 16, 26, 32, 76) | (16, 6, 12) | 540 | ODS-FER/BER |
| 7 | (22, 26, 32, 46, 52, 76) | (19, 42, 154) | 24 | ODS-FER/BER |
| 8 | (26, 36, 46, 56, 62, 66) | (20, 18, 72) | 8 | ODS-FER |
|   | (16, 26, 32, 36, 56, 72) | (20, 20, 64) | 24 | ODS-BER |
| 9 | (26, 52, 56, 66, 72, 76) | (23, 90, 360) | 4 | ODS-FER/BER |
| 10 | (46, 52, 56, 66, 72, 76) | (23, 10, 10) | 2 | ODS-FER/BER |
| 11 | (46, 52, 56, 66, 72, 76) | (23, 11, 11) | 2 | ODS-FER/BER |
| 12 | (52, 56, 56, 66, 72, 76) | (24, 85, 288) | 2 | ODS-FER/BER |
| 13 | (52, 56, 56, 66, 72, 76) | (24, 52, 104) | 2 | ODS-FER/BER |
| 14 | (52, 56, 56, 66, 72, 76) | (24, 56, 112) | 2 | ODS-FER/BER |
| 15 | (52, 56, 56, 66, 72, 76) | (24, 60, 120) | 2 | ODS-FER/BER |
| 16 | (52, 56, 56, 66, 72, 76) | (24, 64, 128) | 2 | ODS-FER/BER |
| 17 | (52, 56, 56, 66, 72, 76) | (24, 68, 136) | 2 | ODS-FER/BER |
| 18 | (52, 56, 56, 66, 72, 76) | (24, 72, 144) | 2 | ODS-FER/BER |

TABLE 10

NEW ODS FEEDFORWARD LOW RATE TBCC WITH RATE 1/7 AND CONSTRAINT LENGTH V = 3

| K | G | WS | # permutation equivalent codes | Note |
|---|---|---|---|---|
| 4 | (4, 4, 14, 14, 24, 34, 54) | (14, 8, 16) | 1964 | ODS-FER/BER |
| 5 | (4, 4, 14, 24, 34, 54, 74) | (16, 5, 5) | 360 | ODS-FER/BER |
| 6 | (14, 24, 34, 44, 54, 64, 74) | (18, 1, 6) | 12 | ODS-FER |
|   | (4, 14, 34, 44, 54, 64, 74) | (18, 6, 6) | 24 | ODS-BER |
| 7 | (14, 24, 34, 54, 64, 74, 74) | (20, 7, 14) | 12 | ODS-FER/BER |
| 8 | (34, 44, 54, 54, 64, 64, 74) | (21, 8, 8) | 2 | ODS-FER |
|   | (34, 34, 44, 54, 54, 64, 74) | (21, 8, 8) | 6 | ODS-BER |
| 9 | (34, 44, 54, 54, 64, 74, 74) | (22, 18, 27) | 4 | ODS-FER/BER |
| 10 | (44, 54, 54, 64, 64, 64, 74) | (22, 10, 10) | 1 | ODS-FER/BER |
| 11 | (54, 54, 54, 64, 64, 74, 74) | (23, 33, 121) | 2 | ODS-FER/BER |
| 12 | (54, 54, 54, 64, 64, 74, 74) | (23, 24, 48) | 2 | ODS-FER/BER |
| 13 | (54, 54, 54, 64, 64, 74, 74) | (23, 26, 52) | 2 | ODS-FER/BER |
| 14 | (54, 54, 54, 64, 64, 74, 74) | (23, 28, 56) | 2 | ODS-FER/BER |
| 15 | (54, 54, 54, 64, 64, 74, 74) | (23, 30, 60) | 2 | ODS-FER/BER |
| 16 | (54, 54, 54, 64, 64, 74, 74) | (23, 32, 64) | 2 | ODS-FER/BER |
| 17 | (54, 54, 54, 64, 64, 74, 74) | (23, 34, 68) | 2 | ODS-FER/BER |
| 18 | (54, 54, 54, 64, 64, 74, 74) | (23, 36, 72) | 2 | ODS-FER/BER |

TABLE 11

NEW ODS FEEDFORWARD LOW RATE TBCC WITH RATE 1/7 AND CONSTRAINT LENGTH V = 4

| K | G | WS | # permutation equivalent codes | Note |
|---|---|---|---|---|
| 4 | (2, 2, 6, 6, 12, 16, 54) | (14, 8, 16) | 182642 | ODS-FER/BER |
| 5 | (2, 2, 6, 12, 16, 26, 56) | (16, 5, 5) | 46155 | ODS-FER/BER |
| 6 | (2, 6, 12, 26, 32, 56, 76) | (20, 33, 96) | 2160 | ODS-FER/BER |
| 7 | (2, 16, 26, 32, 46, 66, 76) | (22, 35, 105) | 120 | ODS-FER/BER |
| 8 | (16, 26, 36, 46, 52, 56, 76) | (24, 20, 64) | 24 | ODS-FER/BER |
| 9 | (36, 46, 52, 56, 66, 72, 76) | (26, 18, 72) | 4 | ODS-FER/BER |
| 10 | (46, 52, 56, 66, 72, 72, 76) | (27, 20, 60) | 2 | ODS-FER/BER |
| 11 | (46, 52, 56, 66, 72, 72, 76) | (27, 11, 11) | 2 | ODS-FER/BER |
| 12 | (46, 52, 56, 66, 72, 72, 76) | (27, 12, 12) | 2 | ODS-FER/BER |
| 13 | (52, 52, 56, 66, 66, 76, 76) | (28, 52, 104) | 2 | ODS-FER/BER |
| 14 | (52, 52, 56, 66, 66, 76, 76) | (28, 56, 112) | 2 | ODS-FER/BER |
| 15 | (52, 56, 56, 66, 72, 72, 76) | (28, 60, 120) | 1 | ODS-FER/BER |
| 16 | (52, 56, 56, 66, 72, 72, 76) | (28, 64, 128) | 1 | ODS-FER/BER |
| 17 | (52, 56, 56, 66, 72, 72, 76) | (28, 68, 136) | 1 | ODS-FER/BER |
| 18 | (52, 56, 56, 66, 72, 72, 76) | (28, 72, 144) | 1 | ODS-FER/BER |

TABLE 12

NEW ODS FEEDFORWARD LOW RATE TBCC WITH RATE 1/8 AND CONSTRAINT LENGTH V = 3

| K | G | WS | # permutation equivalent codes | Note |
|---|---|---|---|---|
| 4 | (4, 4, 14, 14, 24, 34, 34, 74) | (16, 7, 16) | 2000 | ODS-FER/BER |
| 5 | (4, 4, 14, 24, 34, 54, 74, 74) | (20, 26, 60) | 360 | ODS-FER/BER |
| 6 | (4, 14, 34, 44, 54, 64, 74, 74) | (22, 30, 78) | 24 | ODS-FER/BER |
| 7 | (14, 24, 34, 54, 54, 64, 74, 74) | (24, 28, 84) | 24 | ODS-FER/BER |
| 8 | (34, 44, 54, 54, 64, 64, 74, 74) | (24, 4, 16) | 2 | ODS-FER |
|   | (24, 34, 44, 54, 54, 64, 74, 74) | (24, 10, 16) | 8 | ODS-BER |
| 9 | (34, 44, 54, 54, 64, 64, 74, 74) | (25, 9, 9) | 2 | ODS-FER |
|   | (24, 34, 54, 54, 64, 64, 74, 74) | (25, 9, 9) | 4 | ODS-BER |
| 10 | (44, 54, 54, 64, 64, 74, 74, 74) | (26, 20, 30) | 1 | ODS-FER/BER |
| 11 | (54, 54, 54, 64, 64, 74, 74, 74) | (26, 11, 22) | 2 | ODS-FER/BER |
| 12 | (54, 54, 54, 64, 64, 74, 74, 74) | (26, 12, 24) | 2 | ODS-FER/BER |
| 13 | (54, 54, 54, 64, 64, 74, 74, 74) | (26, 13, 26) | 2 | ODS-FER/BER |
| 14 | (54, 54, 54, 64, 64, 74, 74, 74) | (26, 14, 28) | 2 | ODS-FER/BER |
| 15 | (54, 54, 54, 64, 64, 74, 74, 74) | (26, 15, 30) | 2 | ODS-FER/BER |

TABLE 13

NEW ODS FEEDFORWARD LOW RATE TBCC WITH RATE 1/8 AND CONSTRAINT LENGTH V = 4

| K | G | WS | # permutation equivalent codes | Note |
|---|---|---|---|---|
| 4 | (2, 2, 6, 6, 12, 16, 16, 74) | (16, 7, 16) | 369248 | ODS-FER/BER |
| 5 | (2, 2, 6, 12, 16, 26, 36, 56) | (20, 26, 60) | 139905 | ODS-FER/BER |
| 6 | (2, 6, 12, 26, 32, 36, 56, 76) | (24, 60, 180) | 2880 | ODS-FER/BER |
| 7 | (2, 16, 26, 32, 36, 46, 52, 76) | (25, 14, 28) | 240 | ODS-FER/BER |
| 8 | (16, 26, 32, 36, 52, 56, 72, 76) | (28, 20, 64) | 24 | ODS-FER/BER |
| 9 | (36, 46, 52, 56, 62, 66, 72, 76) | (30, 27, 81) | 2 | ODS-FER |
|   | (26, 36, 46, 52, 56, 66, 72, 76) | (30, 27, 72) | 8 | ODS-BER |
| 10 | (46, 52, 56, 56, 66, 72, 72, 76) | (30, 1, 10) | 2 | ODS-FER |
|    | (36, 46, 52, 52, 56, 66, 72, 76) | (30, 10, 10) | 4 | ODS-BER |
| 11 | (46, 52, 56, 56, 66, 72, 72, 76) | (31, 11, 11) | 2 | ODS-FER/BER |
| 12 | (52, 52, 56, 66, 66, 72, 76, 76) | (32, 87, 300) | 1 | ODS-FER/BER |
| 13 | (52, 52, 56, 66, 66, 72, 76, 76) | (32, 52, 104) | 1 | ODS-FER/BER |
| 14 | (52, 52, 56, 66, 66, 72, 76, 76) | (32, 56, 112) | 1 | ODS-FER/BER |
| 15 | (52, 52, 56, 66, 66, 72, 76, 76) | (32, 60, 120) | 1 | ODS-FER/BER |

TABLE 14

NEW ODS FEEDFORWARD LOW RATE TBCC WITH RATE 1/9 AND CONSTRAINT LENGTH V = 3

| K | G | WS | # permutation equivalent codes | Note |
|---|---|---|---|---|
| 4 | (4, 4, 4, 14, 14, 24, 34, 34, 74) | (18, 6, 12) | 4000 | ODS-FER/BER |
| 5 | (4, 4, 14, 24, 34, 34, 54, 54, 74) | (22, 15, 35) | 810 | ODS-FER/BER |
| 6 | (14, 24, 34, 34, 44, 54, 64, 74, 74) | (24, 6, 24) | 18 | ODS-FER |
|   | (4, 14, 24, 34, 44, 54, 64, 74, 74) | (24, 9, 18) | 48 | ODS-BER |
| 7 | (14, 24, 34, 54, 54, 64, 64, 74, 74) | (27, 14, 42) | 12 | ODS-FER |
|   | (24, 34, 44, 54, 54, 64, 64, 74, 74) | (27, 14, 28) | 4 | ODS-BER |
| 8 | (34, 34, 54, 54, 54, 64, 64, 74, 74) | (28, 14, 40) | 6 | ODS-FER |
|   | (34, 34, 44, 54, 54, 64, 64, 74, 74) | (28, 20, 40) | 3 | ODS-BER |
| 9 | (24, 44, 54, 54, 64, 64, 74, 74, 74) | (28, 9, 9) | 2 | ODS-FER/BER |
| 10 | (44, 54, 54, 54, 64, 64, 74, 74, 74) | (29, 10, 10) | 2 | ODS-FER/BER |
| 11 | (54, 54, 54, 64, 64, 64, 74, 74, 74) | (30, 44, 143) | 1 | ODS-FER/BER |
| 12 | (54, 54, 54, 64, 64, 64, 74, 74, 74) | (30, 36, 72) | 1 | ODS-FER/BER |
| 13 | (54, 54, 54, 64, 64, 64, 74, 74, 74) | (30, 39, 78) | 1 | ODS-FER/BER |
| 14 | (54, 54, 54, 64, 64, 64, 74, 74, 74) | (30, 42, 84) | 1 | ODS-FER/BER |
| 15 | (54, 54, 54, 64, 64, 64, 74, 74, 74) | (30, 45, 90) | 1 | ODS-FER/BER |

TABLE 15

NEW ODS FEEDFORWARD LOW RATE TBCC WITH RATE 1/9 AND CONSTRAINT LENGTH V = 4

| K | G | WS | # permutation equivalent codes | Note |
|---|---|---|---|---|
| 6 | (2, 6, 12, 16, 26, 32, 36, 56, 76) | (26, 12, 36) | 8640 | ODS-FER/BER |
| 7 | (2, 16, 26, 32, 36, 46, 52, 56, 76) | (28, 7, 28) | 480 | ODS-FER |
|   | (6, 16, 22, 26, 32, 36, 46, 66, 76) | (28, 7, 14) | 576 | ODS-BER |

TABLE 15-continued

NEW ODS FEEDFORWARD LOW RATE TBCC WITH RATE 1/9 AND CONSTRAINT LENGTH V = 4

| K | G | WS | # permutation equivalent codes | Note |
|---|---|---|---|---|
| 8 | (16, 26, 32, 36, 52, 56, 66, 72, 76) | (32, 16, 48) | 24 | ODS-FER/BER |
| 9 | (26, 36, 46, 52, 56, 56, 66, 72, 76) | (34, 45, 144) | 8 | ODS-FER/BER |
| 10 | (36, 46, 52, 52, 56, 66, 72, 72, 76) | (34, 10, 10) | 4 | ODS-FER/BER |

TABLE 16

NEW ODS FEEDFORWARD LOW RATE TBCC WITH RATE 1/9 AND CONSTRAINT LENGTH V = 5

| K | G | WS | # permutation equivalent codes | Note |
|---|---|---|---|---|
| 7 | (1, 34, 37, 43, 45, 46, 54, 57, 67) | (31, 63, 217) | 48769 | | using the optimum tail biting convolutional code to operate on data transmitted over a channel of a communications network.

20. The method of claim 19, wherein the communications unit is a wireless terminal which communicates over a radio interface with a base station, and wherein the data transmitted over the channel comprises payload for a secondary fast feedback channel (SFBCH).

21. The method of claim 19, wherein the circuit is a shift register circuit.

22. The method of claim 19, further comprising using the optimum tail biting convolutional code to perform error correction encoding of data transmitted over the channel of the communications network.

23. A communications unit which participates in data transmissions over a channel, the communications unit comprising:
a transceiver for sending and receiving data over the channel;
a circuit configured to implement a low rate optimum tail biting convolutional code for operating on the data transmitted over the channel, the optimum code being by a set of polynomials listed in any of Table 2-Table 16, polynomials being shown in octal notation in column G of Table 2-Table 16

TABLE 2

NEW ODS FEEDFORWARD LOW RATE TBCC WITH RATE 1/5 AND CONSTRAINT LENGTH V = 3

| K | G | WS | # permutation equivalent codes | Note |
|---|---|---|---|---|
| 4 | (4, 4, 14, 34, 54) | (10, 12, 24) | 376 | ODS-FER/BER |
| 5 | (4, 4, 34, 54, 74) | (12, 25, 55) | 40 | ODS-FER/BER |
| 6 | (4, 34, 54, 64, 74) | (12, 2, 6) | 8 | ODS-FER |
| | (4, 14, 34, 54, 64) | (12, 6, 6) | 24 | ODS-BER |
| 7 | (14, 34, 54, 64, 74) | (14, 7, 14) | 6 | ODS-FER/BER |
| 8 | (34, 54, 54, 64, 74) | (16, 82, 320) | 4 | ODS-FER/BER |
| 9 | (44, 54, 64, 74, 74) | (16, 36, 108) | 1 | ODS-FER/BER |

TABLE 2-continued

NEW ODS FEEDFORWARD LOW RATE TBCC WITH RATE 1/5 AND CONSTRAINT LENGTH V = 3

| K | G | WS | # permutation equivalent codes | Note |
|---|---|---|---|---|
| 10 | (44, 54, 64, 74, 74) | (16, 20, 30) | 1 | ODS-FER/BER |
| 11 | (54, 54, 64, 74, 74) | (16, 11, 22) | 2 | ODS-FER/BER |
| 12 | (54, 54, 64, 74, 74) | (16, 12, 24) | 2 | ODS-FER/BER |
| 13 | (54, 54, 64, 74, 74) | (16, 13, 26) | 2 | ODS-FER/BER |
| 14 | (54, 54, 64, 74, 74) | (16, 14, 28) | 2 | ODS-FER/BER |
| 15 | (54, 54, 64, 74, 74) | (16, 15, 30) | 2 | ODS-FER/BER |
| 16 | (54, 54, 64, 74, 74) | (16, 16, 32) | 2 | ODS-FER/BER |
| 17 | (54, 54, 64, 74, 74) | (16, 17, 34) | 2 | ODS-FER/BER |
| 18 | (54, 54, 64, 74, 74) | (16, 18, 36) | 2 | ODS-FER/BER |
| 19 | (54, 54, 64, 74, 74) | (16, 19, 38) | 2 | ODS-FER/BER |
| 20 | (54, 54, 64, 74, 74) | (16, 20, 40) | 2 | ODS-FER/BER |
| 21 | (54, 54, 64, 74, 74) | (16, 21, 42) | 2 | ODS-FER/BER |
| 22 | (54, 54, 64, 74, 74) | (16, 22, 44) | 2 | ODS-FER/BER |
| 23 | (54, 54, 64, 74, 74) | (16, 23, 46) | 2 | ODS-FER/BER |
| 24 | (54, 54, 64, 74, 74) | (16, 24, 48) | 2 | ODS-FER/BER |

TABLE 3

NEW ODS FEEDFORWARD LOW RATE TBCC WITH RATE 1/5 AND CONSTRAINT LENGTH V = 4

| K | G | WS | # permutation equivalent codes | Note |
|---|---|---|---|---|
| 4 | (2, 2, 6, 16, 54) | (10, 12, 24) | 9580 | ODS-FER/BER |
| 5 | (2, 2, 16, 26, 56) | (12, 25, 55) | 1795 | ODS-FER/BER |
| 6 | (2, 16, 26, 32, 76) | (14, 15, 42) | 135 | ODS-FER/BER |
| 7 | (22, 26, 46, 52, 76) | (16, 84, 315) | 24 | ODS-FER/BER |
| 8 | (6, 26, 56, 62, 76) | (16, 8, 16) | 16 | ODS-FER/BER |
| 9 | (52, 56, 66, 72, 76) | (18, 58, 261) | 1 | ODS-FER |
| | (46, 56, 62, 66, 72) | (18, 58, 216) | 1 | ODS-BER |
| 10 | (36, 46, 52, 66, 72) | (18, 10, 10) | 4 | ODS-FER/BER |
| 11 | (46, 52, 56, 72, 76) | (19, 11, 11) | 2 | ODS-FER/BER |
| 12 | (52, 56, 66, 72, 76) | (20, 72, 216) | 1 | ODS-FER/BER |
| 13 | (52, 56, 66, 72, 76) | (20, 52, 104) | 1 | ODS-FER/BER |
| 14 | (52, 56, 66, 72, 76) | (20, 56, 112) | 1 | ODS-FER/BER |
| 15 | (52, 56, 66, 72, 76) | (20, 60, 120) | 1 | ODS-FER/BER |
| 16 | (52, 56, 66, 72, 76) | (20, 64, 128) | 1 | ODS-FER/BER |
| 17 | (52, 56, 66, 72, 76) | (20, 68, 136) | 1 | ODS-FER/BER |
| 18 | (52, 56, 66, 72, 76) | (20, 72, 144) | 1 | ODS-FER/BER |
| 19 | (52, 56, 66, 72, 76) | (20, 76, 152) | 1 | ODS-FER/BER |
| 20 | (52, 56, 66, 72, 76) | (20, 80, 160) | 1 | ODS-FER/BER |
| 21 | (52, 56, 66, 72, 76) | (20, 84, 168) | 1 | ODS-FER/BER |
| 22 | (52, 56, 66, 72, 76) | (20, 88, 176) | 1 | ODS-FER/BER |
| 23 | (52, 56, 66, 72, 76) | (20, 92, 184) | 1 | ODS-FER/BER |
| 24 | (52, 56, 66, 72, 76) | (20, 96, 192) | 1 | ODS-FER/BER |

TABLE 4

NEW ODS FEEDFORWARD LOW RATE TBCC WITH RATE 1/5 AND CONSTRAINT LENGTH V = 5

| K | G | WS | # permutation equivalent codes | Note |
|---|---|---|---|---|
| 5 | (1, 1, 7, 13, 56) | (12, 25, 55) | 51290 | ODS-FER/BER |
| 6 | (1, 7, 13, 15, 57) | (14, 15, 42) | 7506 | ODS-FER/BER |
| 7 | (1, 3, 25, 37, 67) | (16, 84, 266) | 1440 | ODS-FER/BER |
| 8 | (11, 23, 47, 73, 77) | (16, 5, 16) | 48 | ODS-FER/BER |
| 9 | (17, 45, 47, 67, 75) | (18, 27, 126) | 6 | ODS-FER |
| | (5, 13, 53, 57, 67) | (18, 27, 126) | 24 | ODS-BER |
| 10 | (25, 33, 45, 67, 75) | (20, 127, 630) | 8 | ODS-FER |
| | (11, 27, 35, 67, 73) | (20, 141, 620) | 12 | ODS-BER |
| 11 | (27, 51, 53, 67, 73) | (21, 88, 374) | 4 | ODS-FER/BER |

TABLE 4-continued

NEW ODS FEEDFORWARD LOW RATE TBCC WITH RATE 1/5 AND CONSTRAINT LENGTH V = 5

| K | G | WS | # permutation equivalent codes | Note |
|---|---|---|---|---|
| 12 | (37, 47, 55, 57, 65) | (22, 108, 504) | 4 | ODS-FER/BER |
| 13 | (47, 55, 57, 73, 75) | (22, 13, 26) | 2 | ODS-FER/BER |
| 14 | (47, 57, 65, 73, 75) | (22, 14, 28) | 2 | ODS-FER/BER |
| 15 | (47, 55, 57, 67, 75) | (22, 15, 30) | 2 | ODS-FER/BER |
| 16 | (47, 55, 57, 67, 75) | (22, 16, 32) | 2 | ODS-FER/BER |
| 17 | (47, 55, 57, 67, 75) | (22, 17, 34) | 2 | ODS-FER/BER |
| 18 | (47, 55, 57, 67, 75) | (22, 18, 36) | 2 | ODS-FER/BER |

TABLE 5

NEW ODS FEEDFORWARD LOW RATE TBCC WITH RATE 1/5 AND CONSTRAINT LENGTH V = 6

| K | G | WS | # permutation equivalent codes | Note |
|---|---|---|---|---|
| 12 | (54, 254, 434, 724, 774) | (22, 24, 48) | 15 | ODS-FER/BER |

TABLE 6

NEW ODS FEEDFORWARD LOW RATE TBCC WITH RATE 1/5 AND CONSTRAINT LENGTH V = 7

| K | G | WS | # permutation equivalent codes | Note |
|---|---|---|---|---|
| 12 | (16, 112, 556, 636, 656) | (24, 659, 4044) | 4 | ODS-FER |

TABLE 7

NEW ODS FEEDFORWARD LOW RATE TBCC WITH RATE 1/6 AND CONSTRAINT LENGTH V = 5

| K | G | WS | # permutation equivalent codes | Note |
|---|---|---|---|---|
| 7 | (1, 3, 13, 25, 37, 67) | (19, 35, 105) | 11520 | ODS-FER/BER |
| 8 | (1, 23, 35, 45, 57, 77) | (22, 144, 528) | 144 | ODS-FER/BER |
| 9 | (5, 23, 27, 37, 53, 57) | (23, 81, 351) | 64 | ODS-FER |
|   | (13, 27, 33, 43, 57, 63) | (23, 81, 333) | 48 | ODS-BER |
| 10 | (27, 47, 55, 57, 61, 73) | (24, 20, 80) | 4 | ODS-FER/BER |
| 11 | (43, 55, 57, 67, 71, 75) | (26, 99, 462) | 2 | ODS-FER/BER |

TABLE 8

NEW ODS FEEDFORWARD LOW RATE TBCC WITH RATE 1/6 AND CONSTRAINT LENGTH V = 3

| K | G | WS | # permutation equivalent codes | Note |
|---|---|---|---|---|
| 4 | (4, 4, 14, 24, 34, 54) | (12, 10, 20) | 776 | ODS-FER/BER |
| 5 | (4, 14, 24, 34, 54, 74) | (15, 16, 40) | 144 | ODS-FER/BER |
| 6 | (14, 34, 44, 54, 64, 74) | (16, 9, 36) | 6 | ODS-FER/BER |
| 7 | (14, 24, 34, 54, 64, 74) | (17, 7, 7) | 12 | ODS-FER/BER |
| 8 | (34, 44, 54, 54, 64, 74) | (18, 8, 8) | 4 | ODS-FER/BER |
| 9 | (44, 54, 54, 64, 74, 74) | (19, 18, 54) | 2 | ODS-FER/BER |
| 10 | (44, 54, 54, 64, 74, 74) | (19, 10, 10) | 2 | ODS-FER/BER |
| 11 | (54, 54, 64, 64, 74, 74) | (20, 44, 143) | 1 | ODS-FER/BER |
| 12 | (54, 54, 64, 64, 74, 74) | (20, 36, 72) | 1 | ODS-FER/BER |
| 13 | (54, 54, 64, 64, 74, 74) | (20, 39, 78) | 1 | ODS-FER/BER |
| 14 | (54, 54, 64, 64, 74, 74) | (20, 42, 84) | 1 | ODS-FER/BER |
| 15 | (54, 54, 64, 64, 74, 74) | (20, 45, 90) | 1 | ODS-FER/BER |
| 16 | (54, 54, 64, 64, 74, 74) | (20, 48, 96) | 1 | ODS-FER/BER |
| 17 | (54, 54, 64, 64, 74, 74) | (20, 51, 102) | 1 | ODS-FER/BER |
| 18 | (54, 54, 64, 64, 74, 74) | (20, 54, 108) | 1 | ODS-FER/BER |

TABLE 9

NEW ODS FEEDFORWARD LOW RATE TBCC WITH RATE 1/6 AND CONSTRAINT LENGTH V = 4

| K | G | WS | # permutation equivalent codes | Note |
|---|---|---|---|---|
| 4 | (2, 2, 6, 12, 16, 54) | (12, 10, 20) | 39884 | ODS-FER/BER |
| 5 | (2, 6, 12, 16, 26, 56) | (15, 16, 40) | 15337 | ODS-FER/BER |
| 6 | (2, 6, 16, 26, 32, 76) | (16, 6, 12) | 540 | ODS-FER/BER |
| 7 | (22, 26, 32, 46, 52, 76) | (19, 42, 154) | 24 | ODS-FER/BER |
| 8 | (26, 36, 46, 56, 62, 66) | (20, 18, 72) | 8 | ODS-FER |
|   | (16, 26, 32, 36, 56, 72) | (20, 20, 64) | 24 | ODS-BER |
| 9 | (26, 52, 56, 66, 72, 76) | (23, 90, 360) | 4 | ODS-FER/BER |
| 10 | (46, 52, 56, 66, 72, 76) | (23, 10, 10) | 2 | ODS-FER/BER |
| 11 | (46, 52, 56, 66, 72, 76) | (23, 11, 11) | 2 | ODS-FER/BER |
| 12 | (52, 56, 56, 66, 72, 76) | (24, 85, 288) | 2 | ODS-FER/BER |
| 13 | (52, 56, 56, 66, 72, 76) | (24, 52, 104) | 2 | ODS-FER/BER |
| 14 | (52, 56, 56, 66, 72, 76) | (24, 56, 112) | 2 | ODS-FER/BER |
| 15 | (52, 56, 56, 66, 72, 76) | (24, 60, 120) | 2 | ODS-FER/BER |
| 16 | (52, 56, 56, 66, 72, 76) | (24, 64, 128) | 2 | ODS-FER/BER |
| 17 | (52, 56, 56, 66, 72, 76) | (24, 68, 136) | 2 | ODS-FER/BER |
| 18 | (52, 56, 56, 66, 72, 76) | (24, 72, 144) | 2 | ODS-FER/BER |

TABLE 10

NEW ODS FEEDFORWARD LOW RATE TBCC WITH RATE 1/7 AND CONSTRAINT LENGTH V = 3

| K | G | WS | # permutation equivalent codes | Note |
|---|---|---|---|---|
| 4 | (4, 4, 14, 14, 24, 34, 54) | (14, 8, 16) | 1964 | ODS-FER/BER |
| 5 | (4, 4, 14, 24, 34, 54, 74) | (16, 5, 5) | 360 | ODS-FER/BER |
| 6 | (14, 24, 34, 44, 54, 64, 74) | (18, 1, 6) | 12 | ODS-FER |
|   | (4, 14, 34, 44, 54, 64, 74) | (18, 6, 6) | 24 | ODS-BER |
| 7 | (14, 24, 34, 54, 64, 74) | (20, 7, 14) | 12 | ODS-FER/BER |
| 8 | (34, 44, 54, 54, 64, 64, 74) | (21, 8, 8) | 2 | ODS-FER |
|   | (34, 34, 44, 54, 54, 64, 74) | (21, 8, 8) | 6 | ODS-BER |
| 9 | (34, 44, 54, 54, 64, 74) | (22, 18, 27) | 4 | ODS-FER/BER |
| 10 | (44, 54, 54, 64, 64, 74) | (22, 10, 10) | 1 | ODS-FER/BER |
| 11 | (54, 54, 54, 64, 64, 74) | (23, 33, 121) | 2 | ODS-FER/BER |
| 12 | (54, 54, 54, 64, 64, 74) | (23, 24, 48) | 2 | ODS-FER/BER |

TABLE 10-continued

NEW ODS FEEDFORWARD LOW RATE TBCC WITH RATE 1/7 AND CONSTRAINT LENGTH V = 3

| K | G | WS | # permutation equivalent codes | Note |
|---|---|----|-------------------------------|------|
| 13 | (54, 54, 54, 64, 64, 74, 74) | (23, 26, 52) | 2 | ODS-FER/BER |
| 14 | (54, 54, 54, 64, 64, 74, 74) | (23, 28, 56) | 2 | ODS-FER/BER |
| 15 | (54, 54, 54, 64, 64, 74, 74) | (23, 30, 60) | 2 | ODS-FER/BER |
| 16 | (54, 54, 54, 64, 64, 74, 74) | (23, 32, 64) | 2 | ODS-FER/BER |
| 17 | (54, 54, 54, 64, 64, 74, 74) | (23, 34, 68) | 2 | ODS-FER/BER |
| 18 | (54, 54, 54, 64, 64, 74, 74) | (23, 36, 72) | 2 | ODS-FER/BER |

TABLE 11

NEW ODS FEEDFORWARD LOW RATE TBCC WITH RATE 1/7 AND CONSTRAINT LENGTH V = 4

| K | G | WS | # permutation equivalent codes | Note |
|---|---|----|-------------------------------|------|
| 4 | (2, 2, 6, 6, 12, 16, 54) | (14, 8, 16) | 182642 | ODS-FER/BER |
| 5 | (2, 2, 6, 12, 16, 26, 56) | (16, 5, 5) | 46155 | ODS-FER/BER |
| 6 | (2, 6, 12, 26, 32, 56, 76) | (20, 33, 96) | 2160 | ODS-FER/BER |
| 7 | (2, 16, 26, 32, 46, 66, 76) | (22, 35, 105) | 120 | ODS-FER/BER |
| 8 | (16, 26, 36, 46, 52, 56, 76) | (24, 20, 64) | 24 | ODS-FER/BER |
| 9 | (36, 46, 52, 56, 66, 72, 76) | (26, 18, 72) | 4 | ODS-FER/BER |
| 10 | (46, 52, 56, 66, 72, 72, 76) | (27, 20, 60) | 2 | ODS-FER/BER |
| 11 | (46, 52, 56, 66, 72, 72, 76) | (27, 11, 11) | 2 | ODS-FER/BER |
| 12 | (46, 52, 56, 66, 72, 72, 76) | (27, 12, 12) | 2 | ODS-FER/BER |
| 13 | (52, 52, 56, 66, 66, 76, 76) | (28, 52, 104) | 2 | ODS-FER/BER |
| 14 | (52, 52, 56, 66, 66, 76, 76) | (28, 56, 112) | 2 | ODS-FER/BER |
| 15 | (52, 56, 56, 66, 72, 72, 76) | (28, 60, 120) | 1 | ODS-FER/BER |
| 16 | (52, 56, 56, 66, 72, 72, 76) | (28, 64, 128) | 1 | ODS-FER/BER |
| 17 | (52, 56, 56, 66, 72, 72, 76) | (28, 68, 136) | 1 | ODS-FER/BER |
| 18 | (52, 56, 56, 66, 72, 72, 76) | (28, 72, 144) | 1 | ODS-FER/BER |

TABLE 12

NEW ODS FEEDFORWARD LOW RATE TBCC WITH RATE 1/8 AND CONSTRAINT LENGTH V = 3

| K | G | WS | # permutation equivalent codes | Note |
|---|---|----|-------------------------------|------|
| 4 | (4, 4, 14, 14, 24, 34, 34, 74) | (16, 7, 16) | 2000 | ODS-FER/BER |
| 5 | (4, 4, 14, 24, 34, 54, 74, 74) | (20, 26, 60) | 360 | ODS-FER/BER |
| 6 | (4, 14, 34, 44, 54, 64, 74, 74) | (22, 30, 78) | 24 | ODS-FER/BER |
| 7 | (14, 24, 34, 54, 54, 64, 74, 74) | (24, 28, 84) | 24 | ODS-FER/BER |
| 8 | (34, 44, 54, 54, 64, 64, 74, 74) | (24, 4, 16) | 2 | ODS-FER |
|   | (24, 34, 44, 54, 54, 64, 74, 74) | (24, 10, 16) | 8 | ODS-BER |
| 9 | (34, 44, 54, 54, 64, 64, 74, 74) | (25, 9, 9) | 2 | ODS-FER |
|   | (24, 34, 54, 54, 64, 64, 74, 74) | (25, 9, 9) | 4 | ODS-BER |
| 10 | (44, 54, 54, 64, 64, 74, 74, 74) | (26, 20, 30) | 1 | ODS-FER/BER |
| 11 | (54, 54, 54, 64, 64, 74, 74, 74) | (26, 11, 22) | 2 | ODS-FER/BER |
| 12 | (54, 54, 54, 64, 64, 74, 74, 74) | (26, 12, 24) | 2 | ODS-FER/BER |
| 13 | (54, 54, 54, 64, 64, 74, 74, 74) | (26, 13, 26) | 2 | ODS-FER/BER |
| 14 | (54, 54, 54, 64, 64, 74, 74, 74) | (26, 14, 28) | 2 | ODS-FER/BER |
| 15 | (54, 54, 54, 64, 64, 74, 74, 74) | (26, 15, 30) | 2 | ODS-FER/BER |

TABLE 13

NEW ODS FEEDFORWARD LOW RATE TBCC WITH RATE 1/8 AND CONSTRAINT LENGTH V = 4

| K | G | WS | # permutation equivalent codes | Note |
|---|---|----|-------------------------------|------|
| 4 | (2, 2, 6, 6, 12, 16, 16, 74) | (16, 7, 16) | 369248 | ODS-FER/BER |
| 5 | (2, 2, 6, 12, 16, 26, 36, 56) | (20, 26, 60) | 139905 | ODS-FER/BER |
| 6 | (2, 6, 12, 26, 32, 36, 56, 76) | (24, 60, 180) | 2880 | ODS-FER/BER |
| 7 | (2, 16, 26, 32, 36, 46, 52, 76) | (25, 14, 28) | 240 | ODS-FER/BER |
| 8 | (16, 26, 32, 36, 52, 56, 72, 76) | (28, 20, 64) | 24 | ODS-FER/BER |
| 9 | (36, 46, 52, 56, 62, 66, 72, 76) | (30, 27, 81) | 2 | ODS-FER |
|   | (26, 36, 46, 52, 56, 66, 72, 76) | (30, 27, 72) | 8 | ODS-BER |
| 10 | (46, 52, 56, 56, 66, 72, 72, 76) | (30, 1, 10) | 2 | ODS-FER |
|    | (36, 46, 52, 52, 66, 72, 72, 76) | (30, 10, 10) | 4 | ODS-BER |
| 11 | (46, 52, 56, 56, 66, 72, 72, 76) | (31, 11, 11) | 2 | ODS-FER/BER |
| 12 | (52, 52, 56, 66, 66, 72, 76, 76) | (32, 87, 300) | 1 | ODS-FER/BER |
| 13 | (52, 52, 56, 66, 66, 72, 76, 76) | (32, 52, 104) | 1 | ODS-FER/BER |
| 14 | (52, 52, 56, 66, 66, 72, 76, 76) | (32, 56, 112) | 1 | ODS-FER/BER |
| 15 | (52, 52, 56, 66, 66, 72, 76, 76) | (32, 60, 120) | 1 | ODS-FER/BER |

TABLE 14

NEW ODS FEEDFORWARD LOW RATE TBCC WITH RATE 1/9 AND CONSTRAINT LENGTH V = 3

| K | G | WS | # permutation equivalent codes | Note |
|---|---|----|-------------------------------|------|
| 4 | (4, 4, 4, 14, 14, 24, 34, 34, 74) | (18, 6, 12) | 4000 | ODS-FER/BER |

TABLE 14-continued

NEW ODS FEEDFORWARD LOW RATE TBCC WITH RATE 1/9 AND CONSTRAINT LENGTH V = 3

| K | G | WS | # permutation equivalent codes | Note |
|---|---|---|---|---|
| 5 | (4, 4, 14, 24, 34, 34, 54, 54, 74) | (22, 15, 35) | 810 | ODS-FER/BER |
| 6 | (14, 24, 34, 34, 44, 54, 64, 74, 74) | (24, 6, 24) | 18 | ODS-FER |
|   | (4, 14, 24, 34, 44, 54, 64, 74, 74) | (24, 9, 18) | 48 | ODS-BER |
| 7 | (14, 24, 34, 54, 54, 64, 64, 74, 74) | (27, 14, 42) | 12 | ODS-FER |
|   | (24, 34, 44, 54, 54, 64, 64, 74, 74) | (27, 14, 28) | 4 | ODS-BER |
| 8 | (34, 34, 54, 54, 54, 64, 64, 74, 74) | (28, 14, 40) | 6 | ODS-FER |
|   | (34, 34, 44, 54, 54, 64, 64, 74, 74) | (28, 20, 40) | 3 | ODS-BER |
| 9 | (24, 44, 54, 54, 64, 64, 74, 74, 74) | (28, 9, 9) | 2 | ODS-FER/BER |
| 10 | (44, 54, 54, 54, 64, 64, 74, 74, 74) | (29, 10, 10) | 2 | ODS-FER/BER |
| 11 | (54, 54, 54, 64, 64, 64, 74, 74, 74) | (30, 44, 143) | 1 | ODS-FER/BER |
| 12 | (54, 54, 54, 64, 64, 64, 74, 74, 74) | (30, 36, 72) | 1 | ODS-FER/BER |
| 13 | (54, 54, 54, 64, 64, 64, 74, 74, 74) | (30, 39, 78) | 1 | ODS-FER/BER |
| 14 | (54, 54, 54, 64, 64, 64, 74, 74, 74) | (30, 42, 84) | 1 | ODS-FER/BER |
| 15 | (54, 54, 54, 64, 64, 64, 74, 74, 74) | (30, 45, 90) | 1 | ODS-FER/BER |

TABLE 15

NEW ODS FEEDFORWARD LOW RATE TBCC WITH RATE 1/9 AND CONSTRAINT LENGTH V = 4

| K | G | WS | # permutation equivalent codes | Note |
|---|---|---|---|---|
| 6 | (2, 6, 12, 16, 26, 32, 36, 56, 76) | (26, 12, 36) | 8640 | ODS-FER/BER |
| 7 | (2, 16, 26, 32, 36, 46, 52, 56, 76) | (28, 7, 28) | 480 | ODS-FER |
|   | (6, 16, 22, 26, 32, 36, 46, 66, 76) | (28, 7, 14) | 576 | ODS-BER |
| 8 | (16, 26, 32, 36, 52, 56, 66, 72, 76) | (32, 16, 48) | 24 | ODS-FER/BER |
| 9 | (26, 36, 46, 52, 56, 56, 66, 72, 76) | (34, 45, 144) | 8 | ODS-FER/BER |
| 10 | (36, 46, 52, 52, 56, 66, 72, 72, 76) | (34, 10, 10) | 4 | ODS-FER/BER |

TABLE 16

NEW ODS FEEDFORWARD LOW RATE TBCC WITH RATE 1/9 AND CONSTRAINT LENGTH V = 5

| K | G | WS | # permutation equivalent codes | Note |
|---|---|---|---|---|
| 7 | (1, 34, 37, 43, 45, 46, 54, 57, 67) | (31, 63, 217) | 48769 | |

24. The apparatus of claim 23, wherein the circuit is a shift register circuit.

25. The apparatus of claim 24, further comprising:
plural shift register circuits, each of the shift register circuits being configured to implement a respective different one of plural optimum tail biting convolutional codes, each of the plural optimum tail biting convolutional codes being of a different rate and being expressed by a set of polynomials listed in any of Table 2-Table 16, polynomials being shown in octal notation in column G of Table 2-Table 16;
a code activator configured to include one of the plural shift register circuits in a processing stream for a respective data transmission over the channel.

26. The apparatus of claim 24, wherein the shift register circuit comprises an encoder configured to append error correction information to data transmitted over the channel.

27. The apparatus of claim 23, wherein the communication unit is a wireless terminal which communicates with a base station over an air interface, and wherein the data transmitted over the channel comprises payload for a secondary fast feedback channel (SFBCH).

* * * * *

UNITED STATES PATENT AND TRADEMARK OFFICE
CERTIFICATE OF CORRECTION

PATENT NO. : 8,397,147 B2  
APPLICATION NO. : 12/621604  
DATED : March 12, 2013  
INVENTOR(S) : Chen et al.

Page 1 of 1

It is certified that error appears in the above-identified patent and that said Letters Patent is hereby corrected as shown below:

In the Specifications:

In Column 2, Line 42, delete "IEEE" and insert -- IEE --, therefor.

In Column 13, Line 28, delete "G1" and insert -- Gi --, therefor.

In Column 13, Line 32, delete "G1," and insert -- Gi, --, therefor.

In Column 13, Line 34, delete "G1," and insert -- Gi, --, therefor.

In Column 13, Line 36, delete "G1" and insert -- Gi --, therefor.

In Column 13, Line 60, delete "$(d_f,n_{df})_{best}(13, 242)$" and insert -- $(d_f,n_{df})_{best}=(13, 242)$ --, therefor.

In Column 14, Line 25, delete "$\{G_{C(1)},{}^G{}_{C(2)}\}$." and insert -- $\{G_{C(1)}, G_{C(2)}\}$. --, therefor.

In Column 22, Line 37, delete "$(7{\times}L{\leqq}24)$" and insert -- $(7{\leqq}L{\leqq}24)$ --, therefor.

In Column 22, Line 62, delete "$(a_o, a_{ii})$" and insert -- $(\bar{a}_0,..., \bar{a}_{11})$ --, therefor.

In Column 23, Line 13, delete "(60 μL)" and insert -- (60,L) --, therefor.

In Column 24, Line 51, delete "IEEE" and insert -- IEE --, therefor.

Signed and Sealed this  
Eighteenth Day of June, 2013

Teresa Stanek Rea  
*Acting Director of the United States Patent and Trademark Office*